US007772746B2

(12) United States Patent
Keolian et al.

(10) Patent No.: US 7,772,746 B2
(45) Date of Patent: Aug. 10, 2010

(54) THERMACOUSTIC PIEZOELECTRIC GENERATOR

(75) Inventors: Robert M. Keolian, State College, PA (US); John W. Wuthrich, Albany, NY (US); Kevin J. Bastyr, Someville, MA (US)

(73) Assignee: The Penn State Research Foundation, University Park, PA (US)

( * ) Notice: Subject to any disclaimer, the term of this patent is extended or adjusted under 35 U.S.C. 154(b) by 811 days.

(21) Appl. No.: 11/492,311

(22) Filed: Jul. 25, 2006

(65) Prior Publication Data

US 2007/0090723 A1  Apr. 26, 2007

Related U.S. Application Data

(63) Continuation-in-part of application No. 10/810,907, filed on Mar. 26, 2004, now Pat. No. 7,081,699.

(51) Int. Cl.
*H02N 2/00* (2006.01)
(52) U.S. Cl. ................. 310/339; 310/324; 367/163; 367/164
(58) Field of Classification Search ............ 310/306, 310/324, 339; 367/163, 174
See application file for complete search history.

(56) References Cited

U.S. PATENT DOCUMENTS

| 3,822,388 A | 7/1974 | Martini et al. |
|---|---|---|
| 4,005,319 A | 1/1977 | Nilsson et al. |
| 4,114,380 A | 9/1978 | Ceperley |
| 4,355,517 A | 10/1982 | Ceperley |
| 4,398,398 A | 8/1983 | Wheatley et al. |
| 4,467,236 A | 8/1984 | Kolm et al. |
| 4,489,553 A | 12/1984 | Wheatley et al. |
| 4,504,761 A | 3/1985 | Triplett |
| 4,511,818 A | 4/1985 | Benjamin et al. |
| 4,623,808 A | 11/1986 | Beale et al. |
| 4,722,201 A | 2/1988 | Hofler et al. |
| 4,927,599 A * | 5/1990 | Allen ................ 376/321 |
| 5,146,750 A | 9/1992 | Moscrip |
| 5,237,543 A | 8/1993 | Erickson et al. |
| 5,329,768 A | 7/1994 | Moscrip |
| 5,389,844 A | 2/1995 | Yarr et al. |
| 5,431,694 A | 7/1995 | Snaper et al. |
| 5,469,406 A | 11/1995 | Scarpitta et al. |

(Continued)

FOREIGN PATENT DOCUMENTS

WO    WO-9920957    4/1999

(Continued)

OTHER PUBLICATIONS

WC. Ward et al., "Thermoacoustic Engine Scaling, Acoustic and Safety Study," Los Alamos National Laboratory unclassified report LA-12103-MS,1991. cited by other.

*Primary Examiner*—Walter Benson
*Assistant Examiner*—Bryan P Gordon
(74) *Attorney, Agent, or Firm*—Gifford, Krass, Sprinkle, Anderson & Citkowski, P.C.; Douglas L. Wathen

(57) ABSTRACT

An electroactive transducer converts between acoustical power and electrical power. The transducer includes a diaphragm and a perimeter member. The perimeter member includes at least one electroactive element and is mechanically coupled to the perimeter of the diaphragm such that displacement of the diaphragm stresses the electroactive element.

38 Claims, 26 Drawing Sheets

U.S. PATENT DOCUMENTS

| | | |
|---|---|---|
| 5,814,921 A | 9/1998 | Carroll |
| 5,861,702 A * | 1/1999 | Bishop et al. ............... 310/330 |
| 5,948,996 A * | 9/1999 | Takeuchi et al. ....... 73/862.043 |
| 5,996,345 A | 12/1999 | Hofler |
| 6,002,449 A * | 12/1999 | Tsyrganovich .............. 348/725 |
| 6,032,464 A | 3/2000 | Swift et al. |
| 6,194,815 B1 | 2/2001 | Carroll |
| 6,307,287 B1 * | 10/2001 | Garrett et al. ................. 310/30 |
| 6,314,740 B1 | 11/2001 | De Blok et al. |
| 6,376,968 B1 * | 4/2002 | Taylor et al. ................ 310/339 |
| 6,429,576 B1 | 8/2002 | Simes |
| 6,472,794 B1 * | 10/2002 | Shibaike et al. ............. 310/309 |
| 6,574,968 B1 | 6/2003 | Symko et al. |
| 6,578,364 B2 | 6/2003 | Corey |
| 6,604,363 B2 | 8/2003 | Corey et al. |
| 2002/0033651 A1 * | 3/2002 | Iarochenko et al. ......... 310/328 |
| 2002/0076076 A1 * | 6/2002 | Kay et al. .................... 381/355 |
| 2002/0166325 A1 | 11/2002 | Corey |
| 2003/0192324 A1 | 10/2003 | Smith et al. |
| 2004/0000150 A1 | 1/2004 | Symko et al. |
| 2005/0093398 A1 | 5/2005 | Kim et al. |
| 2006/0119224 A1 | 6/2006 | Keolian et al. |

FOREIGN PATENT DOCUMENTS

| | | |
|---|---|---|
| WO | WO-0286445 | 10/2002 |

* cited by examiner

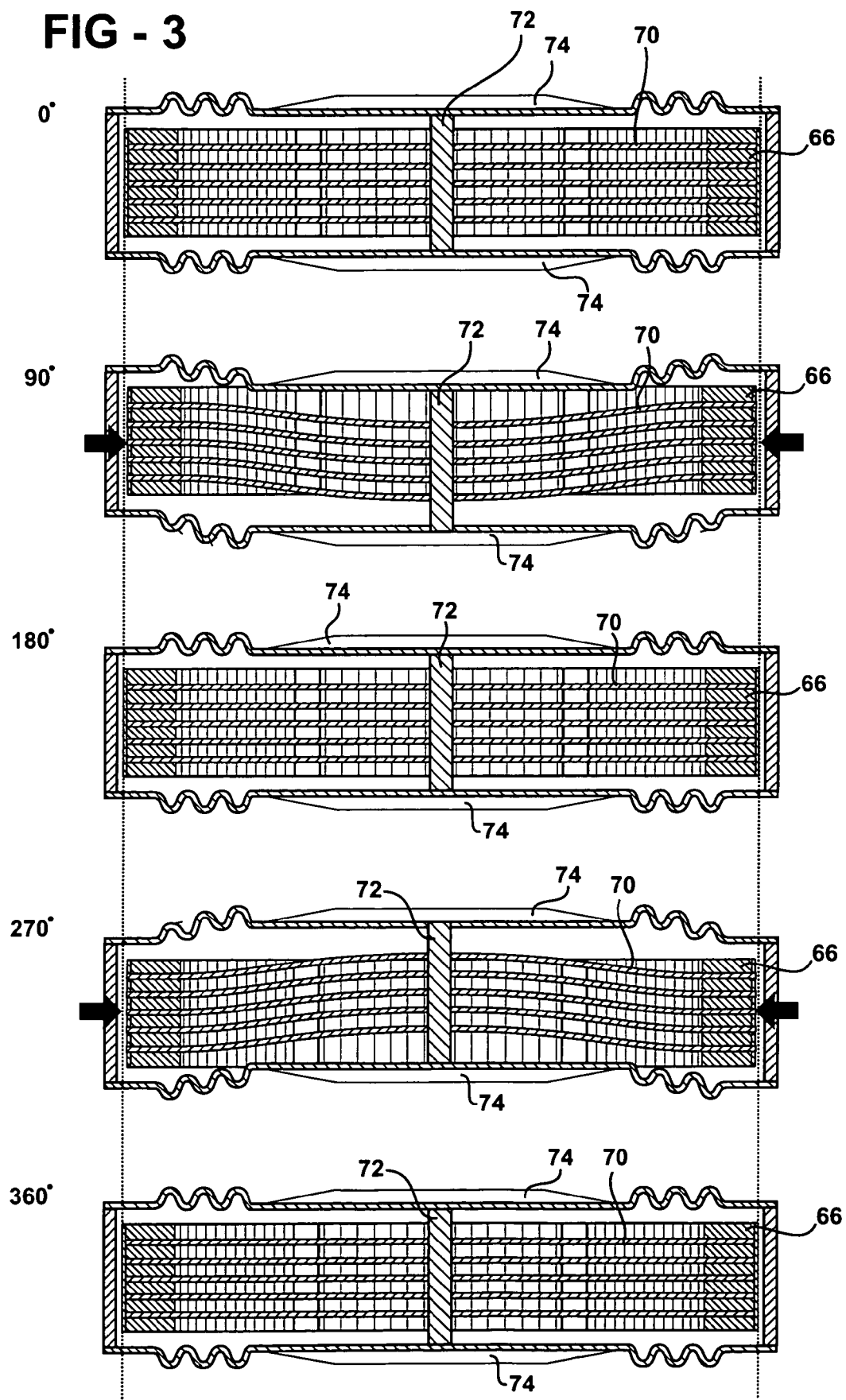

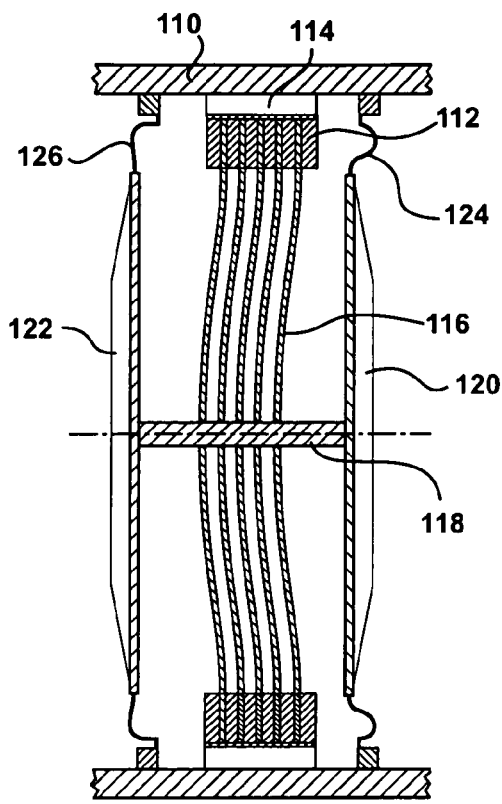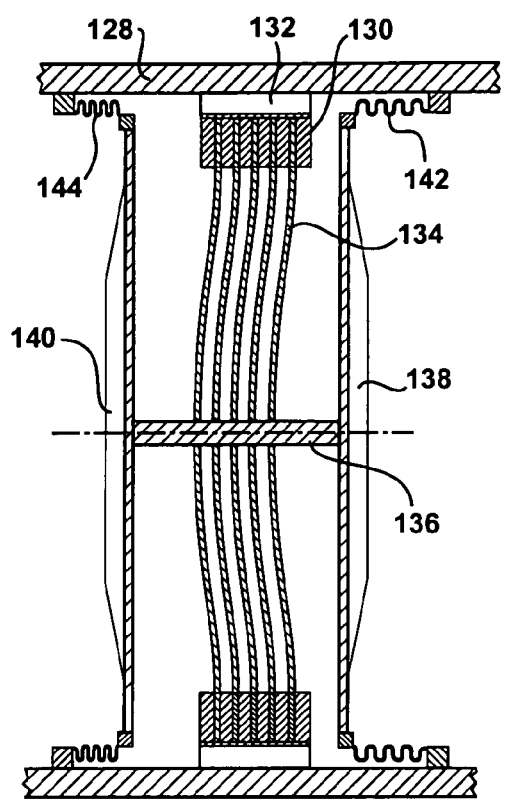
FIG - 9   FIG - 10
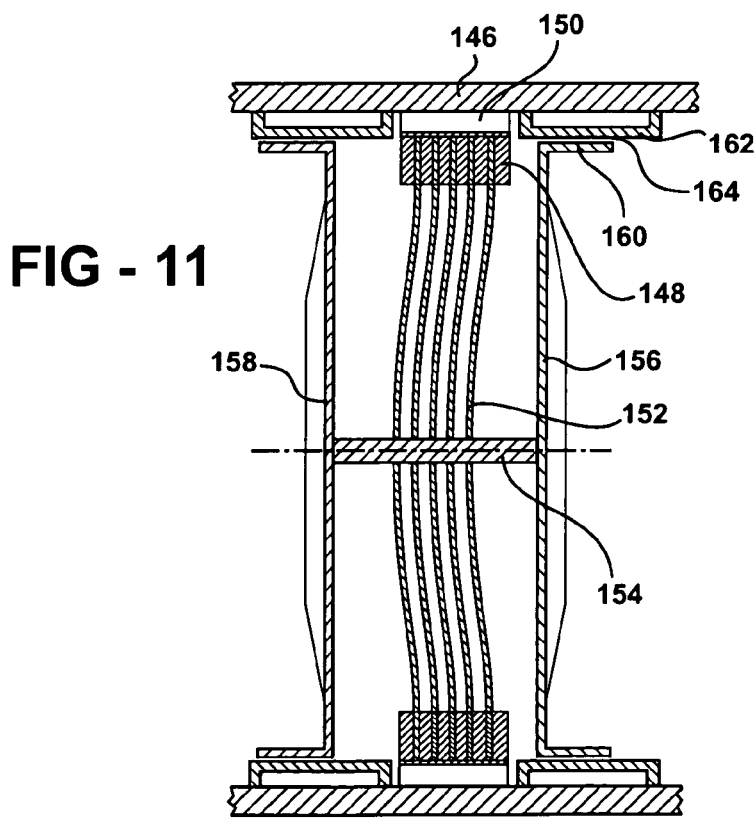
FIG - 11

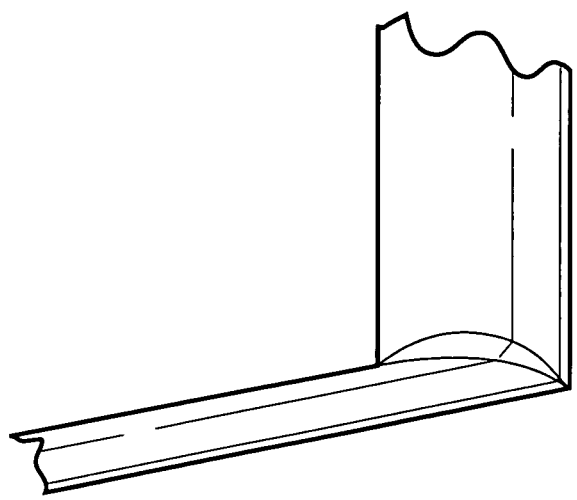
FIG - 33A
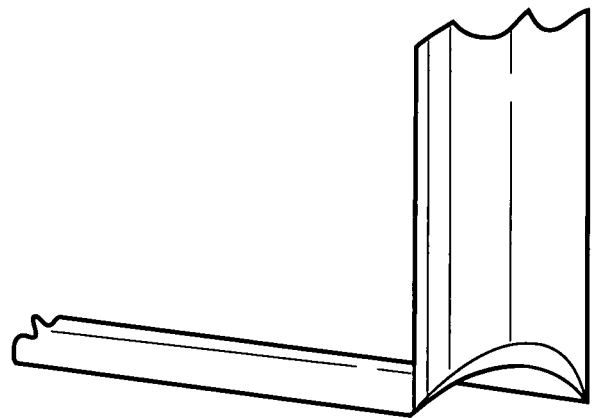
FIG - 33B
FIG - 33C
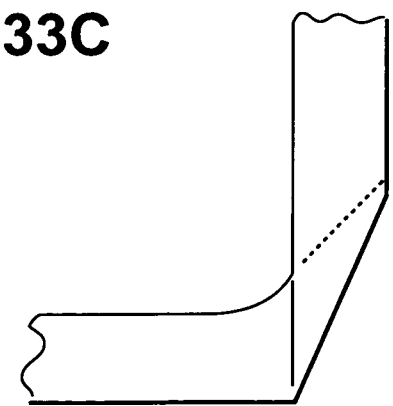

THERMACOUSTIC PIEZOELECTRIC GENERATOR

REFERENCE TO RELATED APPLICATIONS

This application is a continuation-in-part of U.S. patent application Ser. No. 10/810,907, filed Mar. 26, 2004, which claims priority to U.S. Provisional Patent Application 60/459,541, filed Mar. 31, 2003, the entire content of both of which is incorporated herein by reference.

GOVERNMENT SPONSORSHIP

This work was supported by the Office of Naval Research grant number N00014-95-1-0212 and N00014-03-0652, and the Department of Energy FreedomCAR and Vehicle Technologies Program, through cooperative agreement number DE-FC26-04NT42113. The United States Government has certain rights in this invention.

FIELD OF THE INVENTION

The invention relates to the field of electrical power generation from heat using oscillatory linear motion alternators.

BACKGROUND OF THE INVENTION

Oscillatory heat engines such as thermoacoustic engines or Stirling engines may be used for refrigerators or heat pumps, where the energy of gas pressure and volume oscillations is converted into the movement of heat into the engine at low temperatures and out of the engine at high temperatures. Oscillatory heat engines may also be used as prime movers, where heat flow into the engine at high temperatures and out of the engine at low temperature is converted into gas pressure and volume oscillations.

Conventional Stirling engines have long been used as prime movers that accept heat at a high temperature, reject less heat at lower temperature, and convert a large fraction of the difference into useful work in the form of pressure and volume oscillations of a working gas, such as helium. They are able to do this with high efficiency, defined as the useful work output divided by the hot heat input. Heat is exchanged between the external world and the working gas through a hot and a cold heat exchanger. A regenerator is placed between these two heat exchangers. The regenerator is a fine porous structure, such as a stack of fine metal screen, that is in intimate thermal contact with the gas. Conventional Stirling engines use two sliding pistons connected by a mechanical linkage to effect translations of the working gas through the regenerator that are properly phased with volume changes of the gas. In a common version of such engines a displacer piston translates the gas through the regenerator and a power piston takes net power from the engine by allowing expansion of the gas while the pressure is high and contraction of the gas while the pressure is low. Although Stirling engines have been under development for almost 200 years, their mechanical complexity has historically limited their commercial viability. Stirling engines with high power density typically have internal pressures in excess of 20 atmospheres, creating problems with the pressure vessel penetrations and sliding seals necessary for connecting rods and moving pistons. The mass of the moving parts also limits the operating frequency of the engine to the detriment of the engine's power density. The development of the free-piston Stirling engine eliminated the mechanical linkage between the power and displacer pistons and some of the sliding seals by resonating the pistons on gas or mechanical springs. However, the problems associated with internal sliding piston seals and the limits brought on by large piston masses remain.

The pressure and volume changes of the working gas can be considered more generally to be manifestations of sound in the gas. This acoustic point of view inspired the relatively recent invention of the thermoacoustic-Stirling engine described in U.S. Pat. Nos. 4,114,380; 4,355,517; 6,032,464 and 6,314,740 and WIPO publications WO 99/20957 and WO 02/086445 all hereby incorporated by reference for their teachings of such engines. In the acoustic point of view, the function of the flywheel in the original Stirling engine is accomplished instead by resonance—the repetitive oscillation of energy back and forth between potential and kinetic forms. Potential energy is stored in the compression or expansion of stiffness elements which may take several forms, such as metal springs or gaseous volumes that act as springs. Kinetic energy is stored in the oscillatory motion of masses, also of several forms, such as the motion of a mass of a fluid or a mass of solids. Resonance may be established between discrete lumped stiffness and mass elements, as in the case of a solid block on a coil metal spring or of the so-called Helmholtz acoustic resonator; or resonances may be established among distributed elements, each element having both stiffness and mass-like properties, as in the case of a ringing tuning fork or the acoustic resonances of a gas filled tube; or resonance may occur in a continuum between these lumped and distributed extremes.

The thermoacoustic-Stirling engine shares with the free-piston Stirling engine the use of gas springs, but its much simplified mechanical design employs acoustic networks to form acoustic masses and springs that mimic the function and motion of mechanical pistons, thereby completely eliminating all pistons, mechanical linkages and sliding seals. In some forms of the thermoacoustic-Stirling engine, a resonant tube of gas, approximately the length of half a wavelength of sound, functions as the power piston.

An earlier version of thermoacoustic engine utilizes standing waves and imperfect thermal conduction between the working gas and the porous medium, called a stack in this type of engine rather than a regenerator, to achieve the proper phasing between gas motion through the stack and expansions and contractions of the gas. Examples of patents teaching this type of technology are U.S. Pat. Nos. 4,398,398; 4,489,553; 4,722,201 hereby incorporated by reference. Thermoacoustic standing wave engines share with thermoacoustic-Stirling engines the advantages of eliminating the moving pistons of conventional or free-piston Stirling devices, and are even simpler in their construction. However, they suffer from poor efficiency associated with the necessarily poor heat transfer between the gas and the stack. Like many thermoacoustic-Stirling engines, they also use a long resonating tube of gas to establish a resonance.

Many other oscillatory heat engines utilizing resonance exist as well, some examples of which are a cascaded thermoacoustic device, (U.S. Pat. No. 6,658,862 hereby incorporated by reference), a no-stack thermoacoustic device, (R. S. Wakeland and R. M. Keolian, "Thermoacoustics with Idealized Heat Exchangers and No Stack," *J. Acoust. Soc. Am.*, 111 (6), Pt. 1, 2654-2664, 2002, hereby incorporated by reference), a heat-controlled acoustic wave system of Marrison (U.S. Pat. No. 2,836,033 hereby incorporated by reference) and some very old heat engines such as singing flames, the Sondhauss tube and the Rijke tube, described by Rayleigh (J. W. S. Rayleigh, "*The Theory of Sound,*" Dover, N.Y., 1945, Vol. 2, pp. 224-234, hereby incorporated by reference).

The output power per unit volume (the volumetric power density) of a thermoacoustic engine may be increased by operating the engine at higher frequencies. The power output of a thermoacoustic-Stirling or standing wave engine is proportional to the engine area normal to the direction of sound, the mean pressure of the working gas, the speed of sound of the working gas, and the square of the ratio of the acoustic pressure amplitude to mean pressure of the working gas. The output power does not explicitly depend on the operating frequency of the engine. However, the overall length of the engine is proportional to the wavelength of sound, which is inversely proportional to the operating frequency, even when solids are used in place of gasses to establish resonance. Because the volume of the engine is proportional to the normal area times the engine length, it is therefore possible and advantageous to reduce the volume taken up by the engine by raising the operating frequency, which can be done with little penalty in output power. Raising the operating frequency is limited by the ability of the heat exchangers to function properly when their effective size is limited by the shorter acoustic displacements that result at higher frequencies, by the parasitic thermal conduction between hot and cold regions of the engine which will be closer together as the frequency is increased, and by the moving mass of any transducers used to exchange electrical power with the engine.

Although it has long been the practice of designers of conventional and free piston Stirling engines to use the location of the power piston for the transduction of power into or out of the heat engine, this was not originally the practice in thermoacoustics. An early attempt to shorten a thermoacoustic device was made by Hofler and Grant (L. A. Grant, "Investigation of the Physical Characteristics of a Mass Element Resonator," M.S. Thesis, Naval Postgraduate School, Monterey, Calif., 1992, National Technical Information Service ADA251792) by substituting a resonating mass for the mass impedance presented by the typical nearly half wavelength long resonating tube. (Impedance, or more properly the specific acoustic impedance, is the complex ratio of pressure to velocity. A mass impedance has the pressure leading the velocity by 90 degrees so that the pressure is in phase with the acceleration, as would be the case for a mass.) Similarly, U.S. Pat. No. 6,314,740 and WIPO publication WO 99/20957, for the case of thermoacoustic-Stirling engines, and U.S. Pat. No. 6,578,364 (herein incorporated by reference), for the cases of both the thermoacoustic standing wave and thermoacoustic-Stirling engines, teach that when a thermoacoustic engine is used with a transducer for removing or adding power (only electrodynamic examples are shown), the length of the engine can be greatly shortened by substituting the moving mass of the transducer for the acoustic mass impedance of the working gas in the half wavelength long resonant tube. In effect, the transducer is used as the power piston of the conventional or free piston Stirling engines.

Thus, transducers that present a mass impedance may be beneficial; since the core of oscillatory heat engines often present an impedance which is primarily stiffness-like (pressure lagging velocity by nearly 90 degrees), the combination of mass-like transducers and stiffness-like engines, along with other mass and stiffness impedances as desired, may be combined to form a resonant system that result in compact useful heat engines.

The only examples of transducers that have been given in the prior art, however, that present a mass impedance which may be used for this beneficial shortening of the engine are electrodynamic, because in the prior art only electrodynamic transducers have a stroke (peak to peak displacement amplitude) sufficient to accomplish this task. Linear motion electrodynamic transducers (e.g. U.S. Pat. Nos. 4,623,808 and 5,389,844 hereby incorporated by reference) may be used for driving or generating electricity with any of the oscillatory heat engine types. This electrodynamic class of transducers, when used as alternators, for example, use various topologies to induce an electromotive force in a wire by way of a changing magnetic flux through a stationary coil, or by way of wire motion through a static magnetic field. Electrodynamic alternators, however, have the disadvantage that their moving mass tends to be large. This is not generally a problem at low operating frequencies, where it is more important that the alternator have a large stroke to roughly match the large displacement amplitude of the sound, but the large moving mass limits the use of electrodynamic transducers at high frequencies.

A number of piezoelectric generators have been proposed in the patent literature for a variety of purposes unrelated to the generation of electricity from oscillating heat engines: a vibrating reed driven by the passage of air in the nose cone of a missile (U.S. Pat. No. 4,005,319 hereby incorporated by reference), bender elements lining a automobile muffler to pull energy out of the sound of auto exhaust, (U.S. Pat. No. 4,467,236 hereby incorporated by reference), piezoelectric elements embedded in motor vehicle tires to pull energy out of the flexing of tires via slip rings (U.S. Pat. No. 4,504,761 hereby incorporated by reference), a stack of piezoelectric elements excited by the pressure pulse of an internal combustion engine (U.S. Pat. No. 4,511,818 hereby incorporated by reference), a strip of piezoelectric plastic implanted into the human body to energize implanted electronics with body movement (U.S. Pat. No. 5,431,694 hereby incorporated by reference), bender elements that are plucked by cams which move in response to ocean waves (U.S. Pat. No. 5,814,921 hereby incorporated by reference), rotary motion of an eccentric shaft that applies oscillating stresses onto piezoelectric elements in contact with the eccentric (U.S. Pat. No. 6,194,815 hereby incorporated by reference), or which are inertially stressed by the eccentric motion (U.S. Pat. No. 6,429,576 hereby incorporated by reference). Some of these applications appear to be impractical.

The use of piezoelectric alternators in place of electrodynamic alternators in a thermoacoustic application has been suggested for use with the standing wave engines (W. C. Ward et al., "Thermoacoustic engine scaling, acoustic and safety study," Los Alamos National Laboratory unclassified report LA-12103-MS, 1991). Their alternator configuration is interesting and clever. However, like many traditional acoustic transducers, it presents to the resonator a very high impedance, and it has a very limited available stroke, factors which are associated with the high mechanical stiffness and limited mechanical strain of a raw piece of piezoelectric ceramic. The high impedance and low stroke of their transducer forces it to be placed near the pressure anti-node of the sound field where the acoustic velocity is small. Since during a cycle of sound energy oscillates between potential and kinetic forms and the transducer is incapable of holding much of the kinetic energy due to its limited stroke, the resonator needs to be about as long as a half wavelength of sound so that a large volume of fast moving gas near the velocity anti-node may accept the kinetic energy. This Los Alamos configuration of a piezoelectric alternator cannot take the space saving advantage of using the alternator as a resonating mass that may substitute for much of the gaseous mass of the acoustic resonator.

An earlier patent (U.S. Pat. No. 3,822,388 hereby incorporated by reference) showing a simple stack of piezoelectric ceramic coupled with hydraulic fluid and a column of mercury to the pressure oscillations generated by an otherwise conventional Stirling engine, also presents the engine with a transducer that is very stiff. With its high impedance and large mass of coupling fluids, it is unsuitable for use with thermoacoustic engines.

In addition to being used as prime movers, thermoacoustic and Stirling heat engines may be used in the opposite sense, accepting work in the form of the coupled pressure and volume changes of sound in order to pull heat from a thermal load at low temperature and reject heat at a higher temperature, useful for constructing refrigerators or heat pumps. Transducers used as acoustic drivers to convert electrical power into the acoustic power needed to run the refrigerators or heat pumps would potentially have the same space saving advantages as their alternator counterparts if they were made to present a mass impedance. Additionally, by combining a prime mover with a refrigerator, it is possible to make heat driven refrigerators, for example for use in remote or mobile applications where connection to the electrical power grid is not feasible or desirable. It is often necessary, however, to make electricity available for the running of fans and pumps for the distribution of the cooling effect or for auxiliary uses. It is therefore desirable to have an efficient means of generating electricity in heat driven refrigerators, chillers and heat pumps. It is also desirable to have compact transducers (alternators or drivers) that can operate at high frequency that present a mass rather than a stiffness impedance, which may be used to establish resonance with oscillatory heat engines presenting a primarily stiffness impedance. These needs are addressed by the present invention.

SUMMARY OF THE INVENTION

The present invention provides a thermoacoustic-piezoelectric electrical power generator that uses the heat driven pressure and volume oscillations of thermoacoustic prime movers to power piezoelectric alternators. Refrigeration stages may be added to the generator as well. A first embodiment of the present invention is a thermoacoustic generator, including a housing containing a working volume of gas with a pressure. A thermoacoustic core is supported in the housing and includes a first heat exchanger and a second heat exchanger. The thermoacoustic core is operable to introduce acoustical power into the housing, thereby oscillating the pressure of the gas at a frequency. A piezoelectric alternator is supported in the housing and has a face that is movable when acted on by acoustical power. The alternator further includes a portion of piezoelectric material operable to produce electrical power when acted on by a stress. The portion of piezoelectric material is in mechanical communication with the movable face, such that the movement of the face stresses the portion of piezoelectric material so as to produce electrical power. The alternator has a moving mass that serves as a substantial portion of the resonating mass inside the housing. This provides a pressure oscillation frequency in the housing that is substantially lower than for a similar system with a rigid member replacing the alternator. In a preferred version of the first embodiment, the movable face of the alternator substantially blocks the passage of gas.

In some versions of the first embodiment, the movable face is a first diaphragm. The housing has a sidewall, and the diaphragm may have a perimeter seal substantially sealing the diaphragm to the sidewall of the housing. The perimeter seal may be selected from the group consisting of a roll sock, a bellows, and a clearance seal. The generator may also include a second diaphragm forming a second face of the alternator. The portion of piezoelectric material is also in mechanical communication with the second diaphragm, and is disposed between the first and second diaphragms.

In some versions of the first embodiment, the piezoelectric alternator portion includes a perimeter member that includes the portion of piezoelectric material. The perimeter member is configured such that compression of the perimeter member causes compression of the portion of piezoelectric material. The perimeter member surrounds a central area. A hub is disposed in the central area and is movable relative to the perimeter member along the axis. The hub is in mechanical communication with the movable face of the alternator. A plurality of spokes interconnect the hub and the perimeter member such that relative movement of the hub along the axis compresses the perimeter member and thereby compresses the piezoelectric material. This version of the first embodiment may have a housing with a sidewall and a first diaphragm serving as the alternator face. A perimeter seal seals the first diaphragm to the sidewall of the housing, and may be selected from the group consisting of a roll sock, a bellows, and a clearance seal. It may further include a second diaphragm in mechanical communication with the hub, with the second diaphragm also including perimeter seals sealing the diaphragm to the sidewall of the housing. The perimeter member, the hub and spokes are disposed between the first and second diaphragms.

In another version of the first embodiment, the perimeter member is generally ring-shaped. In this version, the piezoelectric material portion of the ring-shaped perimeter member may comprise substantially all of the ring-shaped perimeter member.

In yet another version, the perimeter member is generally polygonal-shaped with intersection zones defined between adjacent generally straight segments. The portion of piezoelectric material comprises a portion of each of the straight segments. The spokes may be interconnected with intersection zones of the polygonal-shaped member. Also, the generally straight segments of the perimeter member may each further include a spring in series with the portion of piezoelectric material.

A different version of a piezoelectric alternator for the first embodiment includes a perimeter support member generally defining an alternator plane, with the support member surrounding a central area. A hub is disposed in the central area, with the hub being movable relative to the perimeter support member along an axis generally perpendicular to the plane. The hub is in mechanical communication with a movable alternator face. The portion of piezoelectric material comprises a plurality of piezoelectric bimorph members each having an inner end in mechanical communication with the hub and an outer end supported by the perimeter support member, such that relative movement of the hub along the axis flexes the bimorph members. The bimorph members may be generally wedge-shaped such that their width parallel to the alternator plane is narrower at the inner ends than at the outer ends. The perimeter support member may be generally circular. The housing has a side wall and the alternator face may be a first diaphragm with a perimeter seal sealing the first diaphragm of the side wall of the housing, the perimeter seal being selected from the group consisting of a roll sock, a bellows, and a clearance seal. The generator may further include a second diaphragm in mechanical communication with the hub. The second diaphragm may include a perimeter seal sealing the diaphragm at the sidewall of the housing, with the perimeter support member, the hub, and the bimorph members being disposed between the first and second diaphragms.

In yet another version of the first embodiment, the piezoelectric alternator may further include at least one spring in series with a portion of piezoelectric material, so as to alter the stiffness of the piezoelectric alternator.

Another version of a piezoelectric alternator for the first embodiment includes a perimeter wall having a plurality of wall segments interconnected by springs. The portion of piezoelectric material comprises at least a portion of one of the wall segments. The wall segments have a surface that serves as the movable face of the alternator. The alternator may further comprise an alternator body enclosing a portion of the working volume of gas with the perimeter wall forming part of the alternator body. Alternatively, the perimeter wall may substantially separate the housing into first and second coaxial regions, with the thermoacoustic cores supported in one of the regions. A second thermoacoustic core may be supported in the other region with the thermoacoustic cores being coaxially arranged. According to a further alternative, the piezoelectric material may comprise substantially the entirety of all of the wall segments of the piezoelectric alternator.

A second embodiment of the present invention is directed to a piezoelectric transducer for converting between acoustical power, consisting of pressure and velocity, and electrical power, consisting of potential and current. The transducer includes the perimeter member with at least one portion of piezoelectric material. The perimeter member is configured such that compression of the perimeter member causes compression of the portion of piezoelectric material. The perimeter member surrounds a central area. The hub is disposed in the central area, with the hub being movable relative to the perimeter member along an axis. A plurality of spokes interconnect the hub and the perimeter member such that relative movement of the hub along the axis compresses the perimeter member and thereby compresses the piezoelectric material.

In some versions of the second embodiment, the transducer serves as a driver that converts electrical power to acoustical power. The transducer may further include a first diaphragm in mechanical communication with the hub such that the movement of hub moves at least a portion of the diaphragm. Electric power is applied to the piezoelectric material causing movement of at least a portion of the perimeter member, which causes movement of the spokes, which causes movement of the hub, which causes movement of at least a portion of the diaphragm, thereby creating acoustical power. Some versions further include a second diaphragm in mechanical communication with the hub, such that movement of the hub moves at least a portion of the second diaphragm, and the hub and spokes are disposed between the first and second diaphragm.

In another version of the second embodiment, the transducer is an alternator that converts acoustical power to electrical power. The transducer further includes a first diaphragm in mechanical communication with the hub, such that movement of the hub moves at least a portion of the diaphragm. When acoustical power is applied to the first diaphragm, it causes movement of the face and hub, thereby compressing the piezoelectric material. The transducer may further include a second diaphragm in mechanical communication with the hub, such that movement of the hub moves at least a portion of the second diaphragm, and the hubs and spokes are disposed between the first and second diaphragms.

In some versions of the second embodiment, the perimeter member is generally ring-shaped. The piezoelectric material portion of the ring-shaped perimeter member may comprise substantially the entire ring-shaped perimeter member. In other versions of the second embodiment, the perimeter member is generally polygonal-shaped with intersection zones defined between adjacent generally straight segments. The piezoelectric material portion of the perimeter member comprises a portion of each of the straight segments. The spokes may be interconnected with intersection zones of the polygonal-shaped perimeter member. Also, the straight segments of the perimeter member may each further include a spring in series with a portion piezoelectric material.

According to a third embodiment of the present invention, a piezoelectric transducer is provided for converting between acoustical power, consisting of pressure and velocity, and electrical power, consisting of potential and current. The transducer includes a perimeter support member generally defining a transducer plane. The member surrounds a central area. The hub is disposed in the central area, with the hub being movable relative to the perimeter support member along an axis generally perpendicular to the plane. A plurality of piezoelectric bimorph members each have an inner end in mechanical communication with the hub and an outer end supported by the perimeter support member, such that relative movement of the hub along the axis flexes the bimorph members. In the third embodiment, the transducer may be an alternator operable to convert acoustical power to electrical power. It may include a first diaphragm in mechanical communication with the hub, such that movement of the face causes movement of the hub along the axis. The bimorph members may be generally wedge-shaped such that the width of the members parallel to the transducer plane is narrower at the inner ends than at the outer ends.

According to a forth embodiment of the present invention, a piezoelectric transducer is provided for converting between acoustical power, consisting of pressure and velocity, and electrical power, consisting of potential and current. The transducer includes a transducer assembly with at least one piezoelectric element configured to produce electrical power when acted upon by a mechanical force. The transducer also includes at least one spring in series with the piezoelectric element so as to alter the resonant frequency of the transducer assembly.

According to a fifth embodiment of the present invention, a thermoacoustic device includes a housing containing a working volume of gas with a pressure. A piezoelectric transducer separates the housing into a first area containing a first volume of gas and a second area containing a second volume of gas. The transducer comprises a perimeter wall having at least one portion of piezoelectric material and at least one spring in series. A first thermoacoustic core is supported in the first area of the housing and includes a pair of heat exchangers. A second thermoacoustic core is supported in the second area of the housing and includes a pair of heat exchangers.

According to a further embodiment of the present invention, an electroactive transducer is provided for converting between acoustical power, consisting of pressure and velocity, and electrical power, consisting of potential and current. The transducer includes a diaphragm having a perimeter and a central portion. The diaphragm has a neutral position and at least one flexed position wherein the central portion is displaced axially relative to the neutral position. The perimeter and the central portion are disposed generally in a common diaphragm plane when the diaphragm is in the neutral position. A perimeter member includes at least one electroactive element. The perimeter member generally defines a transducer plane and surrounds a central area. The perimeter member is mechanically coupled to the perimeter of the diaphragm such that displacement of the central portion from the neutral position to the flexed position stresses the electroactive element. In some embodiments, the diaphragm plane is generally coextensive with the transducer plane and the diaphragm is disposed in a central area defined by the perimeter member such that the perimeter member generally surrounds the diaphragm. The electroactive element may comprise a plurality of electroactive elements disposed generally in a ring and the electroactive elements may be piezoelectric elements.

In yet another embodiment of the present invention, an electroactive transducer is provided for converting between acoustical power, consisting of pressure and velocity, and electrical power, consisting of potential and current. The transducer has a first face and an opposed second face. A diaphragm has a first convex face defining at least part of the first face of the transducer and an opposed concave face defining at least part of the second face of the transducer. The diaphragm has a perimeter and a central portion. The diaphragm has a neutral position and at least one flexed position wherein the central portion is displaced axially relative to the neutral position. A perimeter member includes at least one electroactive element and generally defines a transducer plane surrounding a central area. The perimeter member is mechanically coupled to the perimeter of the diaphragm such that displacement of the central portion from the neutral position to the flexed position stresses the electroactive element. In some versions, the perimeter of the diaphragm is disposed in the transducer plane when the diaphragm is disposed in the central area defined by the perimeter member such that the perimeter member generally surrounds the diaphragm. The at least one electroactive element may comprise a plurality of electroactive elements disposed generally in a ring, and the electroactive elements may be piezoelectric elements.

In a further embodiment of the present invention, a thermoacoustic generator, refrigerator or heat pump is provided that includes a housing containing a working volume of gas with a pressure. A thermoacoustic engine is supported in the housing and has a first heat exchanger and a second heat exchanger. The thermoacoustic engine is operable to introduce acoustical power into the housing or to remove acoustical power from the housing. An electroactive transducer is supported in the housing and includes a diaphragm having a perimeter and a central portion that is movable when acted on by acoustical power. The diaphragm has a neutral position and at least one flexed position wherein the central portion is displaced axially relative to the neutral position. A perimeter member includes at least one electroactive element and generally defines a transducer plane and surrounds a central area. The perimeter member is mechanically coupled to the perimeter of the diaphragm such that displacement of the central portion from the neutral position to the flexed position stresses the electroactive element.

In yet a further embodiment of the present invention, an acoustic device is provided that includes a housing having a volume defined therein. The housing is filled with a gas having a mean density, and an adiabatic sound speed. An electroactive transducer is at least partially disposed in the housing. The transducer includes a diaphragm having a perimeter and a central portion. The diaphragm has a neutral position and at least one flexed position wherein the central portion is displaced axially relative to the neutral position. A perimeter member includes at least one electroactive element and generally defines a transducer plane and surrounds a central area. The perimeter member is mechanically coupled to the perimeter of the diaphragm such that displacement of the central portion from the neutral position to the flexed position stresses the electroactive element. The diaphragm divides the housing such that a first volume is defined on one side of the diaphragm and a second volume is defined on the other side of the diaphragm. The diaphragm has a radius a The diaphragm has a tensile force per length of edge T given by $T=F_R/(2\pi a)+T_0$, wherein $F_R$ is the arithmetic sum of all radial time dependent tensile forces that the perimeter member applies to the diaphragm and $T_0$ is a bias tension present when the diaphragm is in the neutral position. The diaphragm is configured such that $\chi$ is in the range of 7 to 34 inclusive, wherein $\chi$ is defined as $\chi=\pi\rho_0 c_a^2 a^4/(V_o T)$, wherein $V_0$ is the effective volume of the gas spring compressed by the diaphragm.

BRIEF DESCRIPTION OF THE DRAWINGS

FIG. 3 shows operation of the piezoelectric ring transducer/alternator through one cycle of sound. There are two compressions of the piezoelectric ring, at 90° and 270°, for each acoustic cycle.

FIG. 9 shows a cross-sectional view of an alternator design with roll socks as a means for providing flexible seals.

FIG. 10 shows a cross-sectional view of an alternator design with bellows as a means for providing flexible seals.

FIG. 11 shows a cross-sectional view of an alternator design with clearance seals as a means for providing a flexible seals.

FIGS. 33A-33C are detailed views of portions of arches which may be used to seal radial and axial slots in one of the transducers.

DETAILED DESCRIPTION OF THE INVENTION

Figure 1:
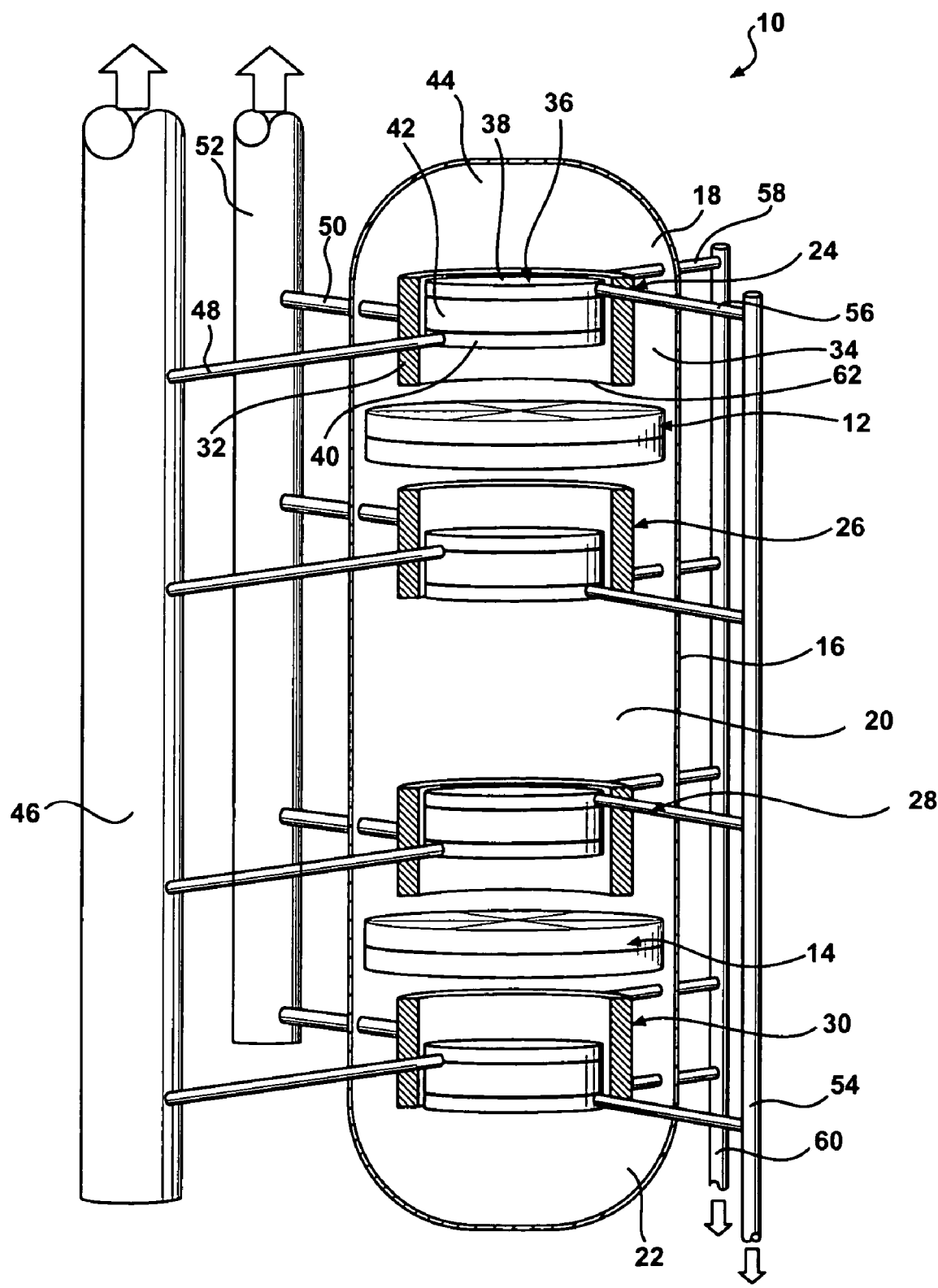
FIG. 1 shows a partially cutaway side view of a balanced configuration for a thermoacoustic-Stirling piezoelectric generator according to a first embodiment of the present invention. The generator is sized to deliver 4 kW of electricity derived from the waste heat of diesel truck exhaust.

The present invention is directed to a heat driven thermoacoustic-piezoelectric generator that uses high efficiency, compact, reliable thermoacoustic-Stirling engines coupled to a linearly oscillating alternator based on piezoelectric rather than electrodynamic technology. The alternator moving mass replaces the acoustic or resonating mass of the traditional thermoacoustic resonator. An optional chiller or heat pump stage may be added to the generator. The piezoelectric alternators presented here may be used with other oscillatory engines as well. The piezoelectric alternators may also be used in the reverse sense as driving transducers for the creation of acoustic energy from electricity.

Electric power generation using thermoacoustic-Stirling engines coupled to piezoelectric alternators should allow significant advantages in size, weight, radiated noise, maintenance, and efficiency when compared to other technologies. In addition, this technology is well suited to accept heat from a variety of sources, such as waste heat, a dedicated burner, the sun, or nuclear sources. A first preferred embodiment for such a generator is shown at 10 in the configuration of FIG. 1. Two piezoelectric alternators 12 and 14, which act as resonating masses, separate a pressure vessel 16 into upper 18, central 20 and lower 22 chambers, which act as energy generating gas springs. The pressure vessel 16 is filled with a working gas, for example helium gas at 10 atmospheres of mean pressure (other pressures could easily be used). Each alternator 12 and 14 has two faces that move together along the axis of the pressure vessel. Pressure swings in the chambers are coupled to the volume swept out by the alternator face motion. The faces are sealed to the pressure vessel 16 by a means for allowing motion, such as constructing the faces in the form of a corrugated diaphragm, although a light weight piston sealed to the vessel with a bellows or roll-sock, or a clearance seal may also be used (see FIGS. 9-11). A small controlled leak (not shown) allows the working gas of the engines to equilibrate with the space inside the alternators over a long time scale.

Four thermoacoustic-Stirling engines 24, 26, 28 and 30 in the chambers create pressure swings in the gas, for example with 1 atmosphere amplitude. The oscillations are driven thermally by external heat applied to the engines through hot heat exchangers and rejected heat taken away by cold heat exchangers, as described in the next paragraph. The engines are a very compact coaxial adaptation of the highly efficient thermoacoustic-Stirling engines recently pioneered by the thermoacoustics group at Los Alamos National Laboratory (see U.S. Pat. No. 6,032,464 hereby incorporated by reference). The pressure swings drive the two piezoelectric alternators 180° out of phase—the alternators move in unison toward or away from each other—in a vibrationally balanced configuration. The overall topology is similar to a full wavelength acoustic wave, except that the effective wavelength is considerably shortened by substituting the moving mass of the alternators for the acoustic or resonating mass of the sound wave at the velocity anti-nodes (see U.S. Pat. Nos. 6,578,364, 6,314,740 and WO 99/20,957 and WO 02/086,445 incorporated herein by reference).

The thermoacoustic engines 24-30 are preferably substantially identical. Therefore, only the first engine 24 will be described in more detail. It should be noted that FIG. 1 is a cutaway side view of the generator 10 and that the pressure vessel 16, the engines 24-30, and the generators 12 and 14 are preferably generally radially symmetrical with each item being generally disc-shaped or generally cylindrical. The engine 24 includes a generally tubular nacelle 32 that extends coaxially with the wall of the pressure vessel 16 and is spaced from the wall 16 so as to provide an annular space 34 between the nacelle 32 and the wall 16. A thermoacoustic core 36 is contained inside the nacelle 32. The core 36 includes a cold heat exchanger 38 and a hot heat exchanger 40 sandwiching a regenerator 42.

The thermoacoustic engine generates sound in the following manner. The annular space between the resonator wall 16 and the nacelle 32 acts as a lumped acoustic mass. The space 44 between the cold heat exchanger and the end of the resonator acts as a gas spring. This mass-spring sub-system is tuned to have a resonant frequency well above the operating frequency of, for example, 400 Hz, causing the pressure oscillations at the closed end of the resonator to be slightly resonantly enhanced with respect to its driving point near the diaphragm of the alternator 12, with negligible phase shift. Thus the acoustic pressure is nearly in phase on both sides of the regenerator 42 but the amplitude is slightly higher on the cold side than on the hot side. When the diaphragm of the alternator 12 moves towards the regenerator 42 and the pressures on the hot and cold sides swing positive, this slight pressure difference across the regenerator drives the gas in the regenerator to move from colder to hotter locations. The gas in the regenerator, being in intimate thermal contact with the regenerator screen, expands as it moves towards hotter locations. The gas expansion during the positive pressure phase does work on the rest of the gas, which causes the positive pressure to swing even higher than it would have otherwise been, and pushes back on the diaphragm giving it energy. During the other half of the acoustic cycle, when the diaphragm moves away from the regenerator 42, the pressures on the hot and cold sides swing negative (lower pressure), with a slightly larger swing on the cold side. This causes a pressure gradient which drives the gas in the regenerator to move toward the cold side, where it cools and contracts, thereby causing the pressure to swing even further negative, which pulls the diaphragm back, again adding energy to the diaphragm.

Between the hot and cold heat exchangers 40 and 38 is the regenerator 42 which may be a stack of fine metal screen. Thermoacoustic-Stirling engines are similar to conventional mechanical and free-piston Stirling engines in that the working gas situated within the regenerator undergoes an approximation to the ideal Stirling thermodynamic cycle. However, the thermoacoustic version of the Stirling engine eliminates the sliding mechanical displacer and power pistons of conventional or free-piston engines by using acoustic networks, which is expected to improve engine reliability and cost. In the generator of FIG. 1, gas in the annular space 34 between the nacelle 32 surrounding the engine core 36 and the pressure vessel wall 16 acts somewhat like the displacer piston while the alternator acts as the power piston of the conventional or free-piston Stirling engine.

The first Los Alamos engine operated between a hot temperature $T_H$ of 725° C. and cold temperature $T_C$ of 15° C., while producing 710 W of sound and achieving a 30 percent thermal to acoustic efficiency. This efficiency is 42 percent of the ideal Carnot efficiency $1-T_C/T_H$, which is 71 percent at these temperatures. The higher the operating frequency, the smaller this type of engine can be made with little consequence to the output power. The first Los Alamos engine was large, however, operating at around 80 Hz for convenience of construction. Their engine was designed using their program DeltaE, which embodies the good but still imperfect physics knowledge base for thermoacoustics. DeltaE is usually accurate to within 20 percent when care is taken to included all known high amplitude nonlinear effects, and is publicly available.

The thermoacoustic-Stirling engines used in the present invention are a more compact coaxial geometry than used by Los Alamos. These engines have been modeled with the Los Alamos DeltaE software. The DeltaE model predicts that each engine should achieve 1.4 kW of acoustic power at 400 Hz, with 33 percent thermal to acoustic conversion efficiency, running between 650° C. and 30° C. heat exchanger metal temperatures, for an efficiency relative to Carnot of 49 percent.

Referring again to FIG. 1, two thermoacoustic-Stirling engines are situated on either side of an alternator. They may generate 10 percent amplitude (15 PSI), 400 Hz pressure oscillations in the helium. The oscillations are 180° out of phase on either side of the alternator, driving the alternator faces along the generator axis. The resonance of the combined system can be understood in terms of the central mass of the alternator oscillating between the gas springs of each engine; each alternator and pair of engines is nominally a spring-mass-spring system.

The heart of each engine consists of a hot heat exchanger, a regenerator, and a cold heat exchanger. The regenerator may simply be a stack of fine wire screen. Hot combustion products from a burner (not shown) or other heat source circulate into, through, and out of the hot heat exchanger via tubular penetrations of the pressure vessel. In the embodiment of FIG. 1, hot combustion products travel through a main exhaust pipe 46. Hot inlet tubes 48 allow hot combustion products to flow from the main exhaust pipe 46 to each of the hot heat exchangers, such as 40. Hot outlet tubes 50 allow the hot combustion products to flow from the hot heat exchangers to a secondary exhaust pipe 52. As will be clear to those of skill in the art, the heat may be provided to the hot heat exchangers in a variety of ways, including provision of hot gas from any source, or hot liquid. In one embodiment of the present invention, hot combustion products flow through the main hot heat exchanger 40, causing the metal temperature of the hot heat exchanger to reach 1200° F. (650° C.). Inlet coolant line 54 provides cold heat transfer fluid to cold inlet tubes 56, which communicate with the cold heat exchanger, such as 36. Cold outlet tubes 58 allow the cold heat transfer fluid to flow from the cold heat exchangers to an outlet cooling line 60. Again, cold gas or fluid may be provided to the cold heat exchangers in a variety of ways and from a variety of sources. Also, as will be clear to those of skill in the art, the terms hot and cold, as used herein, are relative terms. In one embodiment of the present invention, heat transfer fluid circulating through the cold heat exchanger via its pressure vessel penetrations keep the cold exchanger near ambient temperature, 90° F. (32° C.). The heat exchanger pressure vessel penetrations and the arrangement of the engine components suspended within the pressure vessel are chosen to minimize the adverse thermal expansion stresses associated with the hot heat exchanger temperature.

Surrounding the regenerator 42 and heat exchangers 38 and 40 is the nacelle 32 that splits the gas into a central, axial part and an outer annular part. A filler ring may also be used to help guide the gas flow. The gas in the annular passage 34 outside the nacelle 32 acts somewhat like the displacer piston of a conventional mechanical Stirling engine, while the diaphragm takes the role of the power piston. As shown, the nacelle 32 may be offset somewhat such that the cold heat exchanger 36 is close to one end of the nacelle, while the other end of the nacelle extends past the hot heat exchanger 40 to an open end 62. The gas along the central axis within the nacelle 32, between its open end 62 and the hot heat exchanger 40, acts as a thermal buffer tube. This is a layer of gas that provides thermal isolation between the hot heat exchanger, the rest of the gas in the engine and the alternator face. The nacelle 32 is preferably constructed from thin material, is hollow and is filled with thermal insulation to minimize the heat leak through the nacelle between the hot heat exchanger and the gas in the annular space outside the nacelle. Additionally, the inside surface of the nacelle preferably is constructed of a thin, low thermal conductivity material, such as rolled stainless steel shim stock, in order to minimize the heat leak along the nacelle between the hot heat exchanger and the cold heat exchanger. The outer surface of the nacelle 32 may be constructed of a thin higher thermal conductivity material, such as aluminum, brass, copper or steel, and thermally anchored to the cold heat exchanger, so as to control the temperature of the gas in the annular passage outside the nacelle. An expansion joint, sliding joint, or flexible seal may be provided near the open end of the nacelle to allow for thermal expansion of its inner surface relative to its outer surface in response to hot heat exchanger temperatures.

This relatively simple engine structure causes the quiescent state of the helium gas to become unstable, as described above, without requiring sliding parts or pistons. When the hot heat exchanger is brought to a sufficiently high temperature, the gas spontaneously undergoes pressure oscillations that drive the alternator, as previously described. The specific design of the alternator used in the power generation system of the invention can vary widely. Importantly, the alternator must have the capability of translating the pressure oscillations generated by the acoustic engine(s) into stress upon a piezoelectric element(s) thus generating power. Three example alternator designs will now be discussed.

Example 1

Ring Alternator

Figure 2A:
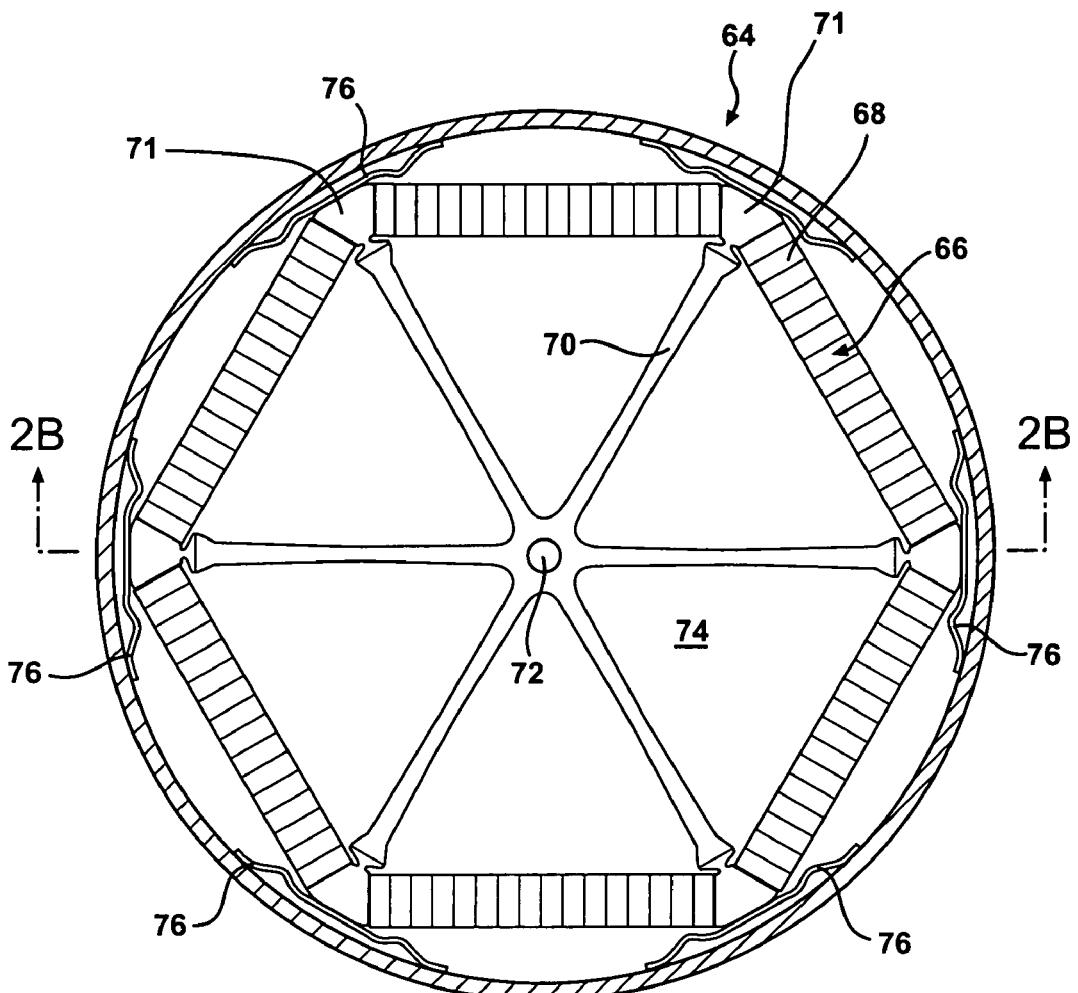
FIG. 2A shows a cross-sectional view of a quadratically driven piezoelectric ring transducer/alternator that forms one aspect of the present invention, taken along lines 2A-2A of FIG. 2B. Axial motion of the hub flexes the spokes which compresses the piezoelectric ring.
Figure 2B:
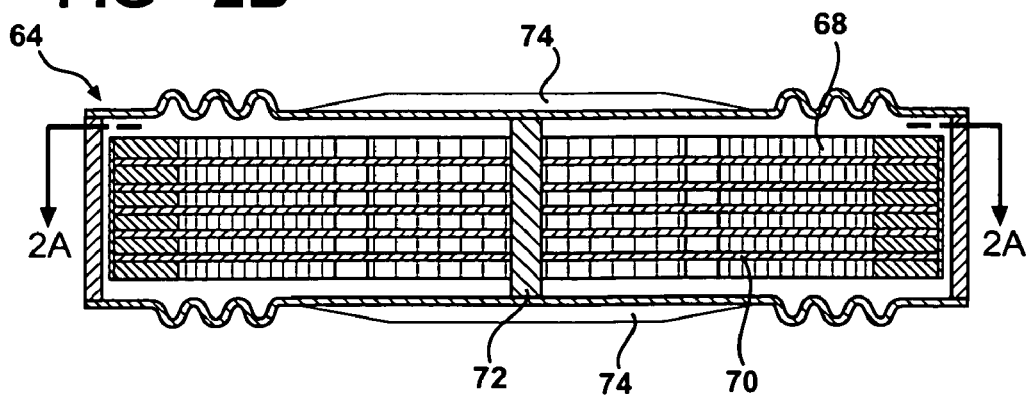
FIG. 2B shows a cross-sectional view of the ring transducer/alternator of FIG. 2A, taken along lines 2B-2B of FIG. 2A.

A first preferred embodiment of the alternator is the quadratically driven piezoelectric ring transducer or alternator 64 of FIGS. 2A and 2B. The transducer consists of a ring 66 of piezoelectric material 68, such as the poled ceramic lead-zirconate-titanate PZT, attached to sets of flexible radial spokes 70 via keystone-like supports 71. Other piezoelectric materials may be used, as will be clear to those of skill in the art. The ring 66 can be circular or polygonal; a hexagon with six sets of spokes is shown in the figure. Other shapes are also possible. The ring 66 may also be referred to as a perimeter member that includes a portion of piezoelectric material. The member is configured such that compression of the perimeter member causes compression of the piezoelectric portion. In the illustrated embodiment, the piezoelectric material forms substantially all of the straight segments extending between the supports 71, located at the intersection zones between adjacent segments.

For best performance the PZT preferably is organized as a stack of plates excited in their 3-3 mode as shown. Alternatively, the PZT sections may be plates extending from support 71 to support 71, excited in the 3-1 mode with electrodes on their transverse faces, for less cost. The spokes connect to a central hub 72, which moves along its axis. In this embodiment, the ring or perimeter member 66 may be said to generally define an alternator or transducer plane, and the hub moves along an axis generally perpendicular to the plane. The spokes 70 lie in or are generally parallel to the plane.

The hub connects to the moving faces of the alternator, here shown as corrugated diaphragms 74. The diaphragms may take a variety of forms. The illustrated diaphragms 74 are generally flat, but it may be preferable to make them cone shaped for stiffness. The faces are acted on by acoustical power, thereby moving the faces. Mounting springs 76 are shaped leaf springs that are stiff in the axial direction but compliant in the radial direction. They hold the internal components axially while allowing compression in the piezoelectric material.

FIG. 3 shows the operation of the alternator through one acoustic cycle, in a sequence from 0° to 360°. As acoustic pressure swings cause the alternator faces or diaphragms 74 and hub 72 to deflect in either direction along the axis (at 90° or 270°), the spokes 70 bend, come under tension, and pull the ring 66 inward causing the ring to experience compression. Thus, there are two cycles of ring compression for every cycle of sound. This frequency doubling allows the use of half as much PZT for the same output power.

Because it is a stiff ceramic, PZT requires mechanical power with relatively high forces and small motions, whereas the engine naturally delivers mechanical power with relatively low forces and large motion. Two force amplifying mechanisms are being used here to overcome this mechanical impedance mismatch. One is the conversion of axial force on the hub 72 into radial tension in the spokes 70, the second is the conversion of tension in the spokes 70 into compression of the ring 66.

Preferably, the elements of the piezoelectric material are polarized along the direction of the stack, but with every other element pointing in the opposite direction. Electrodes of adjacent elements touch, and every other electrode junction is wired together. In this way, the piezoelectric elements are mechanically in series but are all electrically in parallel. The electrical output of the elements is then rectified and fed to a power inverter/controller, as needed, to regulate the output voltage and frequency of the electrical power. The inverter/controller may also be responsible for regulating the fuel flow to a burner, if this is the desired source of heat, to match the power needs of the generator as the electrical load changes. Further details pertaining to the construction of this example of the alternator are disclosed in Example 4, below.

Example 2

Bimorph Alternator

Figure 4A:
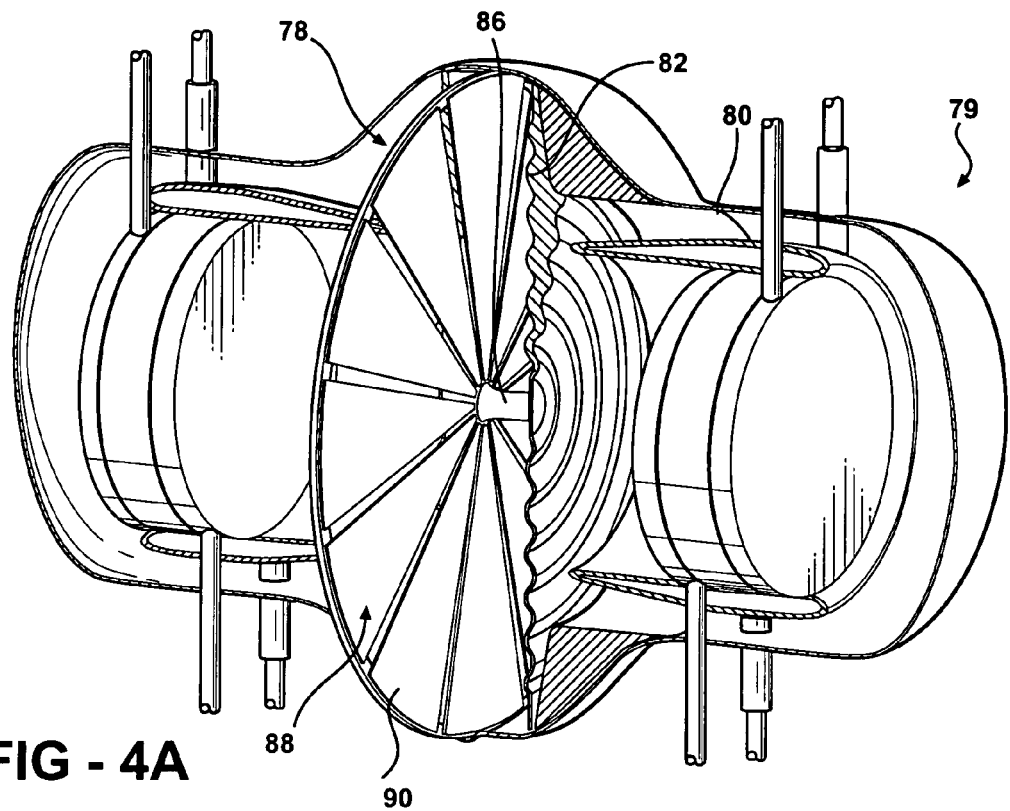
FIG. 4A shows a partially cutaway perspective view of a 2.0 kW thermoacoustic Stirling piezoelectric generator core.
Figure 4B:
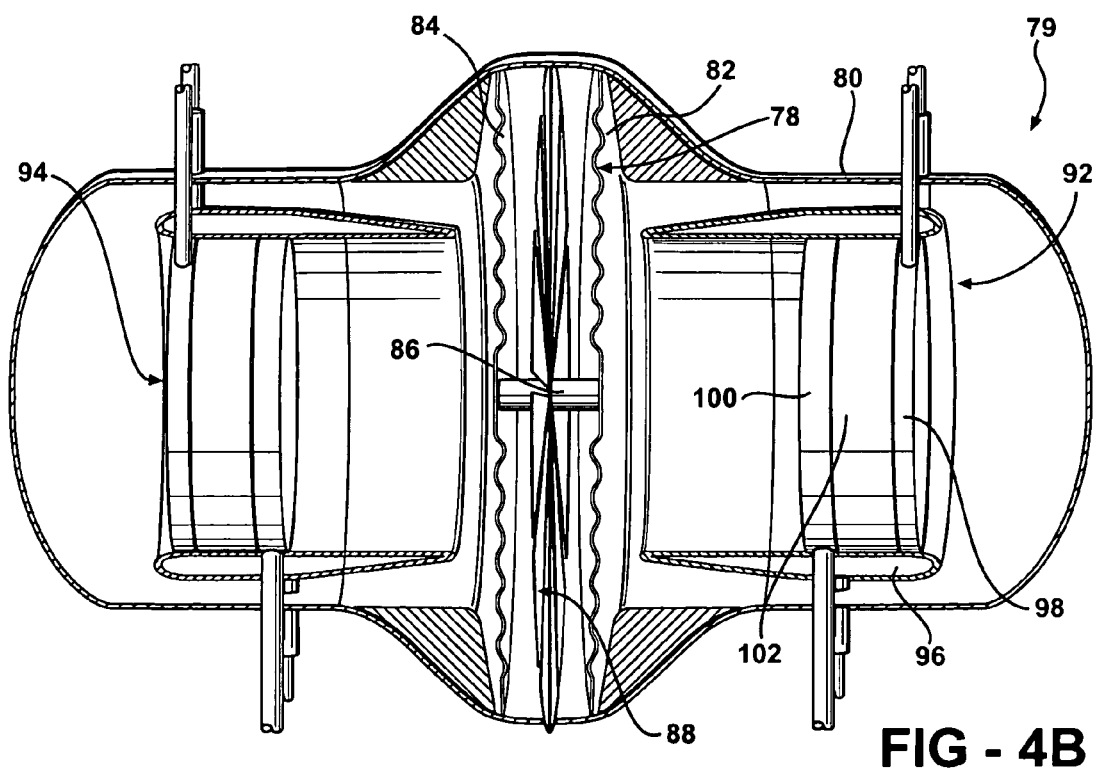
FIG. 4B shows a partially cutaway side view of the generator of FIG. 4A.

A second embodiment of a piezoelectric alternator 78 that presents a mass impedance to the thermoacoustic engines, thus reducing the necessary size of the pressure-vessel/acoustic-resonator, is shown in the two cutaway views of FIGS. 4A and 4B, drawn generally to scale. For definiteness, the figures show the core of a 2.0 kW thermoacoustic-Stirling piezoelectric generator. In one version, the steel pressure-vessel/acoustic-resonator 80 is 36 cm (14") long, 15 cm (6") in diameter at the ends, and bulges to 23 cm (9") diameter at the center. The resonator is filled with 10 atmosphere (150 psi) of helium gas. The walls of the resonator are 0.65 mm thick in the small diameter regions and 1.0 mm thick near the center to perform safely as a pressure vessel. Other dimensions, working fluids and pressures, of course, are possible.

Two flexible diaphragms 82 and 84 are located in the center of the resonator. In this embodiment, the diaphragms form the movable faces of the alternator. The centers of the diaphragms are constrained by a post 86 to move together in the direction of the resonator axis. The outer rims of the diaphragms form a seal against the resonator wall 80. In this version, seventy-five piezoelectric disks 88 are flexed by the diaphragms through a mechanical connection at the post. These diaphragms and piezoelectric disks comprise the electrical transducer, or alternator, portion of the generator. Each of the 75 disks is made of twelve triangular piezoelectric bimorph cantilever wedges 90. Only one such disk of wedges is shown in the figures. The triangular wedges 90 have a clamped boundary condition at their outer diameter, and a simply supported boundary condition at the post, produced by a small flexible strut at the vertex of each wedge. These boundary conditions cause a uniform bending stress throughout the bimorph, maximizing the effective use of the piezoelectric material. This arrangement also minimizes the moving mass, thereby allowing a high operating frequency, which reduces the overall size of the resonator. The bimorphs in this embodiment are a 0.65 mm thick sandwich of two thin PZT sheets glued on either face of a thin metal sheet. The force amplification necessary for impedance matching the alternator 78 to the engines is accomplished by the relatively small forces applied to the bimorph vertex causing relatively large bending stresses in the PZT. The bimorphs are made thin enough that the maximum allowable stress in the PZT ceramic is not exceeded when the engines drive the alternator faces to their maximum amplitude while the generator is operating at full power. Enough piezoelectric disks are used so that a sufficient volume of PZT material is present to convert the desired amount of power from mechanical into electrical forms. As will be clear to those of skill in the art, an alternator may be constructed with a different number of discs and/or discs with a different number of wedges. Also, the alternator designs disclosed throughout this application may be substituted into any of the generators disclosed herein, or may be combined in various ways.

As the bimorphs bend, they generate an electric potential across their faces. The disks are electrically wired in parallel to build up the total current. An inverter/controller (not shown) converts this power to the frequency and voltage needed by the electrical load. The inverter/controller may also be responsible for regulating the fuel flow to a burner, if this is the desired source of heat, to match the power needs of the generator as the electrical load changes.

As will be clear to those of skill in the art, this embodiment of the generator 79 includes a pair of thermoacoustic engines 92 and 94 arranged on opposites sides of the alternator 78. As the engines 92 and 94 are preferably identical, only 92 will be described in more detail. It includes a nacelle 96 that is coaxial with the pressure vessel 80 and defines an annular space between the outer surface of the nacelle and the inner surface of the wall of the pressure vessel 80. A cold heat exchanger 98 and a hot heat exchanger 100 sandwich a regenerator 102 inside the nacelle 96. As shown, a thermal buffer tube region is formed between the open end of the nacelle 96 and the hot heat exchanger 100 to prevent heat flow from the hot heat exchanger 100 to the gas in the annular space surrounding the nacelle 96. Also as shown, the nacelle 96 may have an improved shape to improve the flow characteristics around the nacelle.

The externally radiated noise from the raw core shown in FIGS. 4A and 4B would be an unacceptably high 105 dBA at full output power, due to the unbalanced design of the generator. The resonator body would vibrate along its axis with a 0.68 mm amplitude in response to the motion of the piezoelectric disks. However, the sound level could be brought down to about 70 dBA by placing a pair of generators end-to-end in a single pressure vessel, operating out of phase with each other. This configuration would be similar to the one illustrated in FIG. 1. In the balanced configuration, the radiated noise would have roughly equal contributions from residual vibration and from the straining of the resonator wall due to the internal pressure swings. However, depending on application, the main pressure vessel should additionally be surrounded with a second thin walled vessel, which would further isolate the radiated noise and protect the inner vessel from damage. For example, for a 2 kW generator in the balanced configuration of FIG. 1 (four 500 W engines with two 1 kW alternators), a 0.7 kg outer vessel made of 0.32 mm (0.013") thick steel could surround the inner vessel with a 1 cm gap. The estimated externally radiated noise then comes down to a nearly inaudible 34 dBA.

Not shown in FIGS. 4A and 4B is an optional flow straightener or guiding vanes at the open end of the nacelle 96. As gas makes the sharp turn between annular and axial regions of the nacelle, net mean circulations of the flow may occur due to flow separation at the lip of the nacelle. These steady currents may reduce the ability of the thermal buffer tube to function as a thermal isolation layer. A screen or other perforated structure across the open end of the nacelle, and/or a vanes to help guide the flow as it makes the turn, can serve to minimize this detrimental flow. These structures may also be chilled with the same heat transfer fluid that runs through the cold heat exchanger, to function as secondary heat exchanger (see G. W. Swift et al., "Acoustic Recovery of Lost Power in Pulse Tube Refrigerators," *J. Acoust. Soc. Am.*, 105 (2), Pt. 1, 711-724, 1999, the entire contents of which is incorporated herein by reference), to further define the temperature profiles in the working gas.

Also not shown in FIG. 4 is a means for stopping so-called Gedeon streaming (see D. Gedeon, "DC Gas Flows in Stirling and Pulse-Tube Cryocoolers," in *Cryocoolers 9*, edited by R. G. Ross, Plenum, N.Y., 385-392, 1999, the entire contents of which is incorporated herein by reference), a net mean flow of mass due to the presence of sound, from the cold heat exchanger, through the regenerator, to the hot heat exchanger, and returning to the cold heat exchanger through the annular space around the nacelle. This streaming flow is a parasitic load on the heat exchangers, robbing the engine of its efficiency. As taught by the Los Alamos group, the streaming can be stopped with an additional flexible diaphragm (or light piston supported by a flexible bellows) that allows the passage of oscillating gas motions but not steady gas motions, or with a so-called jet pump. Such a diaphragm may be placed near, but at a slight distance away from, the cold heat exchanger where the oscillatory motion of the diaphragm would be small, across the thermal buffer tube where it could also act to straighten the flow in that region, or in the annular space between the nacelle and the pressure vessel.

As part of the design of a transducer to be used as an efficient alternator, it is important to not allow the reactive mechanical impedance of the transducer to be very much larger than the useful non-dissipative resistive component of the mechanical impedance that is used for generating electricity. (Mechanical impedance is the complex ratio of the force to the velocity; reactance is the imaginary part and resistance is the real part.) Such excess reactance, if it cannot be balanced by a canceling reactance of the opposite sign, takes away from the force available to generate electricity. Depending on its size and shape, the lowest natural resonance frequency of a PZT structure can be quite high, above several kilohertz—potentially much higher than the operating frequency of the engines. Below its resonance, the PZT is being used in a frequency region where its stiffness controls its overall impedance. The higher the operating frequency can be raised toward the resonance frequency, the lower the stiffness reactance $1(j\omega C_M)$ becomes, where j is the square root of −1, ω is the angular frequency, and $C_M$ is the mechanical compliance of the PZT structure. By way of contrast, electrodynamic transducers generally have a relatively low resonance frequency, in the few tens of hertz. An electrodynamic transducer is typically used above its resonance frequency where it is mass controlled. The higher the operating frequency the larger and more troublesome the mass impedance jωM gets, where M is the moving mass. Therefore, piezoelectric transducers are favored at high frequencies and electrodynamic transducers are favored at low. For this reason high frequency sonar and ultrasonic transducers tend to be piezoelectric, while low frequency sonar and audio transducers tend to be electrodynamic. For thermoacoustic applications, the crossover between the two types of transducers appears to be near 300 Hz.

An important advantage in generating electricity piezoelectrically is that the mechanical impedance of the piezoelectric material, because it is controlled by its stiffness rather than its mass, allows the operating frequency of the generator to be increased resulting in an alternator that is smaller in size and lighter in weight than a corresponding electrodynamic system operating at a lower frequency. The available output power from a mass of PZT goes up proportionally with the operating frequency (because the maximum energy that can be extracted per cycle is independent of frequency and there are more cycles per second at higher frequencies). In both alternator embodiments, the part of the alternator that performs the energy conversion function and is the most massive, the PZT ceramic, is configured to have little motion. The moving mass is minimized by bringing mechanical power to the PZT through a relatively light coupling, such as the spokes of the first embodiment or the vertices of the bimorph wedges of the second embodiment, while allowing most of the PZT to stay relatively motionless. Providing for enough axial motion of the hub, which would be a difficult challenge at low frequencies using piezoelectric techniques, is easier at high operating frequencies where the acoustic displacements are smaller. With an electrodynamic transducer the moving coil or magnet is also part of the transduction process and so needs to be relatively massive to achieve high output powers. It is relatively easy to construct an electrodynamic transducer to have enough stroke to operate at a low frequency, but its large moving mass makes operation at high frequencies difficult.

A second advantage in pushing toward higher operating frequencies is that the length, and thus the volume, of a thermoacoustic engine goes down proportionally with the acoustic wavelength, which scales inversely with the frequency, with little penalty in output power. Engine weight and size is therefore also reduced. The ability to increase operating frequency of the engines appears to be limited by the performance of heat exchangers at these shorter lengths, by the increase in parasitic thermal conduction as the hot and cold portions of the engine come into closer proximity, and by the moving mass of the alternator/transducer.

In addition to making possible smaller alternator and engine sizes and weights, another advantage of piezoelectric alternators over electrodynamic alternators is that the PZT alternator should be highly efficient, above 95 percent efficiency—a modest improvement over the 80-85 percent efficiency of a comparable electrodynamic alternator.

Advantages of the ring transducer over the bimorph transducer are: there are fewer parts; the frequency of excitation of the PZT is twice that of the sound allowing for the use of half as much PZT; the PZT can be used in the 3-3 mode allowing greater output power; the PZT is never in tension where it is mechanically weak allowing greater output power; the voltage induced during compression of the PZT is of the same sign as the original poling voltage and thus does not have a tendency to de-pole the ceramic which also allows greater output power; and it is difficult to overdrive the transducer because the mechanical advantage in the conversion of axial hub force to radial spoke force decreases at higher amplitudes. Advantages that the two transducer types share are: they present a mass acoustic impedance which allows the resonator to be made much shorter; they have negligible internal thermal acoustic losses on their internal surfaces because there are no appreciable pressure swings inside the transducer; there are negligible internal viscous shear losses because no fluid is made to pass through any structures; and they have a small volume because they do not use a "back-volume" common to many other transducer types.

Since there are no sliding seals or lubrication in either embodiment of the thermoacoustic generator, there does not appear to be anything to wear out or require maintenance, as long as all parts are designed for infinite fatigue life. Depending on the application, however, in a complete system it may be necessary to include a small water pump and/or fan for the ambient cooling loop, which may require some minimal maintenance. Furthermore, the generator is environmentally friendly because the working fluid is a benign gas such as helium, helium-argon mixtures, helium-xenon mixtures, or air—no environmentally harmful substances are used.

Figure 23:
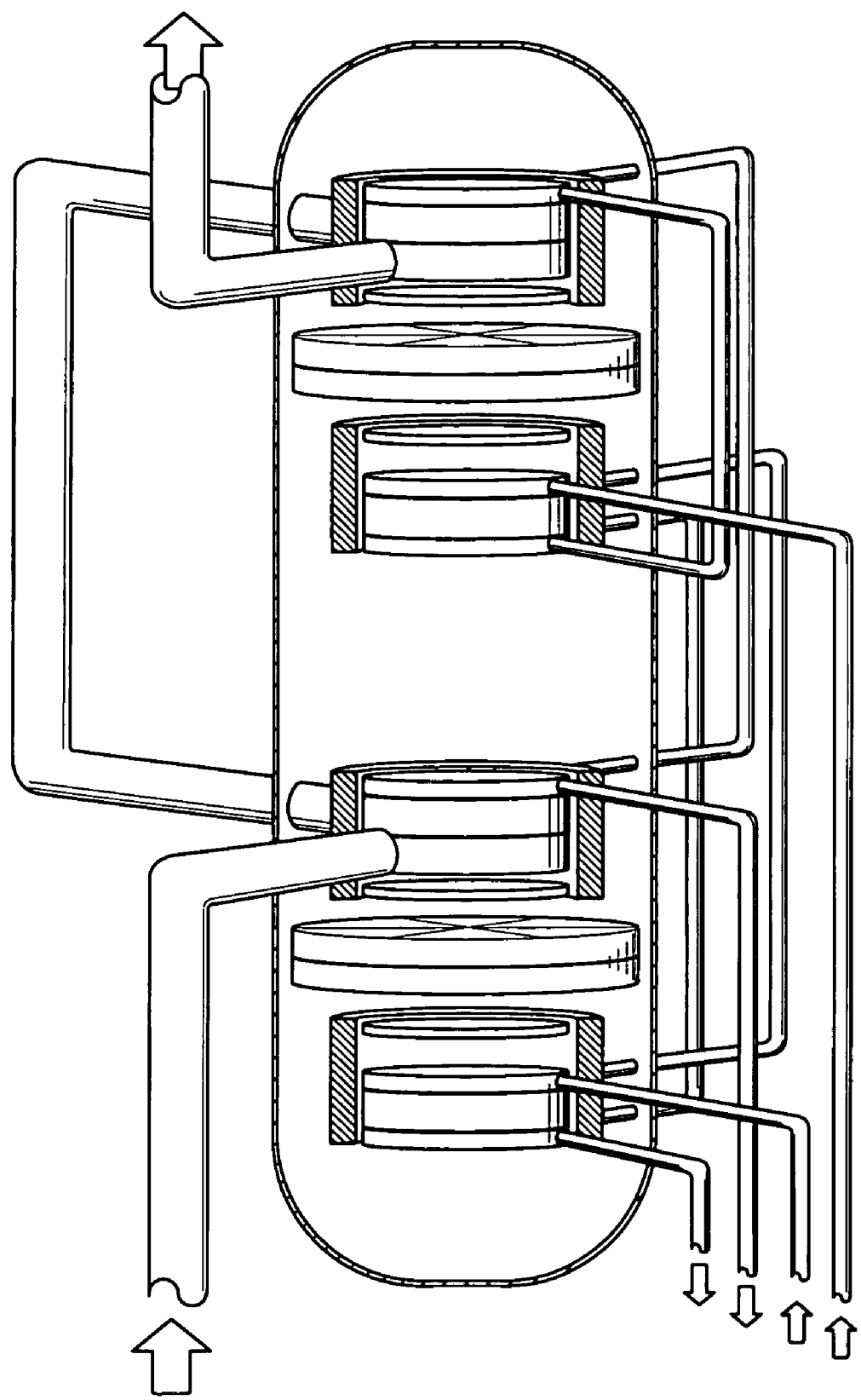
FIG. 23 shows a partially cutaway side view of a thermoacoustic/piezoelectric generator that also functions as a chiller.

Thermoacoustic engines can use a wide variety of heat sources and temperatures, and are adaptable to many applications. For example, in a device with multiple thermoacoustic stages, as was illustrated in FIG. 1, it is quite straightforward to convert some of those stages from engines into chillers or refrigerators, making a power generator that also delivers chilled water. Referring to FIG. 1, with the vertical orientation shown in the figure, it is preferred that engines 26 and 30 be converted into refrigerators while engines 24 and 28 remain heat driven engines so that gas in the thermal buffer tubes of all the engines and refrigerators are gravitationally stable, with either hot heat exchangers on the top or cold heat exchangers on the bottom of the thermal buffer tubes. Such an arrangement is illustrated in FIG. 23.

The coaxial implementation of the thermoacoustic-Stirling engine shown herein is very compact, which results in weight and volume savings and, we believe, leads to lower acoustic losses than the original Los Alamos engine. The heat exchanger pressure vessel penetrations and the arrangement of the engine components suspended within the pressure vessel are chosen to minimize the adverse thermal expansion stresses associated with the hot heat exchanger temperature. By having the hot penetrations on one side of the nacelle and the cold penetration on the other side, as can be seen in FIGS. 4A and 4B, thermal expansion stresses are relieved by allowing the nacelle to tip slightly as the hot components slightly expand. Furthermore, because the nacelle is not part of the pressure vessel, it can be a thin wall hollow structure, which minimizes losses due to thermal conduction, both along the nacelle between the hot and cold heat exchangers, or through the nacelle between the hot heat exchanger and the gas in the annular passage outside the nacelle.

Example 3

Ring Alternator with Spokes and Azimuthal Springs

Figure 5:
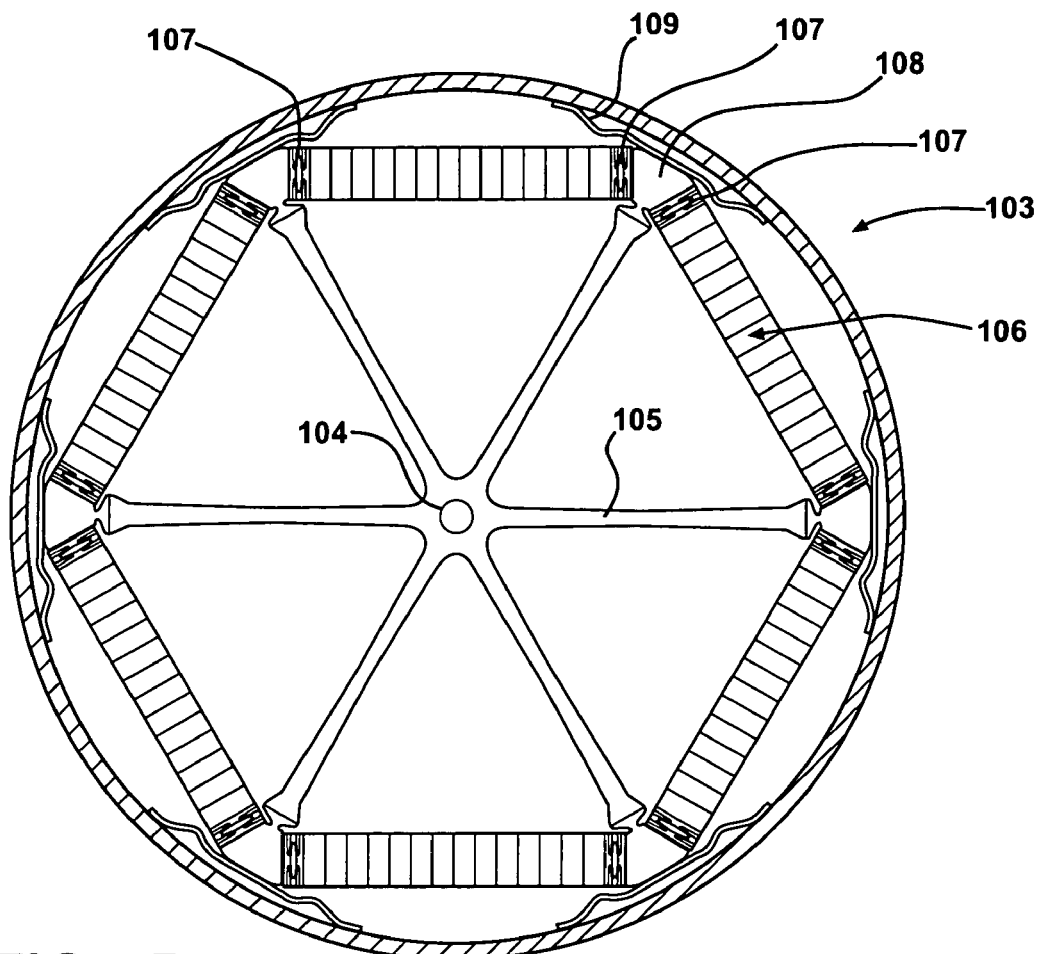
FIG. 5 shows a cross-sectional view of an alternative embodiment of a quadratically driven piezoelectric ring transducer/alternator including azimuthal springs for lowering the ring resonant frequency.

Azimuthal springs may be added to the embodiment of the alternator in FIGS. 2A and 2B, as shown in FIG. 5, to lower the ring resonant frequency in the generator to twice the acoustic frequency. This embodiment shares with the embodiment of FIGS. 2A and 2B two force amplifying mechanisms for matching the mechanical impedance of the transducer to that of the engine: the conversion of axial force on the hub 104 into radial tension on the spokes 105, and the conversion of tension in the spokes to compression of the ring 106.

The alternator 103 of FIG. 5 may be used in place of the alternator of FIGS. 2A and 2B. As with the alternator of FIGS. 2A and 2B, the alternator 103 includes a ring 106 of piezoelectric material that forms a perimeter member. The ring includes stacks of piezoelectric material extending between supports 108. Azimuthal springs 107 are placed between the stack of piezoelectric material and each support 108. This places the springs in series with the piezoelectric material. The supports 108 are in turn interconnected with the wall of the pressure vessel by spring supports 109. The hub 104 is interconnected with supports 108 by spokes 105. As with the embodiment of FIGS. 2A and 2B, there are preferably several layers of spokes that are generally parallel to each other. The hub 104 is interconnected with an alternator face or diaphragm, as was described with respect to FIG. 2B.

The azimuthal springs 107 distributed within the piezoelectric ring 106 constitute an additional mechanism of force amplification. The alternating component of the input force to the ring is much reduced when the ring is driven at resonance. The natural frequency of a 5" diameter PZT ring without springs is about 8 kHz. In a rigid ring without springs, as in the embodiment of FIGS. 2A and 2B, most of the force applied to the ring works against the stiffness of the ring when driving the ring below its resonance frequency. The addition of the springs 107, as well as the possible addition of mass to the supports 108, can be used to lower the resonant frequency of the ring to twice the operating frequency, which in the calculations performed so far has been taken to be 800 Hz for the radial motion of the ring and 400 Hz for the sound.

Resonating the ring leads to several advantages: First, the alternating membrane tensile forces in the spokes are greatly reduced—by approximately a factor of 50, determined by the range of tuning mismatch between the engine and the ring as a function of operating temperatures—although the mean component of the membrane tensile force remains the same. The peak force in the spokes, therefore, is reduced by approximately a factor of two. With the reduction in the peak spoke force, the spokes and diaphragm can be made about a factor of two lighter, allowing a higher operating frequency. Secondly, the spoke tension is nearly constant which diminishes mechanical fatigue, especially away from the spoke ends. Third, a constraint of a "best sized" alternator of 20 kW that is present without the springs and described below in Example 4 is removed so that alternators of smaller power are made possible.

Example 4

Summary of Piezoelectric Ring Alternator Calculations

In order to teach one skilled in the art how to construct a piezoelectric ring alternator without undue experimentation, an electromechanical equivalent circuit for the quadratically driven piezoelectric ring alternator with spokes will be developed here. It is a conventional linear model that uses some linear and nonlinear properties of a so-called "hard" PZT piezoelectric ceramic (Navy type III) as parameters, as an illustrative piezoelectric material. The model will be used to estimate the load resistance that maximizes the alternator efficiency and that maximizes the output power. To further teach the use of the ring alternator configuration, an example design calculation will be illustrated here. The analysis will show that the alternator efficiency should be about 98 percent and the output power density should approach 20 W/cm$^3$ of PZT (at 400 Hz) with an appropriate choice of load resistance. The model includes azimuthal springs between the PZT stack and its support, but also holds when azimuthal springs are absent. The best natural size of the generator when azimuthal springs are not used will also be illustrated.

Figure 6A:
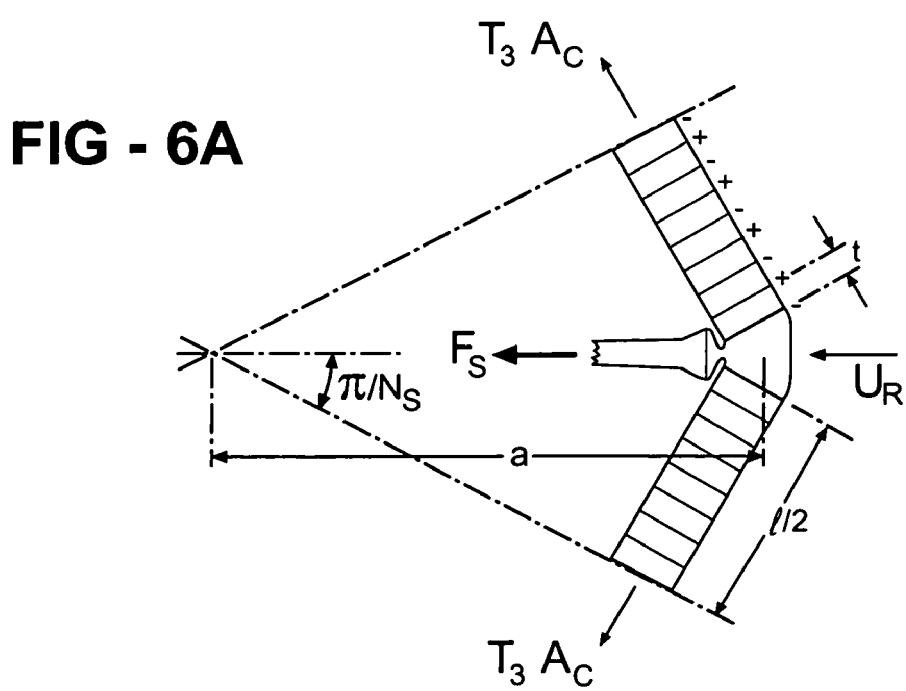
FIG. 6A shows a slice of the ring alternator of FIG. 2A for application of Newton's second law.
Figure 6B:
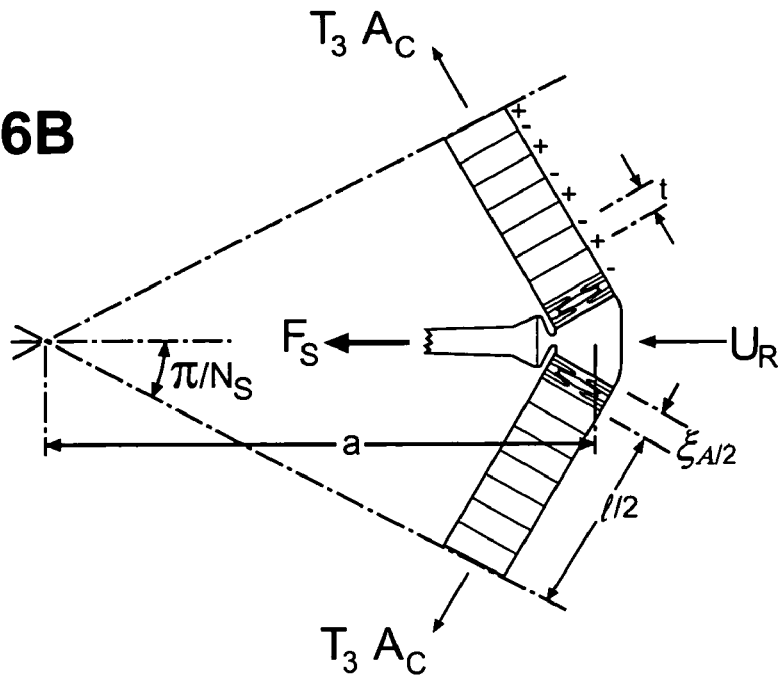
FIG. 6B shows a slice of the ring alternator of FIG. 5 for application of Newton's second law.

Consider an $N_S$ sided polygonal ring alternator of $N_S$ stacks of PZT and $N_S$ sets of spokes. One of $N_S$ equivalent slices of the alternator without azimuthal springs, centered on one set of spokes, is shown in FIG. 6A. FIG. 6B shows an equivalent slice of the alternator with azimuthal springs. The same force and dimension labels are used in each. Each stack of PZT has length l, cross sectional area $A_C$, and is made up of n layers of PZT each t thick, such that l=nt. The spoke length taken from the center of the alternator to the centerline of the PZT stacks is a. Half the angle subtended by two sets of spokes is $\pi/N_S$ (radians). Although the supports and springs should ideally take little space, a $\sin(\pi/N_S)$ is not assumed to be equal to l/2 to account for the room taken up by them. The radial velocity of the supports is $u_R$, and the force of one set of spokes on its support is $F_S$, both taken as positive inward. The azimuthal springs have a combined compliance $C_A$ per segment along their axis, in the direction of the line connecting the support and the PZT stack (the two springs shown in FIG. 6B each have compliance $C_A/2$). The azimuthal springs are assumed to be infinitely stiff in the transverse direction so that the PZT stack is constrained to move in the left-right direction of FIG. 6B with the same velocity $u_R$ as the supports.

PZT is conventionally described by a coordinate system where the 3 direction is the poled direction. (In its manufacture, metal electrodes are fired onto two surfaces of PZT. A high voltage applied across the electrodes while at high temperature polarizes the ceramic in the 3 direction, perpendicular to the electrode surfaces, making the ceramic piezoelectric.) The other two directions perpendicular to 3 have equivalent properties and are called 1 and 2. PZT elements are stacked together in the alternator, electrodes touching, with the 3 direction of each element alternating in direction. Every other electrode is wired together. The PZT elements are mechanically in series but are all electrically in parallel.

The direction of the components of stress T, strain S, electric field E, and electric displacement D in the PZT elements are denoted with subscripts. The elements of the stack are mechanically free on their sides, so $T_1=T_2=0$. By symmetry, $E_1=E_2=0$ and $D_1=D_2=0$. The transverse strains $S_1$ and $S_2$ are nonzero but are not interesting. This simplifies the relations between the remaining PZT element variables:

$$S_3 = s_{33}^E T_3 + d_{33} E_3, \quad (1)$$

$$D_3 = d_{33} T_3 + \in_{33}^T E_3, \quad (2)$$

where anisotropic material properties of the PZT are given by these parameters: $s_{33}^E$ is a component of the compliance matrix at constant electric field (signified by the superscript E), $\Delta_{33}^T$ is a component of the dielectric constant matrix at constant stress (signified by the superscript T), and $d_{33}$ is a piezoelectric coupling constant. Five additional relations are needed to connect the piezoelectric elements to the macroscopic inputs and outputs of the alternator. The extension $\Delta\xi_A$ of the spring is related to the force applied to it by $$T_3 A_C = \Delta\xi_A^- C_A. \quad (3)$$

The combined extension of the spring and PZT stack are related to the radial support motion by $$(\Delta\xi_A + S_3 l)/2 = -u_R \sin(\pi/N_S)/(j\omega), \quad (4)$$

where j is the square root of −1 and ω is the angular frequency $2\pi f$ of the ring motion (at twice the acoustic frequency). Newton's second law applied in the radial direction to the alternator slice shown in FIG. 6B is $$F_S + 2A_C T_3 \sin(\pi/N_S) = j\omega(\rho_{PZT} A_C l + m) u_R, \quad (5)$$

where $\rho_{PZT}$ is the PZT density and m is the mass of the support and its two attached springs. The output current I (taken as positive inward) and voltage V of the alternator are related to piezoelectric variables by $$I = j\omega n N_S A_C D_3, \quad (6)$$

$$V = t E_3. \quad (7)$$

The seven equations (1)-(7) are the starting point of the model of, so far, nine variables $T_3$, $S_3$, $E_3$, $D_3$, $\Delta\xi_A$, $F_S$, $u_R$, I, and V. An additional relation can be made to specify the electrical load; for example, a simple load resistor $R_L$ $$I = -V/R_L \quad (8)$$

Substituting (1) for $T_3$ in (5), using (3), (4) and (7) to eliminate $S_3$ and $E_3$, multiplying through by $N_S$, and defining $F_R = N_S F_S$ as an arithmetic (not vector) sum of the radial spoke forces $F_S$, gives an impedance form of Newton's law:

$$[j\omega M + 1/(j\omega C_M(1+K))] u_R + NV/(1+K) - F_R = 0, \quad (9)$$

where the ring mass is given by $$M = (\rho_{PZT} A_C l + m) N_S, \qquad (10)$$

the ring compliance is given by $$C_M = \frac{a s_{33}^E}{2\pi A_C} \frac{1}{(N_S/\pi)\sin(\pi/N_S)} \frac{l}{2a\sin(\pi/N_S)}, \qquad (11)$$

the piezoelectric transduction process is described by the coefficient N $$N = \frac{n N_S A_C d_{33}}{a s_{33}^E} \frac{2a\sin(\pi/N_S)}{l}, \qquad (12)$$

and a factor, 1+K, appears because of the presence of the azimuthal springs, where K is the ratio of the spring compliance to PZT compliance $$K = C_A A_C / l s_{33}^E. \qquad (13)$$

If azimuthal springs are not present, K should be set equal to zero. The last factors in (11) and (12) are nearly unity. They are a small correction for the finite size of the support and springs. The next to the last factor in (11) is also nearly unity. It is a correction to the round ring result for a polygon of a finite number of segments $N_S$.

The mechanical resonance frequency of the ring is found by setting the mechanical impedance $j\omega M + 1/[\omega C_M(1+K)]$ of (9) equal to zero:

$$\omega_0^2 = 1/[MC_M(1+K)]. \qquad (14)$$

The forces in the spokes will be minimized at this frequency. The naturally high resonance frequency of a PZT ring can be brought down to twice the acoustic frequency by increasing K and/or M.

Kirchhoff's law for the electrical side of the alternator comes from substituting (2) into (6), using (1), (3), (4) and (7) to eliminate $T_3$, $S_3$, $E_3$, and $\Delta\xi_A$, and using (8) to eliminate I:

$$-N u_R/(1+K) + (j\omega C_0 + 1/R_L)V, \qquad (15)$$

where the blocked ($u_R = 0$) output capacitance $C_0$ of the alternator is given by $$C_0 = [1 - k_{33}^2/(1+K)] n N_S A_C \epsilon_{33}^T / t, \qquad (16)$$

and the electromechanical coupling constant $k_{33}$ is given by $k_{33}^2 = d_{33}^2 / s_{33}^E \epsilon_{33}^T$.

Figure 7A:
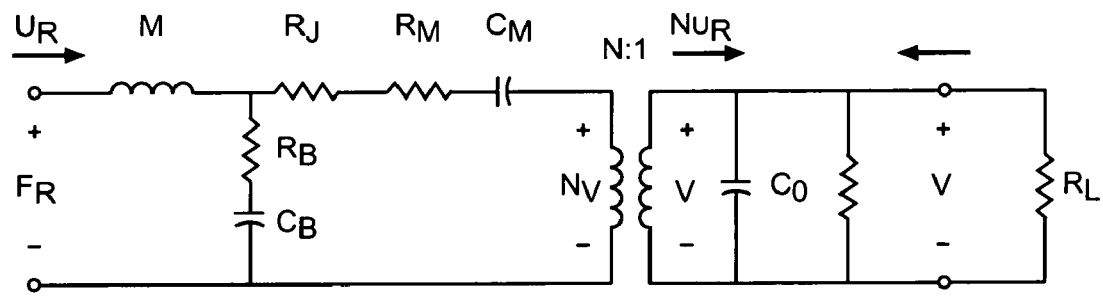
FIG. 7A shows an equivalent circuit for the ring alternator of FIG. 5.

Newton and Kirchhoff's laws, (9) and (15), can be represented by the equivalent circuit shown in FIG. 7A, which obeys the same mathematics as Eqs. (1)-(16). An ideal transformer with turns ratio N, which has units of N/V, represents the electromechanical transduction terms in (9) and (15). The compliance of all the azimuthal springs is represented by a shunting capacitor $C_B = K C_M$. Following common practice, the resistors $R_M$ and $R_0$ are added to represent mechanical and electrical dissipation within the PZT. The manufacturer of the PZT specifies a mechanical $Q_M$ from which to derive the mechanical loss resistance $R_M$, $$R_M = 1/\omega C_M Q_M, \qquad (17)$$

and a dielectric loss tangent tan($\delta$) which is used to calculate $R_0$, $$R_0 = 1/\omega C'_0 \tan(\delta) = t/\omega n N_S A_C \epsilon_{33}^T \tan(\delta) \qquad (18)$$

where $C'_0$ is $C_0$ without the so-called "motional" factor $[1-k_{33}^2/(1+K)]$. Resistors $R_J$ and $R_B$ are included to represent mechanical losses outside the PZT, in such places as adhesive attachments of the PZT or in the azimuthal springs, respectively, but for now both are assumed to be zero. Their true value should be determined experimentally.

Figure 7B:
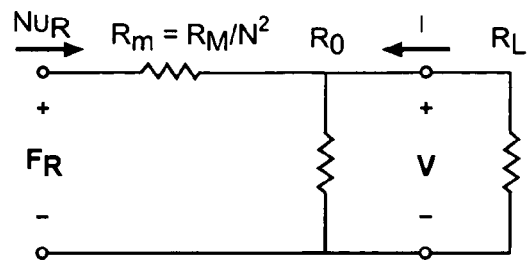
FIG. 7B shows a reduced equivalent circuit for the ring alternator of FIG. 5 when reactive elements may be ignored.

Maximizing the efficiency of the generator requires the minimization or cancellation of the total reactance of the alternator. For example, a power factor inductor may be added across the alternator output to cancel the current through $C_0$. Part of the design task for the generator as a whole is to balance the stiffness reactances (which store potential energy) of $C_M$ and $C_B$, the spoke stiffness and the gas stiffness of the thermoacoustic engines with the inertial reactances (which store kinetic energy) of the ring, hub, diaphragm and the spoke masses. Assuming all these reactances balance out, and $R_J$ and $R_B$ are indeed small enough that they can be neglected, the equivalent circuit can be reduced down to the circuit of FIG. 7B. The useful output power is $\Pi_o = |V|^2/2R_L$, where $|V|$ is the output voltage peak amplitude. The input power is $\Pi_i = |V_i|^2/2R_1$, where the input resistance $R_i$ is the series-parallel combination $R_i = R_m + (1/R_L + 1/R_0)^{-1}$, and $R_m = R_M/N^2$ and $|V_i| \leq F_R/N$ are the mechanical resistance and input force reflected over to the electrical side of the transformer. The efficiency e is $\Pi_O/\Pi_i$, which after some manipulation is to good approximation $$e = R_L R_0 / [(R_L + R_m)(R_L + R_0)] \qquad (19)$$

For an alternator to have a reasonable efficiency, $R_m$ will have a small value because it is a series element and $R_0$ will have a large value because it is a parallel element. Combining (11), (12), (17) and (18) with the definition of $R_m$ gives for the ratio, which should be large, $$R_0/R_m = k_{33}^2 Q_M / \tan(\delta). \qquad (20)$$

Figure 8:
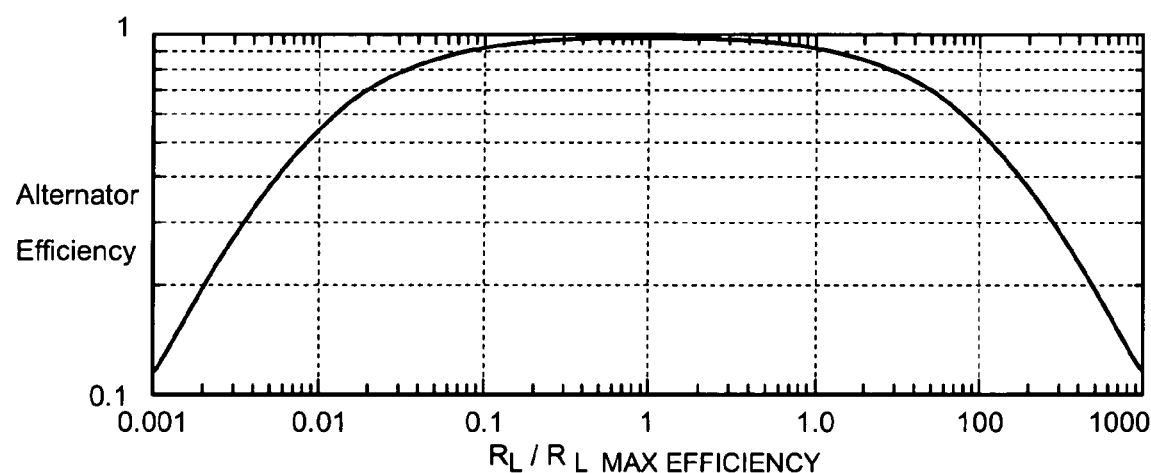
FIG. 8 shows a graph plotting ring alternator efficiency vs. $R_L/R_{L\ MAX\ EFFICIENCY}$.

Notice that this expression depends only on the material properties of the PZT rather than on any other design choices. Of the common commercially available versions of PZT, Navy type III, also known as PZT-8, is very likely the best choice for this alternator because of its high $Q_M$ and low tan($\delta$), even at high amplitudes. It was developed for high power sonar projectors. Typical values for PZT-8 from one manufacturer are $k_{33}^2 = 0.44$, $Q_M = 1050$ and tan($\delta$)=0.004 at low amplitudes. At high amplitude ($E_3 = 4$ kV/cm rms), tan($\delta$) degrades to 0.01 and $Q_M$ drops to around 350. For these degraded high amplitude values $R_0/R_m$ is still high at 15,000. The efficiency given by (19) is plotted in FIG. 8 for PZT-8 at high amplitude on a log-log plot. The efficiency is greater than 90 percent over a two order of magnitude range of $R_L$. Because $R_0/R_m$ is so high there is a comfortably broad range of $R_L$ that will give high efficiency. The curve is symmetric about the geometric mean of $R_m$ and $R_0$. The highest efficiency therefore occurs with $$R_{L\,MAX\,EFFICIENCY} = (R_0 R_m)^{1/2} = (R_0 R_M)^{1/2}/N. \qquad (21)$$

The value of efficiency e for this value of $R_L$ is 98.4 percent. A piezoelectric alternator can potentially have such a high efficiency because with PZT-8 $Q_M$ is very high and tan($\delta$) is very low, as long as other mechanical loss mechanisms represented by $R_J$ and $R_B$ in the equivalent circuit are kept small.

The load resistance can also be chosen to maximize output power rather than efficiency. The PZT has a maximum electric field $E_{3\,MAX}$ and a maximum stress $T_{3\,MAX}$ that it can tolerate without damage. Using these values for $E_3$ and $T_3$ in $R_L = -V/I$, (2), (6) and (7), and assuming that the reactive currents are negligibly small, an approximate expression for the value of $R_L$ that maximizes the output power is $$R_{L\,MAX\,POWER} = E_{3\,MAX} t / T_{3\,MAX} \omega n N_S A_C d_{33}. \qquad (22)$$

As it fortuitously turns out, these two optimized values for $R_L$ are nearly the same as can be seen by taking their ratio:

$$\frac{R_{L\ MAX\ POWER}}{R_{L\ MAX\ EFFICIENCY}} = \left(\frac{E_{3\ MAX}^2\ \epsilon_{33}^T \tan(\delta)}{T_{3\ MAX}^2\ s_{33}^E/Q_M}\right)^{1/2}, \quad (23)$$

which has the value of 0.87 for PZT-8. Like (18), this expression is independent of design decisions; it depends only on material properties. It should therefore be quite straightforward to simultaneously have high efficiency and high power from the alternator.

The maximum power that can be taken from the alternator per unit volume of PZT, $\pi_{MAX}$, is given by $(E_{3\ MAX} t)^2/(2\ R_{L\ MAX\ POWER}\ N_S\ 1\ A_C)$ which reduces to a maximum power density in the PZT of $$\pi_{MAX} = \omega d_{33} E_{3\ MAX} T_{3\ MAX}/2. \quad (24)$$

For PZT-8 limiting values for $E_{3\ MAX}$ and $T_{3\ MAX}$ are 8 kV/cm and 7000 PSI, respectively, when no mechanical or electrical bias is present, i.e. when the electric field and mechanical stress swings equally in the positive and negative directions. This condition leads to a power density of 23 W/cm³ for an example acoustic frequency of 400 Hz and ring motion frequency of 800 Hz. The negative swings of the electric field and peak mechanical stress in tension are what limit this power density. The ceramic is weak in tension, and both negative voltages and tensile stresses tend to de-pole the ceramic. The quadratically driven ring alternator (with spokes) has the advantage, however, that the PZT is always placed in compression and the voltages induced are positive—in the same direction as the original poling voltage. Thus it may be possible to drive the PZT to higher levels. A survey of the literature suggests that $E_{3\ MAX}$ and $T_{3\ MAX}$ may be pushed to as high as 15 kV/cm and 12,000 PSI, respectively, when both are only applied in their advantageous directions. If this is so, then $\pi_{MAX}$ may be as high as 75 W/cm³, which is very high. With the more conservative 23 W/cm³ power density, the thermal power to be dissipated would be 0.37 W/cm³ at 98.4 percent efficiency, but at 75 W/cm³ the thermal dissipation would grow to 1.2 W/cm³. At some point the PZT could be thermally limited. The tolerance of higher PZT power densities should provide a safety factor for short mechanical overloads, however.

Azimuthal springs give some flexibility in the design by allowing adjustment of the overall radial motion $u_R$ of the ring, which in turn allows adjustment of the hub motion to best match the acoustic motion delivered by the engine for a given diameter of the ring. If a choice has been made not to use azimuthal springs, however, then there is a best natural diameter and power for the generator because of the need to match the alternators to the engines. The acoustic volume displacement determines the necessary volume swept out by the faces of the alternator, which in turn is related to the PZT strain through the spoke geometry. The alternators and engines are then matched by adjusting the amount of PZT in the alternators so that the maximum amount of power absorbed by the alternators and converted into electricity is the same as the maximum power produced by the engines. An example calculation of matching an alternator without azimuthal springs to a thermoacoustic engine is shown next.

We will require that the alternators and the engines fit in a pressure vessel with the same internal radius R for simplicity of the vessel. The output power of the engines will be scaled with $R^2$ to keep the acoustic power density, gas velocity $u_A$ and pressure amplitude at the alternator fixed at the values 7.18 W/cm², 18.2 m/s and 88.6 kPa, respectively, of a thermoacoustic-Stirling engine numerical model for the design of FIG. 1. For an effective moving area of the diaphragm assumed to be 80 percent of $\pi R^2$, the peak displacement of the diaphragm $\zeta$ is then given by $\zeta = u_A/(0.80)\ \omega_A = 9.0$ mm, where $\omega_A$ is the angular frequency of the sound (=2π400 Hz). The spokes bend in a complicated manor, but for simplicity they will be assumed to have their flexing confined to a short region near their ends (pivoting like a hinge) and an effective length $h = K_h\ a$, where $K_h$, will be taken to be 0.90. A fatigue analysis estimates that the safe peak tensile stress $T_S$ in spring steel spokes is 30 kPSI. The spokes will have strain $S_s = T_S/Y_S = 30$ kPSI/30 MPSI=0.001 while under tension, where $Y_S$ is Young's modulus of the spokes. The maximum PZT strain $S_3$ is approximately $T_3\ s_{33}^E = 6.8 \times 10^{-4}$. Using the Pythagorean theorem, the inward radial motion $S_3 a$ of the PZT supports can be related to $\zeta$ by $S_3 a = h - h\ [(1+S_s)^2 - (\zeta/h)^2]^{-1/2}$. Solving for a gives the alternator radius best matched to the engines:

$$a_{BEST} = \zeta[2K_h(S_3 + K_h S_S)]^{-1/2} = 16.9 \text{ cm}, \quad (25)$$

after plugging in values. In order to leave room for the PZT and support springs, the pressure vessel diameter should be $2R \cong 2a/0.80 = 42.3$ cm=16.6". This then leads to the power from each thermoacoustic-Stirling engine $\Pi_A = \pi_A \pi R^2 = 10.0$ kW. As each engine is about 6" in length, a generator in the balanced configuration of FIG. 1, with four 10 kW engines and two 20 kW alternators, would generate 40 kW (54 horsepower) of electricity in a pressure vessel about 34" long and 17" in diameter.

The alternator design is pretty much determined at this point in the analysis. The number of sections $N_S$ can be picked for convenience to be 6, say. Also for convenience, select $a \cong l = nt = 16.0$ cm, $n = 16$ and $t = 1.0$ cm. With $\pi_{MAX} = 23$ W/cm³ and the requirement for 20 kW gives $A_C = 9.06$ cm², which if the PZT is chosen to be in the form of stacked round disks, would give the disks a diameter of 3.40 cm diameter. The total mass M of PZT needed for each alternator is only 7.55 kg. The alternator can be designed for maximum output power rather than efficiency since the efficiency peak is so broad. At full drive levels, with $\zeta = 9.0$ mm, the alternator output voltage is 5875 $V_{RMS}$, the output current is 3.40 $A_{RMS}$, the maximum PZT stress $T_3$ is 8200 PSI (a bit higher than the targeted 7000 PSI) and maximum field $E_3$ is 8.3 kV/cm (also, a little higher than 8.0 kV/cm). The alternator efficiency (acoustic to electrical) e is 98.2 percent, assuming no additional losses. If desired, n can be varied to trade output voltage for current, as if it controlled the turns ratio of an output transformer. Other variables of interest, derived from the equations above are:

| | |
|---|---|
| $R_L$ | 1726 Ω |
| $C_M$ | $4.15 \times 10^{-11}$ m/N |
| $R_M$ | 1370 Ns/m |
| N | 9.25 N/V |
| $C_0$ | 45.6 nF |
| $R_0$ | 246 kΩ |
| $R_1 = R_M/N^2$ | 16.0 Ω |
| $f_0 = \omega_0/2\pi$ | 2843 Hz |
| $|F_R|$ | 287 kN |
| $|u_R|$ | 0.563 m/s |
| phase angle by which $u_R$ leads $F_R$ | 75.4° |
| phase angle by which $u_R$ leads V | 21.6° |
| power dissipated in $R_M$, $|u_R|^2 R_M/2$ | 217 W |
| power dissipated in $R_0$, $V_{RMS}^2/R_0$ | 140 W |

The alternator efficiency of 98.2 percent (acoustic to electric power conversion) coupled with a projected engine thermal efficiency of 33 percent (thermal to acoustic conversion) gives a thermal to electrical conversion efficiency for the generator of 32 percent. The generator also appears to be potentially fairly compact and quite lightweight.

Azimuthal Spring Embodiment

Figure 16:
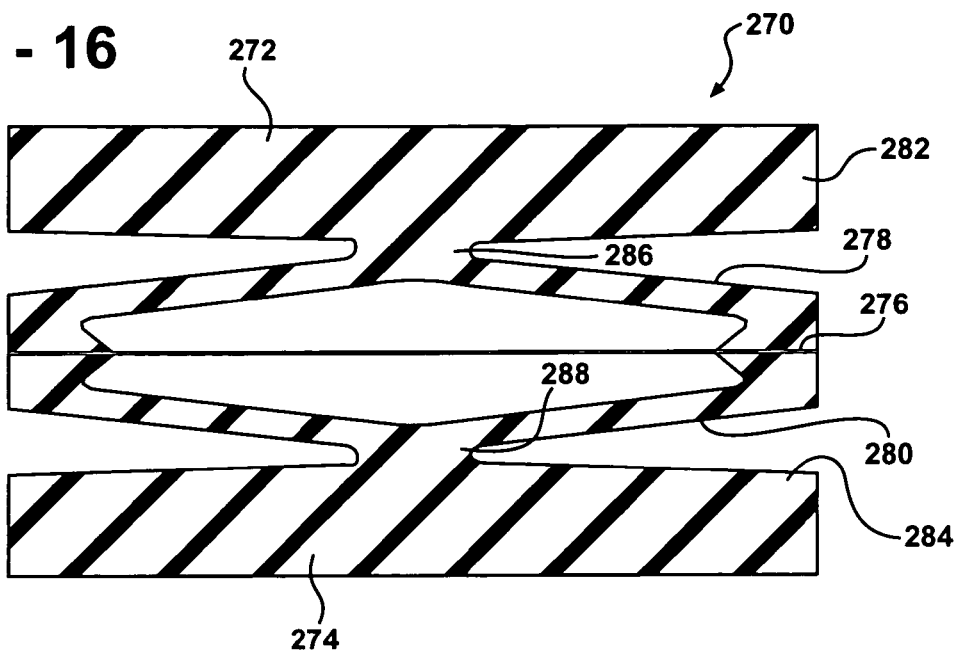
FIG. 16 shows a cross-sectional view of one of the azimuthal springs used in the alternator of FIG. 5.

The desired spring constant and range of motion of the azimuthal springs for use in the piezoelectric ring of FIG. 5 tends toward that of conical Bellville washers, although the springs must be designed in such a way that they do not suffer fretting wear or fretting fatigue at their points of contact with the supports or the piezoelectric material. A preferred embodiment of the azimuthal springs is shown in FIG. 16. The figure is a sectional diagram of a solid of rotation about the center line. The spring 270 consists of a first piece 272 and a second piece 274 that are attached at their contact by a means such as welding, brazing or soldering, as shown at 276. The main flexible energy-storage element is a pair of Belleville-like cone spring portions 278 and 280 which are part of the first and second pieces 272 and 274. The cones 278 and 280 attach to a base plate 282 and 284, respectively, on either end of the spring through a central pedestal 286 and 288, respectively. Fretting is avoided by use of the pedestal and the joining of the cones. As will be clear to those of skill in the art, other spring designs and approaches may be used in place of the bevel-like design disclosed herein.

As an alternative to the bevel-like cone springs, an elastomeric material may be used. For example, a simple block of low mechanical-lost elastomeric material may be positioned between each stack of piezoelectric material and the corresponding keystone-shaped support.

Example 5

Performance of the Bimorph Generator

High efficiency and low radiated noise appear to be key advantages of a thermoacoustic-Stirling piezoelectric generator. Other advantages over other technologies seem to be a smaller size and weight. For the design of FIGS. 4A and 4B, similar to the calculation above, the generator core efficiency (heat into the hot exchanger to electricity out) has been estimated to be 32 percent. This is the product of a 34 percent engine efficiency (heat to sound) and a 95 percent alternator efficiency (sound to electricity). The engine efficiency is 51 percent of the ideal Carnot efficiency. The total mass of the core components shown in FIGS. 4A and 4B is 12.8 kg (28 lb) (13.5 kg with a noise proofing shell), most of which (9.7 kg) is in the PZT alternator. The volume is 7.8 liters. With a 2.0 kW output this gives specific output powers of 260 kW/m$^3$ and 156 W/kg for the thermoacoustic generator core.

This core efficiency of 32 percent might be the appropriate system efficiency when the generator is embedded within a large system. For example, for power generation on a naval ship, heat could come from gas turbine waste heat, while the heat rejected from the cold exchangers could be taken away by a ship cooling loop, and the output power could be used directly or used after it was rectified to DC power. However, in other applications additional parts may be needed, which would degrade these numbers. For example, a stand-alone mobile power generator would require a burner. To maintain a high system efficiency the combustion air should be preheated with the exhaust from the hot heat exchanger through a recuperator. Not all of the heat of combustion will be able to be captured in this way, however, so there will be a burner efficiency (heat value of fuel to heat into the hot exchanger) that is less than one. An estimate might put this at 85 percent, bringing the system efficiency down to 27 percent. The burner and recuperator also add to the mass and volume of the system. For the same mobile application, a means of rejecting the heat from the cold heat exchangers must also be provided. In some cases this may be done passively with heat pipes and natural convection cooling. However, it may be necessary to use a conventional cooling loop consisting of a water/glycol mixture, plumbing, a pump, an external heat exchanger and a fan. Allowing 100 W for the pump and fan brings the system efficiency down from 27 percent to 26 percent. Finally, the high frequency output of the PZT should, in most cases, be rectified to DC and then converted into 120/240V 60 Hz, as needed, with a power inverter, which may have an efficiency (high frequency power in to 60 Hz power out) of 95 percent, bringing the overall system efficiency down to 25 percent. A fuel tank and overall enclosure or frame would be needed as well, which, with the other auxiliary parts, degrades the specific power density numbers.

Nevertheless, if we allow for an additional 7.5 kg of mass and 19 liters of volume (which includes 11 liters for a 3.0 gallon fuel tank), and use this as an estimate for a design including all these auxiliary components to make the system self contained and mobile, a thermoacoustic generator still looks good compared to the best comparable generator from Yamaha Corporation, the model YG2800i, especially on efficiency and radiated noise level where our estimates are the most reliable:

|  | Thermoacoustic Generator Estimate | Yamaha YG2800i |
| --- | --- | --- |
| Output power | 2000 W | 2500 W |
| Weight | 21 kg | 30 kg |
| Volume | 27 liter | 81 liter |
| Power per weight | 95 W/kg | 84 W/kg |
| Power per volume | 74 kW/m$^3$ | 31 kW/m$^3$ |
| W-hr of electricity per gallon of gasoline | 8920 | 5375 |
| Efficiency (fuel energy to electricity) | 25% | 15% |
| Full power radiated noise level | 34 dBA | 67 dBA |
| Oil to change | no | yes |

Example 6

Other Embodiments

FIGS. 2-4 show a corrugated diaphragm as a means for sealing the alternator piston faces to the pressure vessel while allowing axial motion of the faces over a range of travel. Alternative means for doing the same are shown in FIGS. 9, 10 and 11. In each of the three figures, a cross-sectional view of an alternator, along with a portion of the pressure vessel is shown. Referring first to FIG. 9, the pressure vessel 110 surrounds the PZT ring 112, which is attached to the pressure vessel wall 110 by support springs 114. Spokes 116 interconnect the ring 112 with the hub 118. The alternator has a pair of alternator faces 120 and 122. In FIG. 9, the hub 118 and faces 120 and 122 are shown displaced to the left. Roll socks 124 and 126 interconnect and seal faces 120 and 122 to the pressure vessel wall 110. The roll socks are preferably in rings of a half turn of flexible material, to provide a flexible seal.

FIG. 10 shows another embodiment with a similar pressure vessel wall 128 surrounding a ring 130, with the ring interconnected with the wall by spring supports 132. Spokes 134 interconnect the ring 130 with the hub 136. Alternator faces 138 and 140 are connected to the hub 136. As with FIG. 9, the hub 136 and spokes 134 are shown displaced to the left. In this embodiment, bellows 142 and 144 connect the faces 138 and 140, respectively, to the pressure vessel wall 128. This is another approach to providing a flexible seal.

FIG. 11 shows another alternative version, using a clearance seal. A portion of the pressure vessel wall is shown at 146, the ring is shown at 148 and the support interconnecting the ring 148 with the wall 146 is shown at 150. The spokes 152 interconnect the ring 148 with the hub 154, and are shown deflected to the left. Alternator faces are shown at 156 and 158. The face 156 may be said to have a piston skirt 160 which fits closely into a precision cylinder or housing 162, so as to provide a very small gap 164. The gap 164 should be small enough that negligible gas is able to pass through the gap in response to motion of the faces, but not so small as to cause undue losses due to viscous shear of the gas in the gap. A similar clearance seal is provided for face 158.

Figure 12:
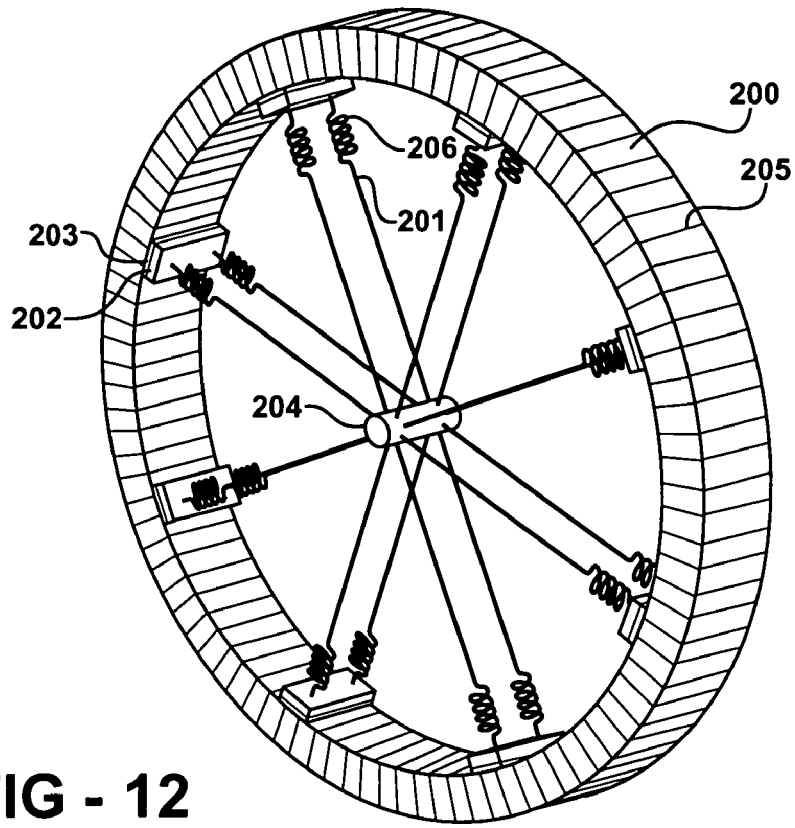
FIG. 12 shows an alternative embodiment of a piezoelectric ring transducer/alternator, wherein the piezoelectric ceramic is in the form of a striped cylinder.

FIG. 12 shows an alternative version of the ring transducers of FIGS. 2A, 2B and 5. In this embodiment, the piezoelectric ceramic 200 is in the form of a striped cylinder. It is a single piece of ceramic with striped electrodes 205 painted around its perimeter. Alternate electrodes are connected together to put the segments of the ring electrically in parallel. As an alternative to flat shim spokes, FIG. 12 shows wire spokes 201, made, for example, from high strength steel music wire. Also, as the above calculation for the ring alternator showed, there is a best diameter, and therefore a best output power, for the ring alternator that depends on the mechanical compliance of both the piezoelectric ring and the spokes. FIG. 12 shows a technique for constructing a lower power alternator that is matched to lower power engines: increasing the compliance of the spokes. In this case, each spoke is coiled into a spring 206 near the ends of the spoke. Placing the coiled part near the piezoelectric ring rather than near the hub 204 lowers the moving mass of the alternator, allowing a higher operating frequency. The spokes are attached, for example by brazing, to support bars 202. In one embodiment, the support bar 202 is separated from the piezoelectric ring 200 by an insulator 203. However, if the ring 200 is patterned with electrodes 205 such that electrodes on either side of the support bar 203 are at the same potential, and no other electrodes are patterned under the support bar, then the insulator 203 becomes unnecessary. The support bar, piezoelectric ceramic ring, and insulator (if used) may be joined with adhesive.

Figure 13:
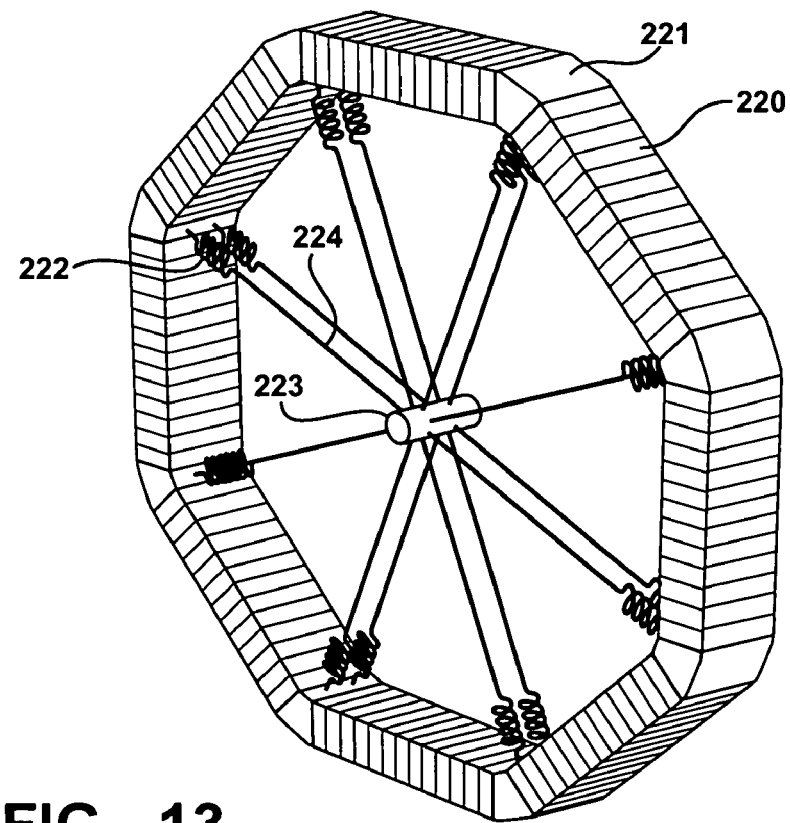
FIG. 13 shows an alternative version of the ring transducer of FIG. 12, having wire spokes with coils, attached to a keystone-like support, with a polygonal piezoelectric ceramic ring made up of straight stacks of ceramic elements.

The techniques of FIGS. 12, 2A, 2B and 5 may be combined in various combinations. FIG. 13, for example, shows wire spokes 224, with coils 222, attached to a keystone-like support 221, with a polygonal piezoelectric ceramic ring made up of straight stacks 220 of ceramic elements. As another alternative, azimuthal springs may be included in any embodiment herein.

Figure 14:
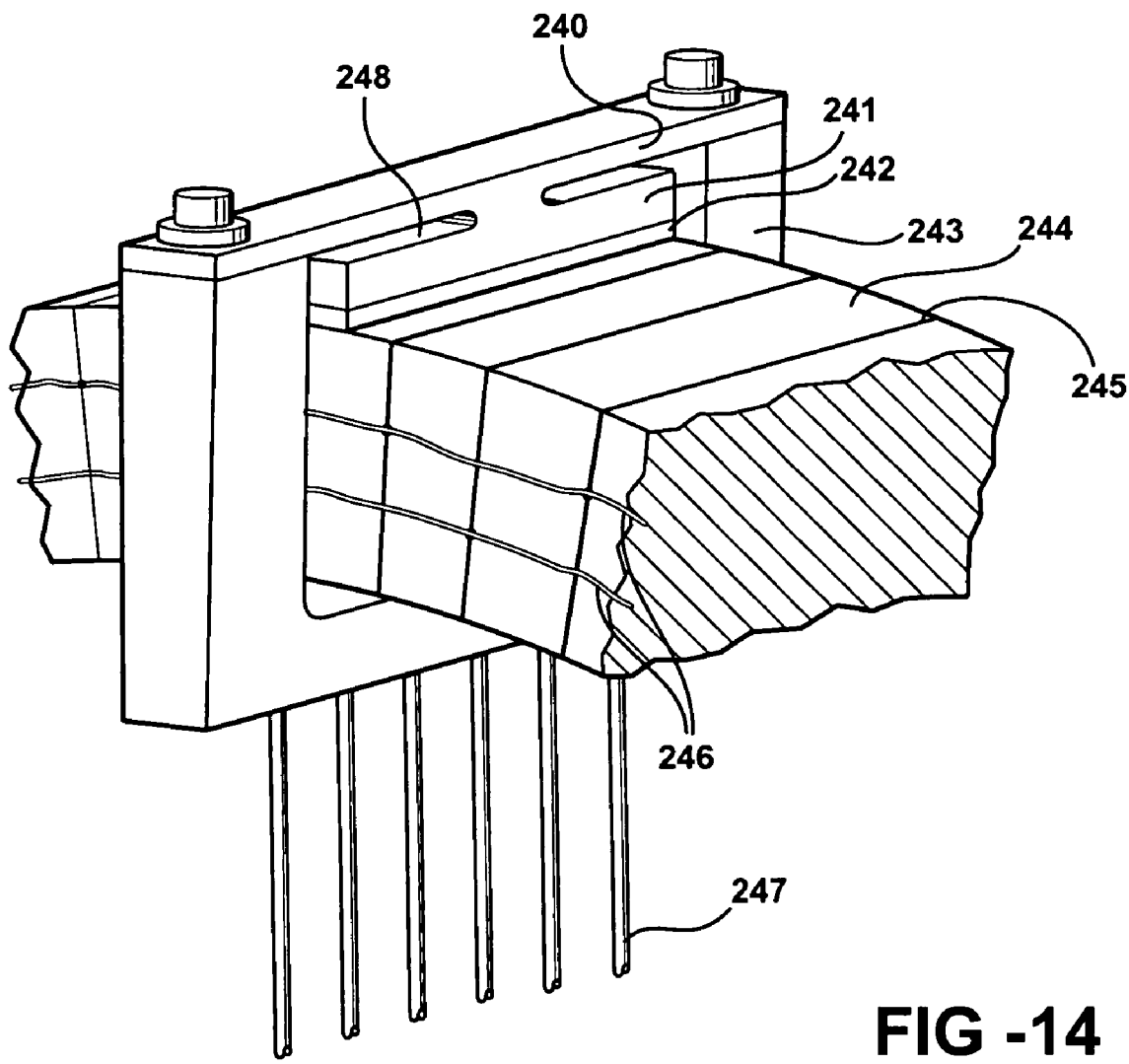
FIG. 14 shows a detail of an alternate means for attaching spokes to a striped ring piezoelectric ceramic.

FIG. 14 shows a detail of an alternate means for attaching spokes 247 to a striped ring piezoelectric ceramic 244. This figure also shows an alternate means for decreasing the size and power of a ring transducer: adding compliance to the spoke support structure. The spokes 247 are attached to a yoke 243, which is attached to a clamp 241 via elastic members 240 formed in the clamp by cutting a rounded bottom notch 248 in the clamp. An insulator 242 may or may not be needed, depending on how electrodes 245 are patterned on the ceramic ring and how they are wired together with leads 246. If the region under all of the clamps 241 of the alternator are held at the same potential (such as ground), then the insulators 242 may be omitted. The design of FIG. 14 has the advantage over that of FIG. 12 in that no adhesive is placed under tension, where it is weak. Some adhesive between the clamp 241 and/or the insulator 242 and ring 244 may be desirable to avoid motion of the clamp due to the relatively weak axial forces from the spokes when they are flexed.

Figure 15:
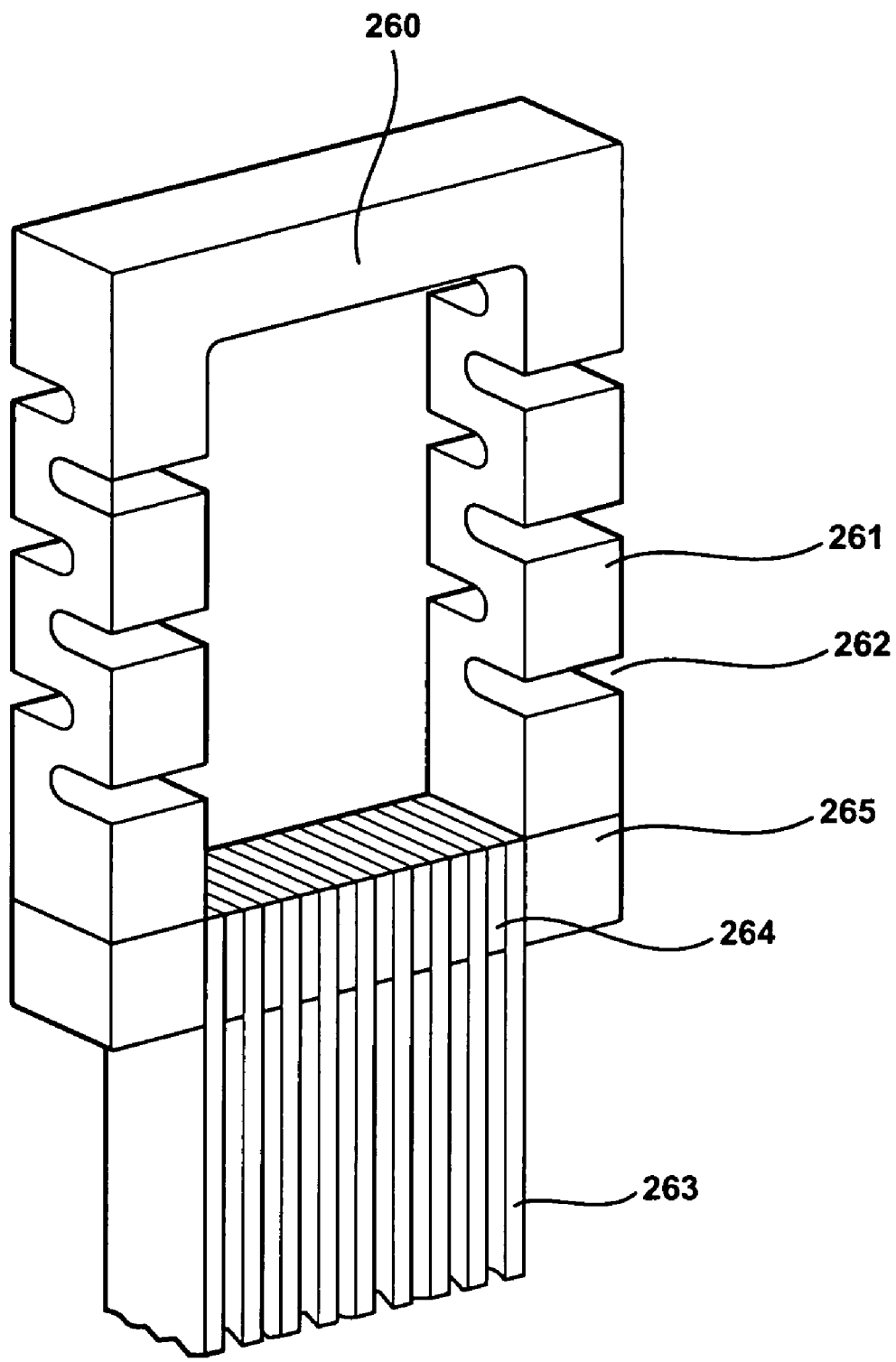
FIG. 15 shows a detail of another alternate means for attaching spokes to a striped ring piezoelectric ceramic.

FIG. 15 shows a detail of another alternate means for attaching spokes 263, this time chosen to be constructed of flat shim stock. Multiple spokes 263 are joined to spacers 264 and mounting blocks 265, for example by furnace brazing. A yoke and clamp piece 260 attaches to the mounting blocks 265, for example with screws. The legs of yoke 261 may be made elastic, if desired, by the cutting of multiple round bottom notches 262, so as to allow the construction of a lower power alternator as described earlier.

Spoke End Preferred Embodiment

The spokes for the embodiments discussed therein may be fabricated from stacks of thin uniform thickness plates of strong fatigue resistant material, such as spring steel. The spokes, keystone supports and hub may be all cut out of different regions of the same plate. Many plates are stacked on top of one another, separated by shim plates in the support and hub regions. The whole assembly is joined into one unit by a process such as oven brazing. The spoke-support-hub assembly then forms a compliant mechanism, with solid supports and hub, and spokes which are free to flex in the axial direction.

With axial motion of the hub, for spokes that are not too thick, the bending of the spokes is confined to a small region near the spoke ends near the supports and the hub. The spoke ends are exposed both to membrane stress due to radial tension in the spokes, and bending stress. The spokes can be treated as cantilever beams under simultaneous bending and tension in a conventional manner for the selection of their dimensions. In such a case, the bending stress, which is proportional to the curvature of the spoke, is a function of the tension in the spoke as well as the thickness and axial displacement of the spoke. The higher the membrane tension, the sharper the curvature of the bend of the spoke end, and the higher the bending stress. However, for a constant tensile membrane stress in the center of the spoke where the curvature is negligible, it will be found that the curvature of the spoke end will increase with decreasing spoke thickness in such a way that the ratio of the bending stress at the spoke base to the tensile stress at the center of the spoke is independent of the thickness. Thus, it is not possible to make the bending stress negligible by decreasing the thickness of the spokes.

Figure 17:
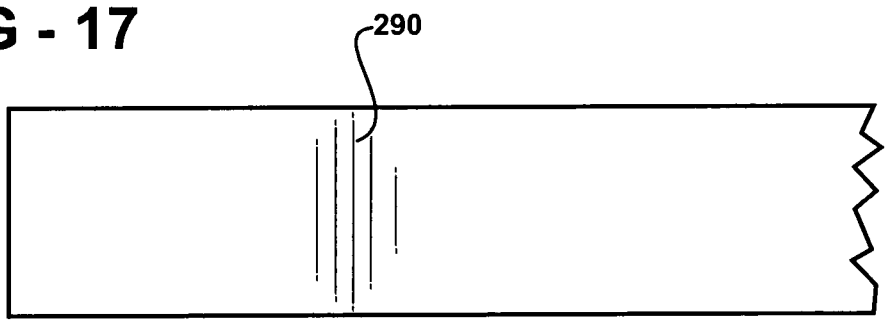
FIG. 17 shows a detail of a straight spoke end in plan view.

For a straight spoke 290, shown in FIG. 17, the tensile force carrying capacity of the spoke will be limited by the bending stress at the spoke end. Most of the rest of the spoke will not be fully stressed, and the spoke will be unnecessarily massive. The excess mass will limit the highest operating frequency of the generator, but this might be an acceptable trade-off, in some cases, for the simplicity of the design.

Figure 18:
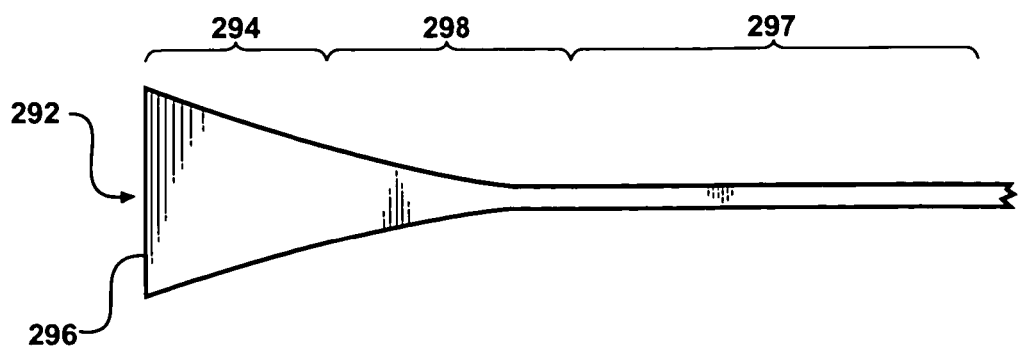
FIG. 18 shows a detail of a tapered spoke end in plan view.

A tapered spoke end 292, as shown in FIG. 18, is the preferred, higher performance, embodiment for a spoke. It has a nearly triangular region 294 near the base 296 (toward either the hub or the support) where bending stress dominates the total stress, a straight region 297 away from the base where membrane tensile stress dominates, and a transitional region 298 in between where both membrane and bending stress is important. The shape of the spoke is optimized so that the maximum total stress at any radial position along the spoke, which is the sum of the bending and membrane tensile stresses, is a constant. Thus, each portion of the spoke is maximally stressed and the spoke has the minimum mass. The ratio of the width of the spoke base to the width of the straight section of the spoke is approximately proportional to the square of the angle of deflection of the spoke. Thus, the optimal shape will depend on the diameter of the generator and the displacement of the hub.

An alternate embodiment of the spoke-support-hub structure is to stack straight strips of spring steel in the shape of a cross—first a horizontal strip, then vertical, then horizontal and so on. At the four ends of the cross are placed trapezoidal strips made of material of the same thickness material as the spokes, in the gaps between the spokes, to form the keystone-shaped supports. The whole assembly may be joined together by braze, adhesive, or fasteners, although fretting fatigue where the laminations cross at the spoke ends may be a problem when using fasteners. This four section spoke-sup-

Resonant Ring without Spokes Embodiment

Figure 19:
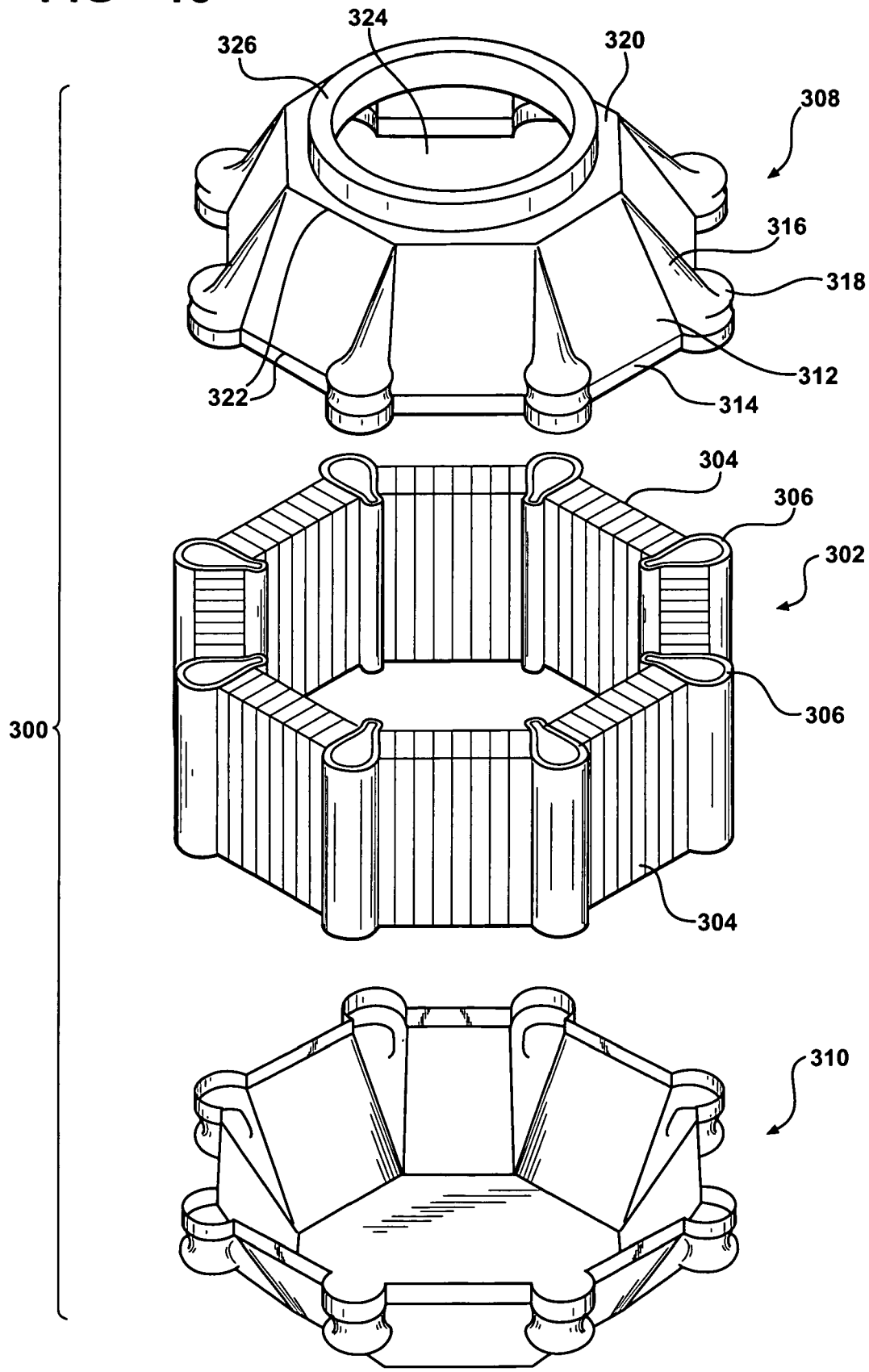
FIG. 19 is an exploded view of an alternative embodiment of a piezoelectric ring alternator, wherein the alternator is based on a resonant ring without spokes.

FIG. 19 shows another embodiment of a piezoelectric alternator 300 that can be used as an acoustic or resonant mass. It is based on a resonant ring 302 without spokes. The ring 302 is composed of a plurality of interspersed piezoelectric elements 304 and azimuthal springs 306. The piezoelectric elements 304 may each be a stack of ceramic elements used in the 3-3 mode with alternating polarity, which is preferred and shown in the figure, or a single piece of 3-1 ceramic, or a striped ceramic. The azimuthal springs may have several forms. Shown in FIG. 19 are springs 306 in the form of deformed tubes which get their compliance from the bending of a curved beam. A simple block of elastomer may also be used for the azimuthal spring. Because of their arrangement, the springs may be considered to be in series with the piezoelectric material.

The azimuthal springs 306 allow substantial radial movement of the ring 302 as a whole so that it may be used as the acoustic or resonant mass of the acoustic resonant system. Flexible skirts 308 and 310 cap the ring 302 on both ends of the ring to seal gas in the space inside the ring from the gas outside the ring while accommodating the large (perhaps several millimeters) radial motion of the ring. In one embodiment, each skirt consists of side plates 312, joining regions 314, flexible cones 316, bulges 318, end region 320, hinge regions 322 and an optional port 324 and attachment ring 326. The skirt 308 is a compliant mechanism. It is formed from a thin fatigue resistant material, such as a tough plastic or spring steel, that should be stiff enough that the skirt holds its shape without buckling under the acoustic pressure difference that will be applied between inside and outside portions of the alternator, yet thin and flexible enough that the skirt 308 is free to bend at the hinge 322 regions near the perimeter of the side plates 312, and that the cone 316 is free to roll or unroll to accommodate the contractions or expansions of the azimuthal springs 306. The side plates 312 are relatively rigid. Their rigidity may be enhanced by making them thicker than the other parts of the skirt, reinforcing them by joining each of them to a thicker rigid plate, by deforming the side plate into a domed shape, or by a combination of these methods. Although in the figure the hinges 322 are shown to be sharp folds in the skirt for clarity of conveying their function and location, the hinge regions should be rounded, making a smooth blend to the rest of the skirt, to avoid stress concentrations.

If the piezoelectric element 304 is a stacked ceramic or a striped ceramic and if the skirts 308 and 310 are made from metal, there should be thin additional electrical insulators, not shown in the figure, inserted between the skirts 308 and 310 and piezoelectric elements at the joining regions so that the skirt does not electrically short the piezoelectric elements. If the skirt is fabricated from an insulator, no such insulation is needed. If the piezoelectric elements are single plates used in the 3-1 mode with the side facing the skirt at ground potential, then again, no insulator is needed at the joining region, although an insulator may then be needed between the piezoelectric elements and the azimuthal springs if the springs are metallic.

The bulges 318 in the cones act to relieve what is mostly axial membrane stress in the cone caused by the slight change in angle between the cones and the azimuthal springs near the joining region which occurs as the resonant ring oscillates radially and the side plates and cones rotate to follow the ring motion.

One of the functions of the end region 320 of the skirt 308 is to allow axial motion of the hinge region necessary because of the rocking motion of the side plates. To some extent this function is also accomplished by the hinge region itself if it is curved; the radius of curvature can change to allow the side plate to follow the radial motion of the piezoelectric elements while remaining attached to the end region. The amount of the axial motion to be accommodated depends on the angle that the side plates make with the axis of the alternator. The axial motion can be minimized with side plates that are parallel to the axis, each side plate in the same plane as its corresponding piezoelectric element (the side plates would then be trapezoidal shaped rather than the rectangular shape shown in FIG. 19, with the side facing the end region 320 longer than the side facing the joining region 314, to accommodate the shape of the cone 316), although this will maximize the change in angle that needs to be accommodated by the bulges.

This type of resonant ring alternator 300 without spokes may be used with any of the examples of oscillatory motion heat engines described above, such as thermoacoustic-Stirling, thermoacoustic standing-wave, thermoacoustic cascade, thermoacoustic no-stack, conventional Stirling, free-piston Stirling, and others. When the alternator is used to convert acoustical power to electrical power, the outside faces of the side walls, formed by the piezoelectric elements 304, serve as the movable faces of the alternator. That is, acoustical power acts on the outside faces of the side walls, thereby resonating the ring, thereby stressing the piezoelectric material. To illustrate the use of the piezoelectric alternator with such engines, the thermoacoustic-Stirling engine will be used by example in the following figures.

Figure 20:
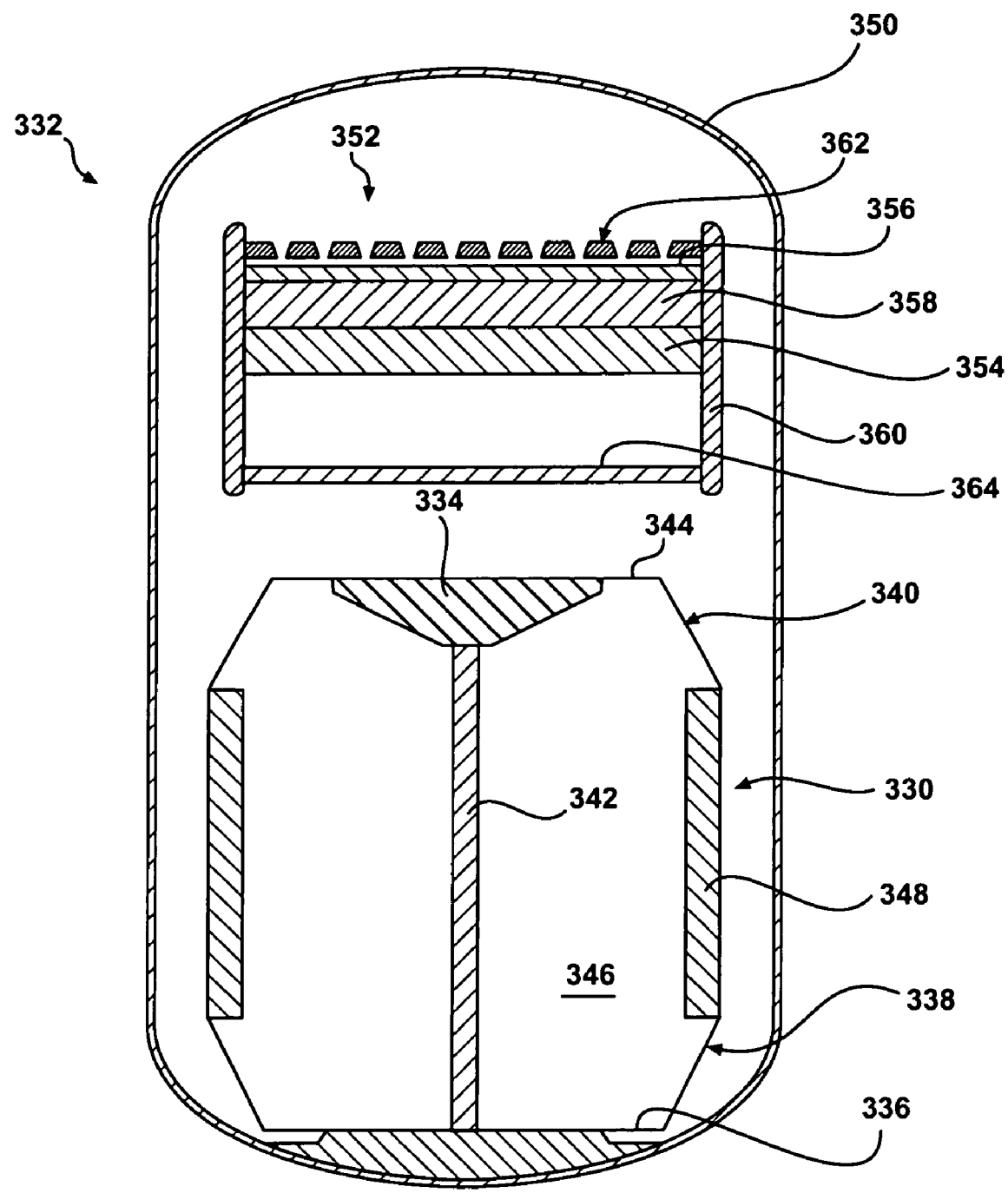
FIG. 20 shows a cross-sectional view of another alternative embodiment of a piezoelectric generator according to the present invention.

FIG. 20 shows in cross section a generator 332 with a resonant ring alternator 330 without spokes being used with a single coaxial thermoacoustic-Stirling engine 352, similar to the engine shown previously in FIGS. 4A and 4B. In this embodiment, a port in the alternator 330 is not used. The end regions 334 and 336 of the skirts 338 and 340 are held apart by a post 342 and pedestal support 344, defining a trapped portion of gas within the alternator (except for a slow leak, not shown, to allow long term pressure equalization between the inside and outside of the alternator). This trapped "back" volume 346 is somewhat disadvantageous because radial motion of the ring 348 causes pressure swings within the back volume which cause acoustic thermal losses on internal surfaces of the alternator 330. On the other hand, the generator 332 has a simple construction because it contains only one engine 352.

There are no net vibrations transmitted to the pressure vessel 350 from the radial motion of the resonant ring. However, the vertical gas motion in this embodiment is not balanced—the center of mass of the gas moves axially as the gas goes through its acoustic cycle, which leads to a axial vibrations of the pressure vessel.

The generator 332 includes a thermoacoustic engine 352 for converting heat to sound. The thermoacoustic engine 352 includes a hot heat exchanger 354, a cold or ambient heat exchanger 356 and a regenerator 358 sandwiched between the heat exchangers. A nacelle 360 surrounds the thermal core, consisting of the heat exchangers and the regenerator. The nacelle is generally cylindrical and coaxial with the pressure vessel. The nacelle is spaced from the walls of the pressure vessels so as to provide an annular space. This embodiment is illustrated with a jet pump 362 for counteracting Gedeon streaming. This embodiment is also illustrated with a secondary ambient or cold heat exchanger 364 at the open end of the nacelle 360, such that the thermal buffer tube is defined between the hot heat exchanger 354 and the secondary exchanger 364.

As with the embodiment of FIG. 1, the alternator 330 replaces the acoustic or resonant mass of a traditional thermoacoustic resonator. Also, the annular space between the pressure vessel wall and the nacelle 360 acts as a lumped acoustic mass. The space between the cold heat exchanger 356 and the end of the pressure vessel acts as a gas spring. This mass-spring sub-system is preferably tuned to have a resonant frequency well above the operating frequency of the generator 332, such that the pressure oscillations at the upper end of the pressure vessel 350 are slightly enhanced. In other words, the pressure peaks are slightly higher on the cold side of the thermal core and the pressure minimums are slightly lower on the cold side of the thermal core.

Figure 21:
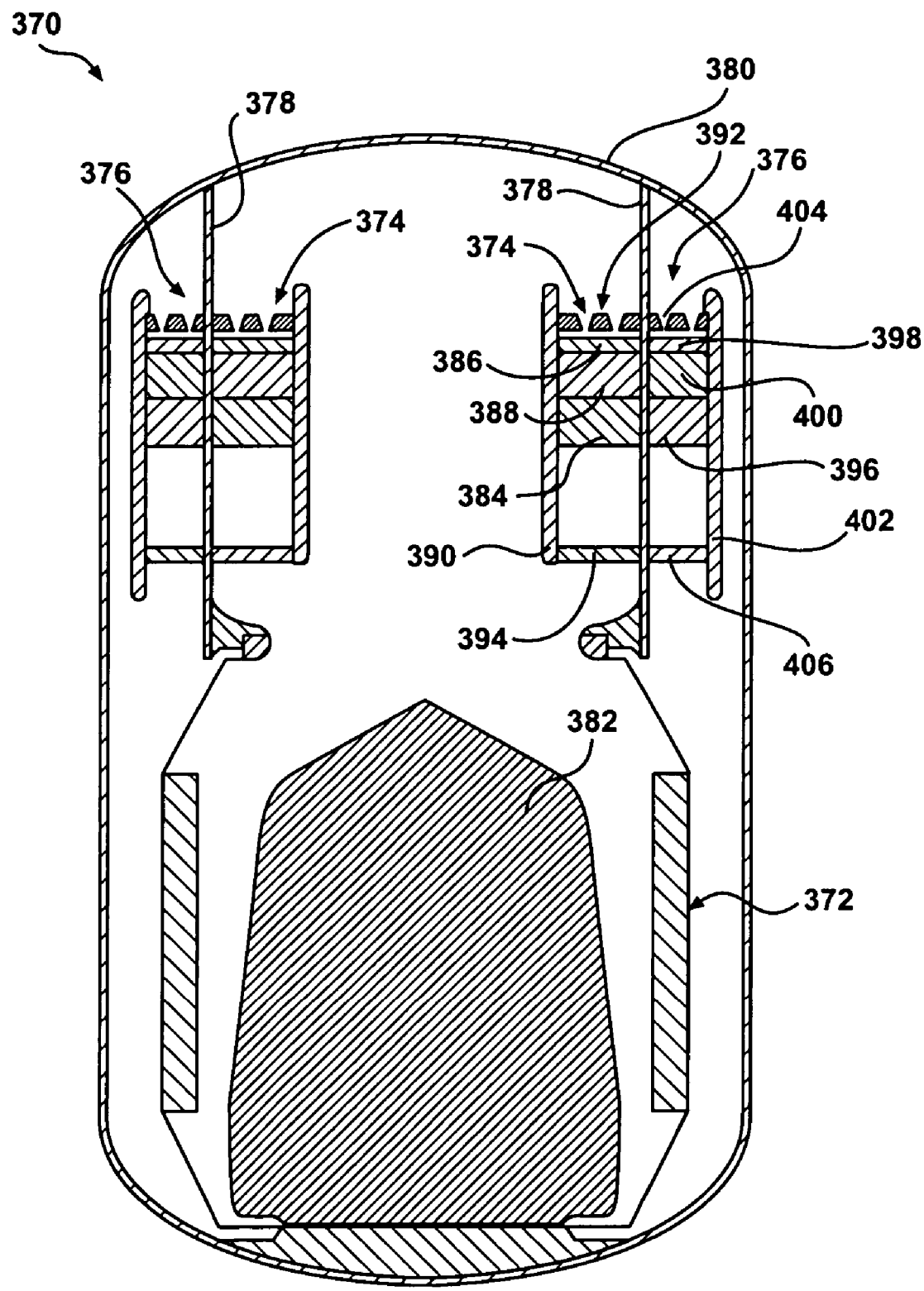
FIG. 21 shows a cross-sectional view of yet another alternative embodiment of a piezoelectric generator according to the present invention.

FIG. 21 shows in cross section a vibration balanced configuration of a generator 370 for using a resonant ring alternator 372 without spokes. It uses two coaxial engines 374 and 376, separated by a gas tight partition 378, operating 180 degrees out of phase with each other. The configuration of FIG. 21 is generally radially symmetrical, such that the partition 378 forms a cylinder, and the inner and outer engines 374 and 376 are each generally annular rings. As gas in the inner engine 374 moves downward, gas in the outer engine 376 moves upward, and vice versa. By adjusting the power output and the cross sectional areas of the inner and outer engines to be nearly the same, the center of mass motion of the gas in the inner and outer engines can be balanced, leading to a cancellation of vibrations transmitted to the pressure vessel 380, for quieter operation of the generator 370 where warranted by the extra complexity of having dual engines. The vertical motion of gas in the engines 374 and 376 drives the radial motion of the alternator which in turn generates electrical power. To minimize the volume that needs to be swept out by the alternator 372, a filler plug 382 is placed in the interior region of the alternator to remove excess compliance of the interior gas.

The inner and outer engines 374 and 376 are constructed similarly to the thermoacoustic engine of the prior embodiments. The inner engine 374 includes a hot heat exchanger 384 and an ambient or cold heat exchanger 386 sandwiching a regenerator 388. The nacelle is formed by an inner-nacelle wall 390 in the partition 378. A jet pump 392 is provided on the upper, cold, end of the engine 374, and a secondary exchanger 394 is provided on the lower end. Likewise, the outer thermoacoustic engine 376 includes a hot heat exchanger 396, and an ambient or cold heat exchanger 398, and regenerator 400. The nacelle is formed is formed by an outer nacelle wall 402 and the partition 378. A jet pump is shown at 404 and a secondary heat exchanger is shown at 406.

Figure 22:
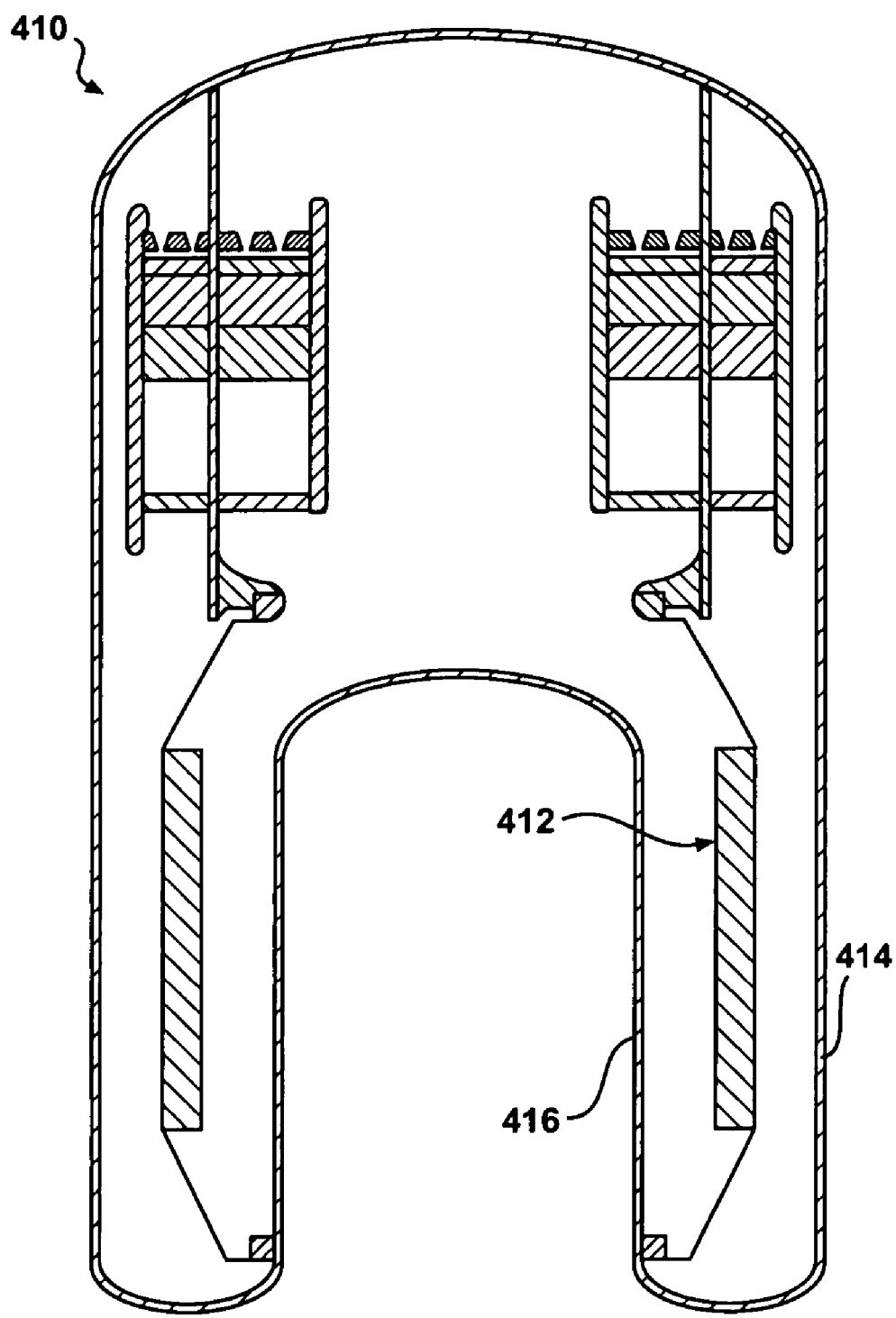
FIG. 22 shows a cross-sectional view of an alternative version of the generator of FIG. 21.

FIG. 22 shows a similar vibration balanced generator 410 configuration without a filler plug. Excess volume in the interior of the alternator 412 is taken up by the reentrant shape of the pressure vessel 414. The cylindrical pocket 416 in the pressure vessel may be put to a beneficial use, for example, holding electronics associated with the generator.

It should also be mentioned that under some conditions it may be advantageous to use the generators shown herein in the reverse sense to pump heat. What has up to now been described as an alternator may be driven with high voltage oscillatory electrical power. The alternator then becomes functionally a loudspeaker that drives pressure oscillations and acoustic power flow within the pressure vessel. The engines then become functionally heat pumps or refrigerators driven by acoustic power from the loudspeaker. Also, the transducers may be used as drivers for other application, such as using them as acoustical drivers.

As a further alternative, a thermoacoustic device with the general configuration of the device in FIG. 1 may have some of its thermoacoustic cores used as engines, while other stages are used as heat pumps or refrigerators. Such a configuration is show in FIG. 23, wherein the topmost and second to bottom thermoacoustic cores are used as engines, while the bottommost and second from the top cores are used as refrigerators.

Flexible Diaphragm Embodiments

Figure 24:
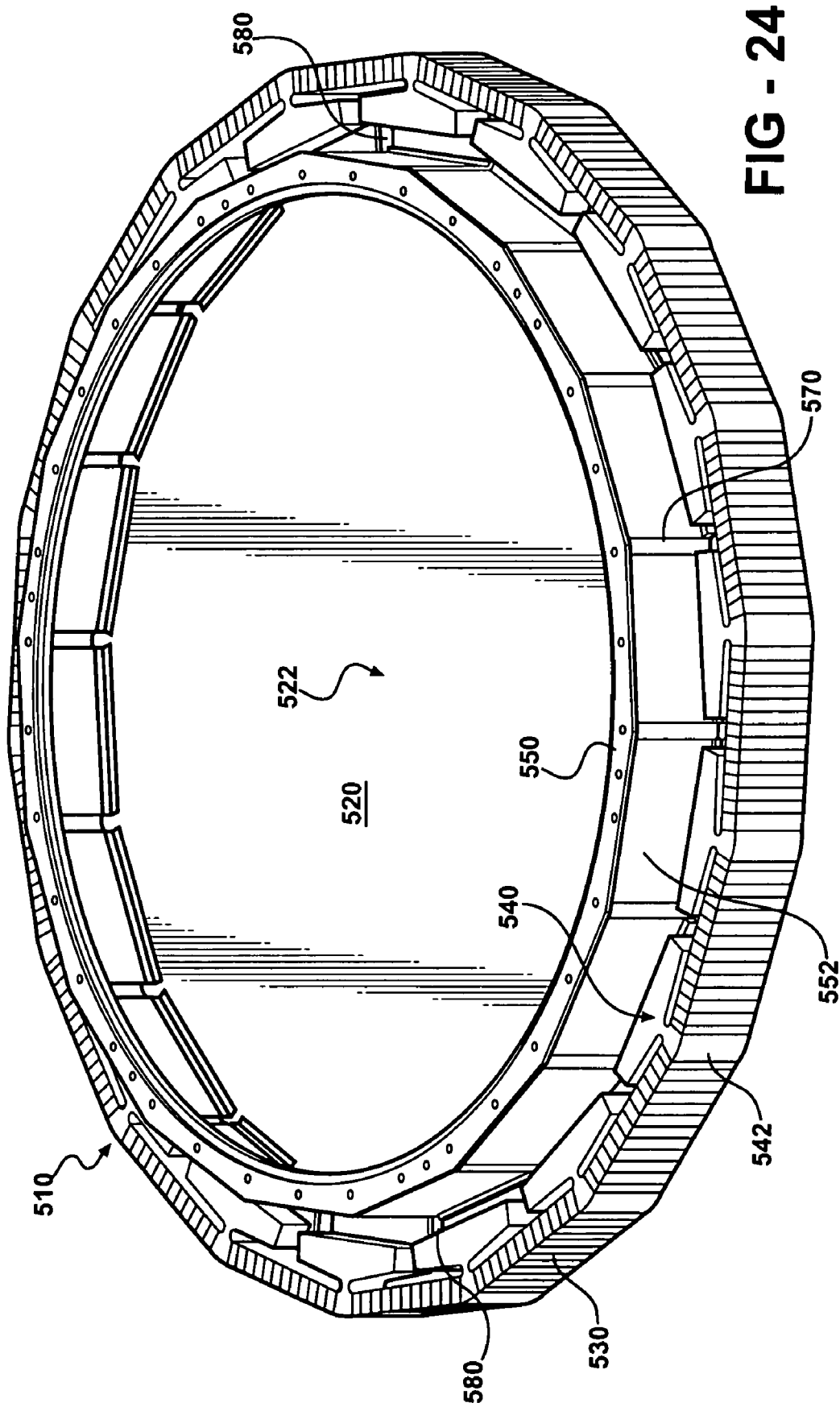
FIG. 24 is a perspective view of an embodiment of a flexible diaphragm transducer according to another aspect of the present invention.
Figure 25:
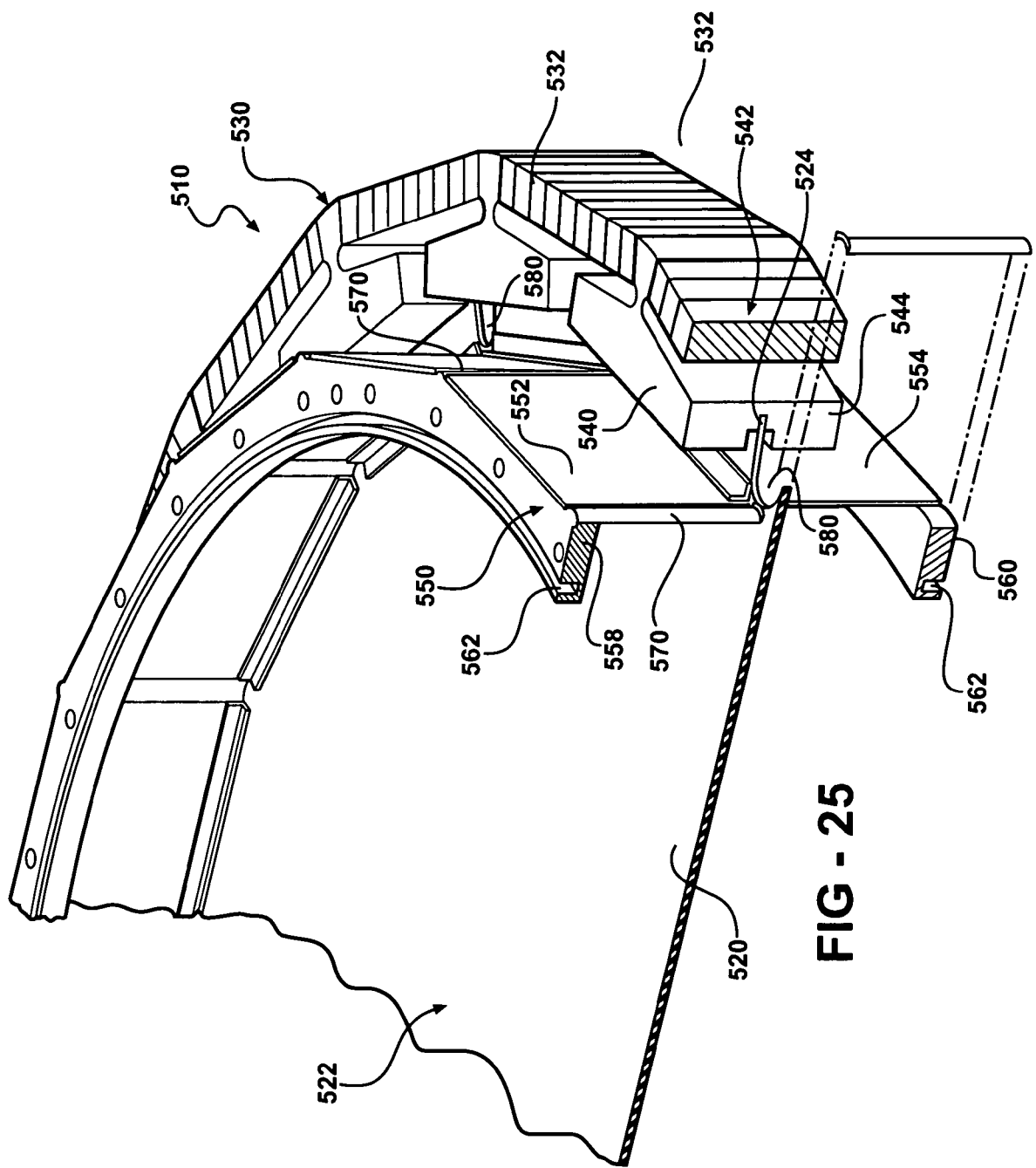
FIG. 25 is a perspective cutaway view of a portion of the transducer of FIG. 24.

Turning now to FIGS. 24-32, the present invention further includes various additional piezoelectric transducers or alternators utilizing a flexible diaphragm for converting between acoustical power and electric power. These transducers may be used with thermoacoustic devices, or form part of such thermoacoustic devices, as was illustrated with previous embodiments of transducers here, or may be used in other applications. FIGS. 24 and 25 illustrate one embodiment of a piezoelectric transducer/alternator 510 utilizing a diaphragm. FIG. 24 is a three dimensional drawing of the flexible diaphragm transducer/alternator 510, while FIG. 25 shows a cross section of FIG. 24 in more detail. A flexible diaphragm 520 is used to couple acoustic energy to a fluid in contact with the diaphragm. A "diaphragm" as used for the embodiments of FIGS. 24-32 may have the dynamic properties of both a thin flexible plate that has a finite stiffness and a membrane that responds to tension. Alternatively, a "diaphragm" may be a membrane with little or no stiffness, which responds to tension but not to bending stress. The diaphragm 520 may be said to have a central portion 522 and a perimeter 524. The perimeter may be the outermost edge of the diaphragm and may be circular, polygonal or have other shapes. Preferably, the perimeter 524 lies in a diaphragm plane. In the illustrated embodiment, the central portion 522 and perimeter 524 of the diaphragm both lie generally in the same plane when the diaphragm is in an unstressed or neutral position. In alternative embodiments, the diaphragm is domed such that it has a concave face and an opposed convex face when in an unstressed or neutral position. The diaphragm 520 may be displaced such that the central portion moves axially relative to the neutral position. Typically the central portion will oscillate between two positions displaced in opposite directions from the neutral position. In the illustrated embodiment, displacement of the diaphragm causes the central portion 522 to move out of the plane containing the perimeter.

A perimeter member 530 generally surrounds the diaphragm 520 and is interconnected with the perimeter 524 of the diaphragm, thereby supporting the diaphragm. The perimeter member 530 includes at least one piezoelectric element 532. In the illustrated embodiment, the perimeter member 530 includes a plurality of piezoelectric elements 532 arranged generally in a ring. The perimeter member is interconnected with the diaphragm 520 such that displacement of the diaphragm stresses the piezoelectric element or elements. The piezoelectric elements 532 may be, for example, stacks of piezoelectric ceramic. The cross sectional shape of the piezoelectric elements, looking into the hoop direction, is somewhat arbitrary. They may be rectangular as shown, round, annular, or of any convenient shape. Some consequences of these choices are described below.

In the illustrated embodiment, the perimeter member 530 further includes a plurality of supports 540 which mechanically interconnect the piezoelectric elements 532 and diaphragm 520 such that movement of the diaphragm stress the piezoelectric elements. As shown, each support has a keystone portion 542 positioned between adjacent piezoelectric elements 532 and an attachment portion 544 that is attached to the perimeter 524 of the diaphragm.

The perimeter member 530 may also optionally include azimuthal springs, as was shown previously in the transducer 103 of FIG. 5, and shown previously in FIG. 16. The analysis of Example 4 holds as well for this and other embodiments of the flexible diaphragm transducers disclosed herein.

In the illustrated embodiment, the transducer further includes a strut assembly 550, which includes a plurality of upper struts 552 and lower struts 554. Axial motion of the transducer 510 is limited by the plurality of struts 552 and 554. Each strut has one end affixed to the diaphragm 520 near the perimeter and another end attached to a fixed point, such as an upper mounting flange 558 or a lower mounting flange 560. Together, the struts 552 and 554 and the flanges 558 and 560 define a mounting structure. These struts 552 and 554 are stiff in the axial direction but are relatively compliant to a slight radial motion of the diaphragm 520, supports 540 and the ring of piezoelectric elements. The struts are also relatively compliant to a slight twisting motion of the diaphragm out of its plane. In this embodiment, struts 552 and 554 are placed on both sides of the diaphragm. This arrangement eliminates the possibility of buckling of the struts.

A preferred application of the transducer 510 is in a thermoacoustic device wherein the transducer separates a volume of gas into two portions. For such an application, as well as some other applications, it is preferred that the transducer provide a substantially fluid tight seal such that the diaphragm separates the volumes. In the illustrated embodiment, the upper mounting flange 558 and lower mounting flange 560 are designed to be mounted and sealed to a housing or gas container. This may be accomplished in a variety of ways. In the illustrated embodiment, the flanges 558 and 560 each include a mounting surface and an O-ring groove 562 for mounting and sealing to a housing.

In this embodiment, fluid motion between the struts 552 is blocked by hoop stress relieving members 570, which in this embodiment are thin arcs of metal that are concave in the inward radial direction. The members 570 interconnect the struts 552 and may be formed integrally therewith or formed separately and attached to the struts. Similar members may block fluid motion between the lower struts 554.

As will be clear to those of skill in the art, a diaphragm may experience hoop stress near its perimeter when the central portion is displaced from its neutral position. The amount of hoop stress depends on the characteristics of the diaphragm and the amount of displacement. In some embodiments of the present invention, provision is made to reduce or relieve hoop stress in the diaphragm. In the illustrated embodiment, radial slots 580 in the perimeter of the diaphragm 520 relieve hoop stress during the operation of the transducer. As shown, these slots 580 are positioned between the supports 540. Optionally, the slots may be eliminated. As a further alternative, radial corrugations may be provided in the diaphragm.

In the embodiment of FIGS. 24 and 25, the perimeter member 530 may be said to generally define a transducer plane, with the perimeter member and the diaphragm disposed generally in the plane. The perimeter member 530 may also be said to surround a central area, with the diaphragm being disposed in this central area.

The diaphragm 520 is able to flex in a direction generally perpendicular to the transducer plane, in the axial direction. When the transducer is used for the generation of electrical power from acoustical power that may be derived, for example, from a thermoacoustic-Stirling engine, the acoustic oscillating pressure differential between the two sides of the diaphragm causes the diaphragm 520 to flex and undergo oscillatory motion in the axial direction. The diaphragm in turn applies an oscillating radial (inward) force on the supports 540 at twice the frequency of the sound. The oscillating radial force is accompanied by a slight oscillating radial motion of the supports. Thus, acoustic power, in the form of oscillating pressure differential across the diaphragm and oscillatory volume swept out by the diaphragm, is converted into mechanical power in the form of oscillating radial forces on, and motion of, the supports. The oscillating radial force on the supports causes oscillatory compressive stress and strain on the piezoelectric members 532 which convert the applied mechanical power into electrical power. In this embodiment of the flexible diaphragm transducer when used as an alternator, output voltage and current depend quadratically on the axial displacement of the diaphragm. For sinusoidal pressures and motion of the diaphragm at frequency f, output voltage and current are generated at 2f.

The transducer may be used in the reverse direction, converting electrical power in the form of voltage and current at frequency 2f into acoustic power at frequency f through the process of parametric excitation.

As is well known in the art, it may be advantageous to apply a steady bias stress to the transducer. This may be done, for example, by heating or cooling the diaphragm when assembling the piezoelectric ring to the transducer, to apply a bias compressive or tensile stress on the piezoelectric ring, respectively, and a bias tensile or compressive stress on the diaphragm, respectively, after assembly when the diaphragm and piezoelectric ring come to the same temperature, for a diaphragm with a positive thermal expansion coefficient.

The stresses in the diaphragm used in various embodiments of the present invention may limit the power to which the transducer may be operated, even with the use of high strength materials. A high stress region occurs near the rim of the diaphragm, such as where the diaphragm 520 joins with supports 540 in FIGS. 24 and 25. At full deflection, the diaphragm simultaneously experiences high tensile stress and bending stress. As is well known (e.g. *Roark's Formulas for Stress and Strain*, Young and Budynas, Seventh Ed., McGraw-Hill, Table 8.9), the peak bending stress of a bent cantilever beam is increased by tension applied along the cantilever. The tension causes the bending of the beam to be concentrated in a small region near the support. For an imposed slope at the free end of the cantilever and a given tensile force, thinner cantilevers can have higher peak bending stresses than thicker ones, the opposite of the case of a given bending angle and no tensile force, because as the beam becomes thinner the region of bending becomes more concentrated near the support. A similar effect occurs in the diaphragm near the supports 540. Some embodiments of the present invention include various techniques to control this curvature, as will be described herein.

A first of these curvature control techniques uses to advantage the acoustic pressure on the transducer. For use in a thermoacoustic device, such as shown for example in FIG. 1 or 23, the transducer may be used advantageously at a frequency where it presents a mass-like acoustic reactance to the thermoacoustic engines and/or chillers. Likewise, thermoacoustic engine and chiller stages present a spring-like acoustic reactance to the transducer. Combinations of engines, chillers and transducers can thus form a compact resonant system, and the thermoacoustic device operates at the frequency of one of these resonances. Under these conditions, at the phase of the cycle where the diaphragm has deflected maximally downward, say, the main reactive component of the acoustic pressure will be positive below the diaphragm and negative above the diaphragm, so as to accelerate the diaphragm upward. Even though the deflection of the diaphragm will be greatest near its center, this net pressure difference, positive below the diaphragm, will push upward on the diaphragm fairly uniformly at all positions because the wavelength of sound in a thermoacoustic generator will generally be much larger than the largest dimension of the diaphragm. The net upward pressure presses back on the diaphragm near the rim to reduce the increased curvature that is caused by the tension in the diaphragm. With the proper choice of diaphragm size, maximum tension in the diaphragm, and acoustic properties of the gas spring formed by the thermoacoustic engine and chiller spaces, the transducer can be designed to have very low bending moment near the support. The effect is similar to that in a kettledrum, and can be studied in Morse's *Vibration and Sound* (ISBN 0-88318-

287-4, reprinted by the Acoustical Society of America, pp. 193-209). As described in the next few paragraphs, if the stiffness of the diaphragm is ignored and instead the diaphragm is considered to be a membrane of zero stiffness, with a tension that increases as a function of deflection, the membrane may be designed to have zero slope at its contact to the rim following the theory in Morse. Under these conditions, the transducer diaphragm, such as 520, with its actual plate stiffness, will have minimal bending stress and the transducer can be used at high power.

The diaphragm may be treated as if it were approximately a circular membrane with an effective radius a. As will be clear to those of skill in the art, the illustrated membrane is a generally polygonal shaped member. The effective radius a is the radius of a circular membrane that performs equivalently to the polygonal membrane. The radius a will be approximately equal to the average radius at which the supports attach to the polygonal membrane. The diaphragm has a mass per unit area $\sigma_D = \rho_D \tau$, where $\rho_D$ is the mass per unit volume of the material with which the diaphragm is constructed and $\tau$ is the diaphragm thickness. The diaphragm is also subjected to a time varying membrane stress which can be approximated by a tension, the tensile force per length of edge, given by $T = F_R/(2\pi a) + T_0$, where, as was shown previously in Example 4, is the arithmetic sum of the radial time dependent tensile forces that the piezoelectric ring and supports apply to the diaphragm, and where $T_0$ is an optional time independent bias tension, present when the diaphragm is in equilibrium, which may be taken to be zero if no bias is used. Under these conditions, a membrane may have transverse wave motion with a time dependent speed c given by $c^2 = T/\sigma_D$. With approximately fixed boundary conditions at the rim of the membrane, the displacement of the membrane from equilibrium for radial (azimuthally symmetric) modes of vibration is given by $$Y = A[J_0(2\pi \upsilon r/c) - J_0(2\pi \upsilon a/c)] \cos(2\pi \upsilon t), \quad (26)$$

where $J_0$ is the zero order Bessel function of the first kind, r is the radial coordinate, $\upsilon$ is the frequency of motion, t is time, and $A[1 - J_0(2\pi \upsilon a/c)]$ is the amplitude of motion at the center of the membrane. Here, an approximation has been made in treating the membrane as if it has a mode shape that varies instantaneously through its dependence on the time varying speed c. As shown in Morse, the allowed frequencies of motion of a kettledrum are given by solutions to the equation $$J_0(w) = -\frac{\chi}{w^2} J_2(w), \quad (27)$$

where $w = 2\pi \upsilon a/c$, $\chi = \pi \rho_0 c_a^2 a^4/(V_o T)$, $V_0$ is the effective volume of a gas spring that is compressed by the membrane motion, $\rho_0$ is the mean density of the gas that is compressed, $c_a$ is the adiabatic sound speed in the gas, and $J_2$ is the second order Bessel function of the first kind.

In a thermoacoustic device such as that shown in FIG. 1 or 23, the transducers partition the housing containing the working gas into several effectively closed mean volumes. Volumes may be considered enclosed by either the walls of the rigid housing containing the working gas, or by nodal surfaces of the acoustic velocity, which are mathematical surfaces within the gas where the acoustic velocity is nearly zero. In the balanced thermoacoustic devices of FIG. 1 or 23, for example, there is a nodal surface about midway between the two alternators. Thus, four effectively closed mean volumes may be defined: the gas filled volume above the upper alternator, the gas filled volume below the upper alternator but above the nodal surface at about the mid-plane of the housing, the gas filled volume below the nodal surface but above the lower alternator, and the gas filled volume below the lower alternator. The effective volume $V_0$ of the gas spring compressed by the motion of each alternator in such a thermoacoustic device can then be approximately given by $V_0 = 1/(V_1^{-1} + V_2^{-1})$, where $V_1$ and $V_2$ are the two nearest effectively closed mean volumes of gas on either side of an alternator. Alternatively, a more accurate estimate of the effective volume $V_0$ of the equivalent gas spring that is compressed by the transducer motion can be made from a thorough acoustic model of the thermoacoustic device, in which case $V_0 = [\gamma P_0/(2\pi \upsilon)] \text{Im}(U/\Delta p)$, where $\gamma = c_P/c_V$ is the ratio of specific heats of the gas at constant pressure and constant volume, $P_0$ is the mean gas pressure, $\Delta p$ is the complex acoustic pressure difference across the diaphragm, U is the complex volumetric velocity swing of the diaphragm, and Im denotes the taking of the imaginary part of a complex quantity.

The first diaphragm curvature control technique consists of selecting $\chi$ such that membrane tension and gas pressure forces alone cause the diaphragm to have near zero slope at its rim, imposing near zero bending moment on the supports at the rim, and the diaphragm therefore receiving near zero bending moment reaction back from the supports. The parameter $\chi = \pi \rho_0 c_a^2 a^4/(V_o T)$ is a measure of the relative importance of the compression of the gas to the tension in the membrane as restoring forces on the membrane. At the best value of $\chi$ of 14.7, the first solution of Eq. (27) for w, when substituted into Eq. (26), gives a deflection Y for the first radial mode of the membrane that has near zero slope $\partial Y/\partial r$ at r=a, even for a diaphragm that is assumed to have zero stiffness. There is therefore no concentration of curvature at the rim of a true diaphragm with finite stiffness. For values of $\chi$ in the range of 7 and 34, the imposed slope of the membrane near its rim is reduced to 50 percent of the slope imposed without the use of this curvature control technique (equivalent to $\chi = 0$). It is preferred that a diaphragm be designed to fall In this range. For values of $\chi$ in the range of 11 and 19, the imposed slope of the membrane near its rim is reduced to 20 percent, which is more preferred, and for values of $\chi$ in the range of 13 and 17, the imposed slope of the membrane near its rim is reduced to 10 percent, which is even more preferred. Over the range $7 \leq \chi \leq 34$, the peak bending stress at the rim of a true finite stiffness diaphragm is at least halved where, like the cantilever subjected to simultaneous bending and tensile forces, the diaphragm must make the sharp transition from the imposed slope of the membrane relatively near the rim to the essentially zero slope boundary condition right at the rim.

As will be clear to those of skill in the art, a diaphragm with finite stiffness will always have zero slope right at the rim because of the clamped boundary condition. However, the slope transitions rapidly to a nonzero slope a short distance from the perimeter. Using the above approach to curvature control, wherein the diaphragm is treated as having no stiffness, leads to a finite stiffness diaphragm that has the slope imposed a short distance from the perimeter being reduced or eliminated, thereby reducing a concentration of bending stress. This curvature control technique puts constraints on the size of the diaphragm, which may be inconvenient, but it has the advantage of manufacturing simplicity because it does not require additional parts for the control of diaphragm curvature.

A second diaphragm curvature control technique for use with the present invention is to vary the thickness of the diaphragm. The diaphragm may be thickened in regions where the curvature would otherwise be high, such as near the rim, to locally reduce the bending stress. However, the diaphragm also becomes stiffer where it becomes thicker. In order to couple a certain amount of acoustic power to or from the fluid, it is necessary for the diaphragm to sweep out a certain volume during its flexure. Stiffening the diaphragm in one region will make it more difficult sweep out that volume without exceeding the maximum allowable stress in another region of the diaphragm.

Figure 26:
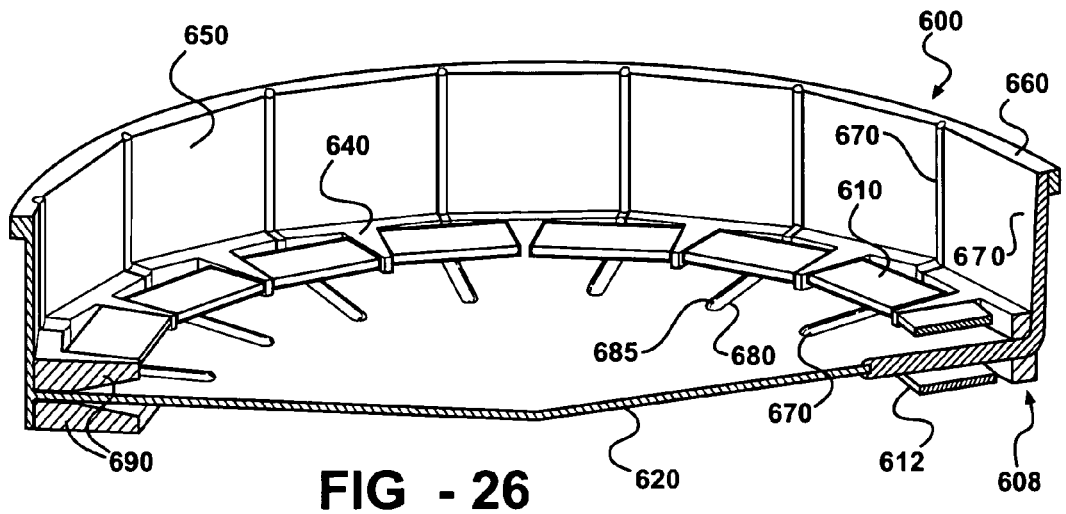
FIG. 26 is a cutaway perspective view of another version of a flexible diaphragm transducer.

Another embodiment of a flexible diaphragm transducer is shown at 600 in FIG. 26 to illustrate some alternative design choices that may be made to fit a given application. In this embodiment, the perimeter member 608 includes piezoelectric elements 610 and 612 that are grouped into two nominally circumferential rings on either side of the diaphragm 620. Also, the rings of piezoelectric elements 610 and 612 are placed inside the outer edge of the diaphragm, which is an advantage when making a transducer with the lowest possible maximum radial dimension that has a given size diaphragm. The shape of the supports 640 is changed relative to that in FIGS. 24 and 25 to accommodate this alternate placement of the piezoelectric elements 610 and 612. Struts 650 are placed on only one side of the diaphragm, which is allowable as long as they can be designed to not buckle during the part of the acoustic cycle when they experience compressive stress in the axial direction. The struts 650 in this embodiment have also been connected to the supports 640 rather than to the diaphragm. The ends of the struts opposite the diaphragm and supports provide the mounting surface for the transducer, and may be joined, for example, to a mounting flange 660, or some other structure, as determined by the application. For example, the ends of the struts opposite the diaphragm and supports may be joined to a component of a thermoacoustic engine, for the generation of electrical power, without the flange 660. Alternatively, one flexible diaphragm transducer may be attached to another flexible diaphragm transducer at the ends of their axial struts opposite their respective diaphragms, to couple with either dipole or monopole acoustic fields depending on whether the two transducers are operated in phase or in opposite phase, respectively.

Figure 27A:
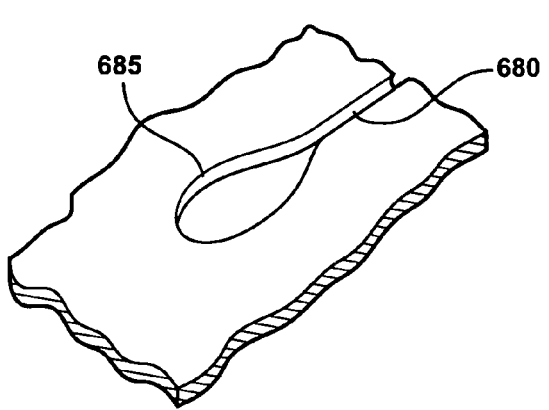
FIGS. 27A-27D are detailed views of an end detail for radial slots.
Figure 27B:
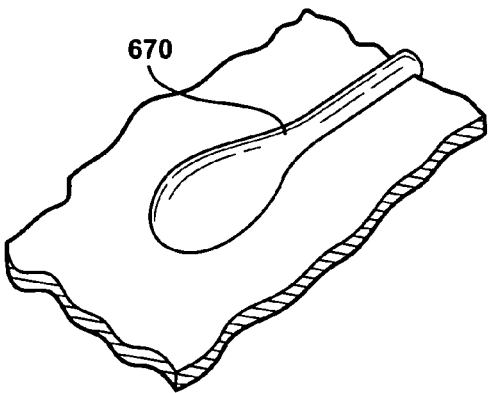
Figure 27C:
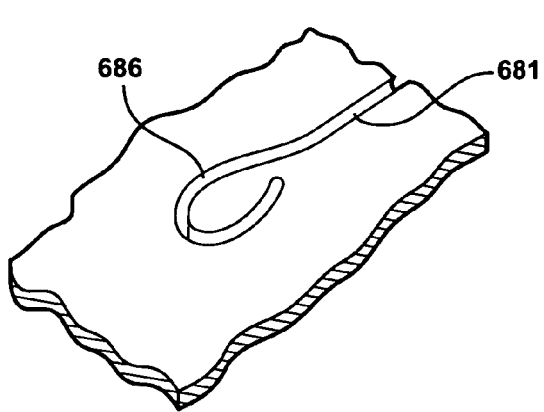
Figure 27D:
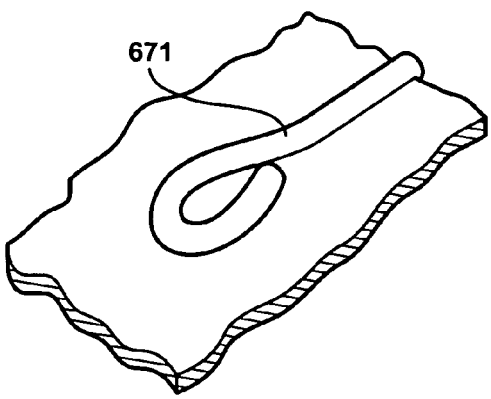

Since the desired compressive stress in the piezoelectric elements is essentially in parallel mechanically with the hoop stress in the diaphragm, hoop stress relieving radial slots 680 in the diaphragm may extend over much of the diaphragm so as to deliver additional compressive stress to the piezoelectric elements for a given amount of diaphragm motion. Such long radial slots reduce the amount of mechanical energy stored in the diaphragm during its deflection, and improve the ratio of energy coupled between acoustic and electrical forms to that stored in the transducer. This can be a major advantage in some sonar applications if the piezoelectric elements are made from high coupling factor piezoelectric materials, such as the single crystal piezoelectric materials currently under development in many laboratories. Fluid passage through the radial slots 680, the spaces between the supports 640, and the spaces between the struts 650 is blocked in this embodiment by a relatively compliant elastomer seal 670, such as a rubber, silicone, or polyurethane adhesive, forming an acoustic seal. A slight disadvantage of long radial slots 680 in the diaphragm 620 is the creation of a stress concentration at the end of the slot 680. This can be mitigated with a teardrop or circular cutout at the end 685 of the slot 680 as shown in FIG. 27A. The cutout can also be filled with elastomer seal 670 as shown in FIG. 27B. Another end condition for a radial slot 681, shown in the detail FIG. 27C, is a "J" end condition 686, which has the advantage of more fully supporting the slot filling elastomer 671, shown in detail FIG. 27D, against stresses caused by the acoustic pressure.

A third diaphragm curvature control technique is illustrated in the embodiment of FIG. 26. Two curved guiding surfaces 690 are placed on either side of the diaphragm 620, approximately tangent to the diaphragm surface. These surfaces may be an integral part of the supports 640, as in FIG. 26, or they may be the surface of separate parts. The interaction of curved guiding surface 690 and the diaphragm 620 has some similarities to that of a rolling contact bearing. It would therefore usually be advantageous to pick combinations of materials for these parts that minimize the effects of surface fatigue, wear, or fretting fatigue. For example, the diaphragm 620 could be made from a fatigue resistant high strength steel or titanium, while the curved guiding surface 690 could be made from high strength steel, brass, bronze, Babbitt metal, or a tough, low friction, wear resistant plastic such as a member of the Rulon® family.

Both linear and quadratic (or higher order nonlinear) response may be obtained from a flexible diaphragm transducer that has separate electrical connections for the piezoelectric material on the two sides of the plane of the diaphragm. For the transducer of FIG. 26, the piezoelectric elements 610 on one side of the diaphragm may be wired together into a first bank of elements, while the elements 612 on the other side of the diaphragm may be wired together into a second bank of elements. For the embodiment of FIGS. 24 and 25 each of the piezoelectric elements 532 may be modified into either two separate elements on the top side and bottom side of the diaphragm, or each element may have split electrodes and electrical connections for the top half and the bottom half. In either case, portions of piezoelectric elements 532 on the top half and bottom half of the plane of the diaphragm may be wired together into first and second banks of piezoelectric elements.

Figure 28A:
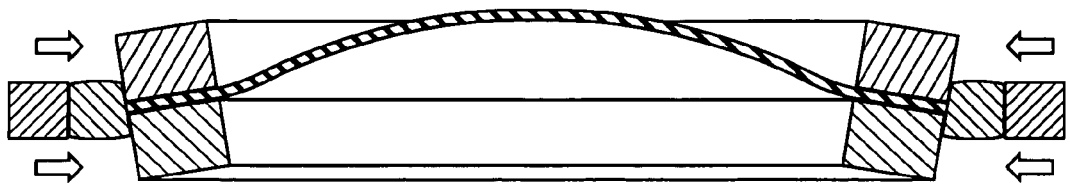
FIGS. 28A-28E are simplified drawings of an embodiment of a flexible diaphragm transducer shown in five different positions.
Figure 28B:
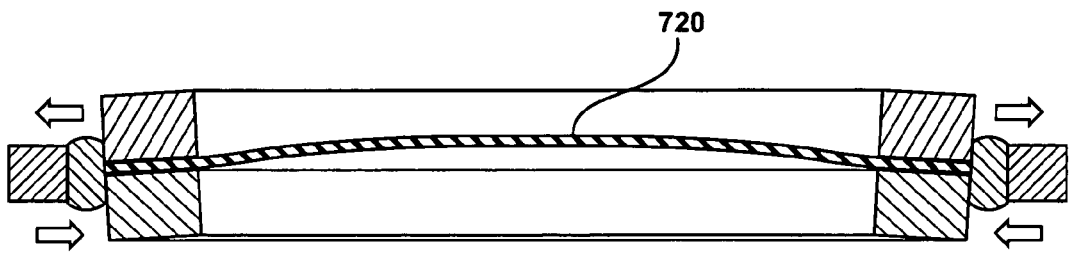
Figure 28C:
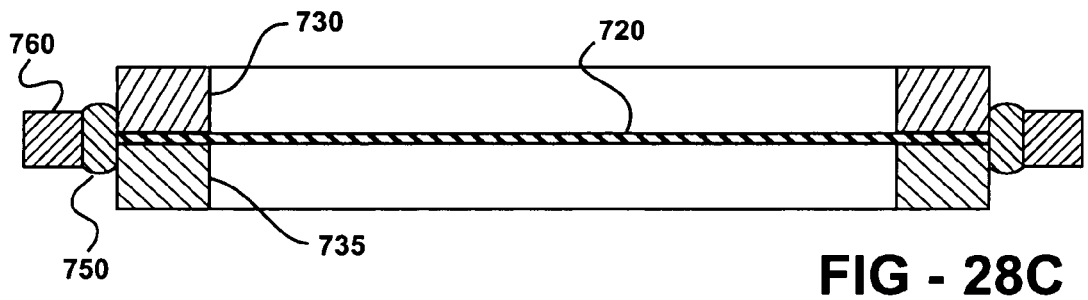
Figure 28D:
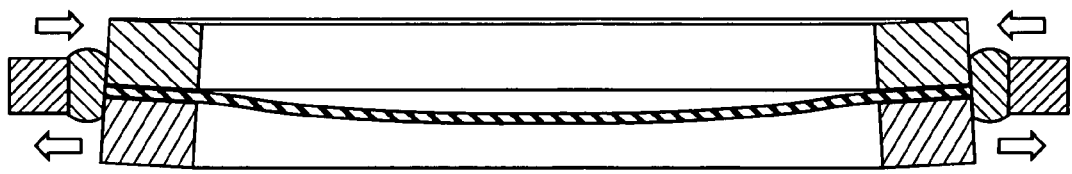
Figure 28E:
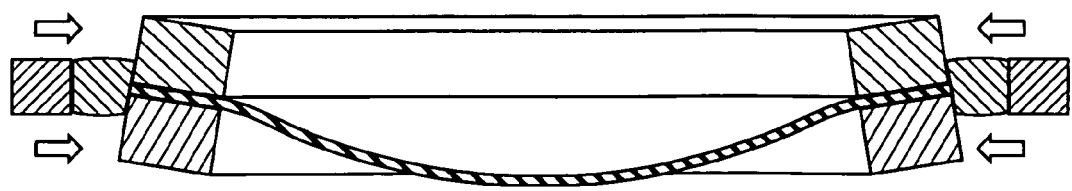

The operation of a flexible diaphragm transducer to obtain both linear and quadratic response is shown in FIGS. 28A-28E. The five frames show a simple embodiment of a flexible diaphragm transducer in cross section at five phases of an oscillation, that may serve to illustrate the operation of several of the embodiments. The motion of the transducer is greatly exaggerated for clarity. The simple transducer consists of a flexible diaphragm 720 joined to an upper ring of piezoelectric material 730 and joined to a lower ring of piezoelectric material 735. A simple means for mounting a flexible diaphragm transducer to a fixed structure 760 is a compliant elastomer ring 750. FIG. 28C shows the transducer at its equilibrium or neutral position, wherein the central portion and perimeter of the diaphragm 720 are disposed in a common plane. FIG. 28B shows the diaphragm 720 flexed upward moderately far. In response to the finite stiffness of the diaphragm (and optionally in response to reaction forces on curved guiding surfaces 690 of FIG. 26 if they are present), a twisting moment is applied to the rings 730 and 735. The twisting moment results in the circumference of the upper ring being increased and the circumference of the lower ring being decreased, indicated by the arrows. Thus the tensile stress of the upper ring is increased, toward tension, and the tensile stress of the lower ring is decreased, toward compression. For these relatively small deflections, the flexible diaphragm transducer operates similarly to a bimorph. FIG. 28A shows the situation at a larger deflection than in FIG. 28B. The deflection in this case is taken to be high enough that the quadratic compression of both rings overwhelms the linear twisting effect, and both rings are compressed relative to their equilibrium positions. This higher deflection operation of the flexible diaphragm transducer is dissimilar to the operation of a bimorph, and can be an advantage at higher powers. It places both rings of piezoelectric material under compression, where they are strong, rather than tension, where they are weak. FIGS. 28D and 28E show the result of diaphragm deflections in the opposite direction.

Figure 29:
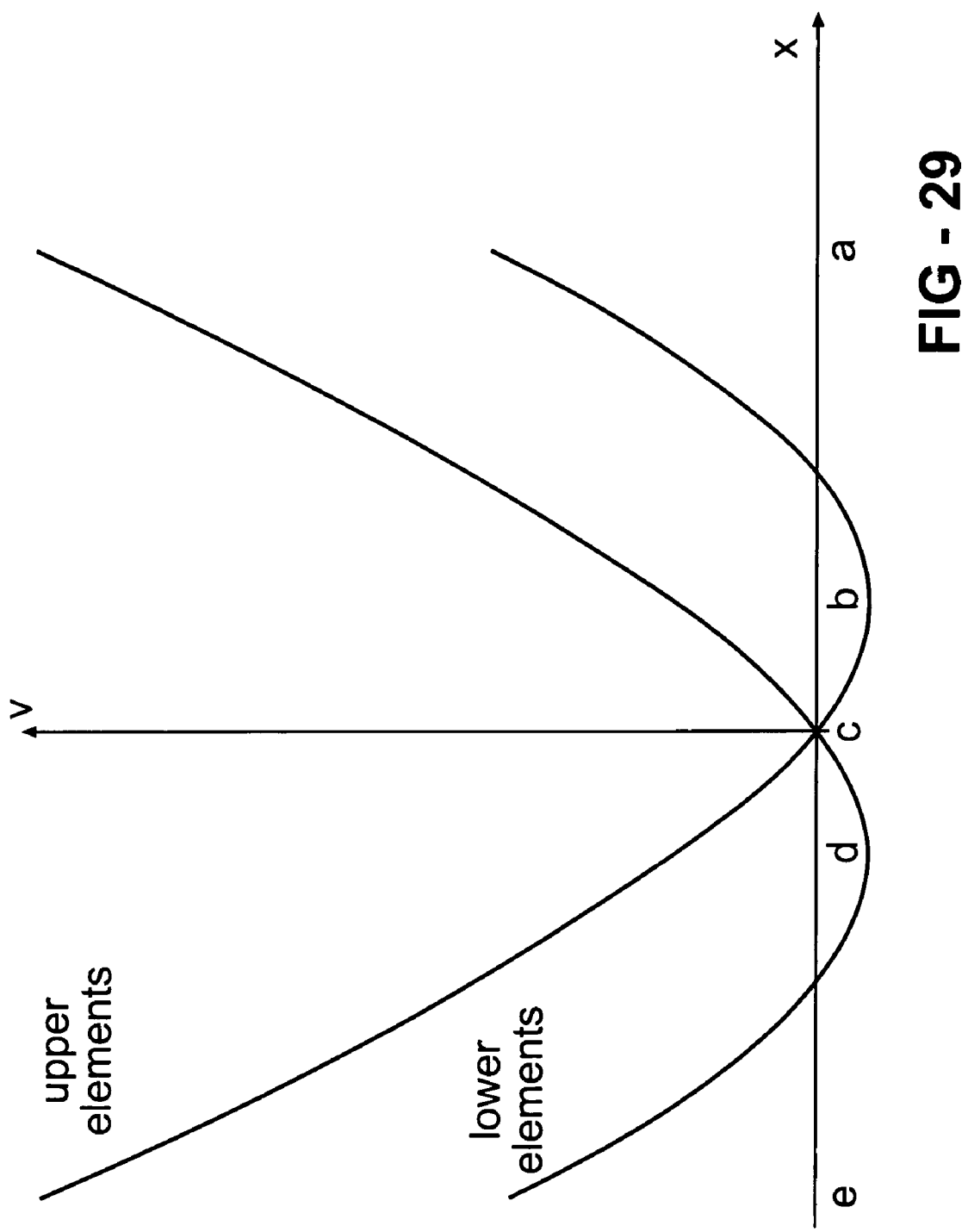
FIG. 29 is a graph of voltage versus displacement for an exemplary transducer such as shown in FIGS. 28A-28E.

FIG. 29 shows the open circuit output voltage V from the upper bank of piezoelectric elements and for the lower bank of piezoelectric elements as a function of the membrane deflection x at its center, when the transducer is used as an alternator to generate electrical power. Here V is taken to be positive for stress that is compressive relative to the equilibrium stress, and x taken to be positive upward. The x axis is labeled with the deflections of the corresponding five frames of FIGS. 28A-28E. Small amplitude oscillations can be represented by the sequence c-b-c-d-c in FIGS. 28 and 29. Large amplitude oscillations can be represented by the sequence c-b-a-b-c-d-e-d-c. It can be seen that each bank of piezoelectric elements 730 and 735 present a linear response near the equilibrium position c. For small sinusoidal displacement amplitude oscillations at frequency f, the dominant frequency component of the voltage will also be f. For larger sinusoidal displacement amplitude oscillations at f, the voltage will have f and 2f components. The linear component can be emphasized by designing the transducer with a thicker, and therefore stiffer, diaphragm and piezoelectric elements that are placed relatively close to the plane of the diaphragm. The quadratic component can be emphasized with a thinner, and therefore less stiff, diaphragm and piezoelectric elements that are placed further from the plane of the diaphragm.

When the transducer is used in the opposite direction, as an acoustic source, the voltage V of FIG. 29 may be interpreted as the driving voltage needed to be supplied to each piezoelectric element bank to achieve a deflection x. The unloaded diaphragm deflection can be made linearly proportional to an input voltage proportional to x, even with the transducer driven into its nonlinear regime, by including a circuit that converts the input voltage proportional to x into the upper and lower bank driving voltages using the functions of FIG. 29.

Figure 30:
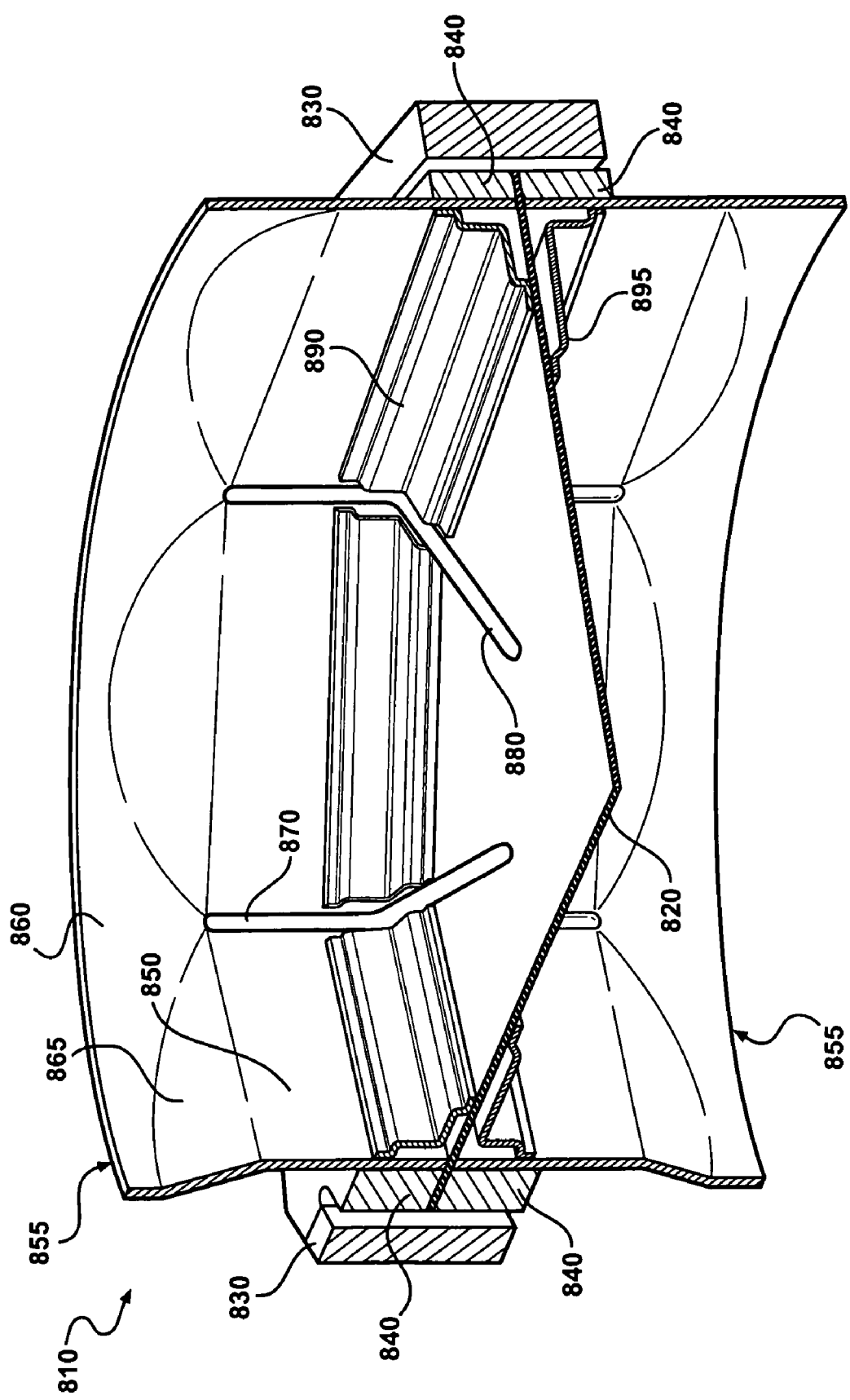
FIG. 30 is a cutaway perspective view of yet a further embodiment of a flexible diaphragm transducer.

A fourth diaphragm curvature control technique is illustrated by the cutaway drawing of an embodiment of a transducer 810 of FIG. 30. This technique uses a plurality of springs 890 and 895 that are attached to the diaphragm 820 at one end and to a relatively fixed position, such as a rigid support structure, or as shown, to supports 840. The springs may have any convenient form. In the illustrated embodiment, one set of leaf springs 890 is provided above the diaphragm and another set 895 is provided below the diaphragm. More than one layer of leaf springs may be placed on either side of the diaphragm. Other spring forms, such as coil springs, or a layer of compliant low-loss elastomeric material placed between the diaphragm and a relatively fixed position, are possible as well. The diaphragm curvature is controlled by the distribution of the springs on the diaphragm and their spring constants. The bending of the diaphragm is similar to the bending of a beam on an elastic foundation. Like the technique of FIG. 26, this technique allows the diaphragm to be made thin, to reduce the peak bending stress for a given amount of displacement of the diaphragm, without suffering the increase in bending stress that would occur without the control of the curvature in the presence of high tensile forces.

The transducer 810 is held in place axially by a plurality of struts 850 attached to the supports 840 and/or the diaphragm 820. A plurality of piezoelectric elements 830, which for example may be in the form of a stack of piezoelectric ceramic used in its 33 or its 31 mode, is attached to the supports 840. The plurality of piezoelectric elements may be electrically connected into a single bank, or as two separate banks of elements, one above the plane of the diaphragm 820 and one below, as described earlier. The struts 850 are stiff axially but are relatively compliant to radial motion of the supports, diaphragm, and electroactive material that occurs in response to the axial flexing of the diaphragm. The struts in this embodiment are shown as portions of a generally tubular piece 855. Together, the struts 850 and the piece 855 serve as a mounting structure. The generally tubular piece 855 includes a generally circular cylindrical portion 860 which nominally has no motion and can be used as the mounting surface of the transducer. Smooth transitions 865 are made to blend the generally polygonal cylinder formed by the ring of struts 850 to the circular cylindrical portion 860. Gaps between the struts relieve hoop stress during radial motion of the diaphragm rim, supports, and piezoelectric elements. These gaps are filled with a filler 870 to seal the gaps against acoustically driven fluid flow. The filler 870 is compliant to compression in the hoop direction, such as an elastomeric material (as drawn) or a thin arch of metal, as in previously described embodiments. Similarly, radial slots may be placed in the diaphragm to reduce hoop stress in the diaphragm, and these slots may be filled with a filler for sealing against acoustically driven fluid flow. These hoop stress reduction techniques in the supports and diaphragm allow for more of the developed hoop stress being concentrated on the piezoelectric elements and thus improve the energy coupling factor between the piezoelectric elements and the acoustical field. Alternatively, a transducer may be assembled without hoop stress reduction techniques.

Figure 31A:
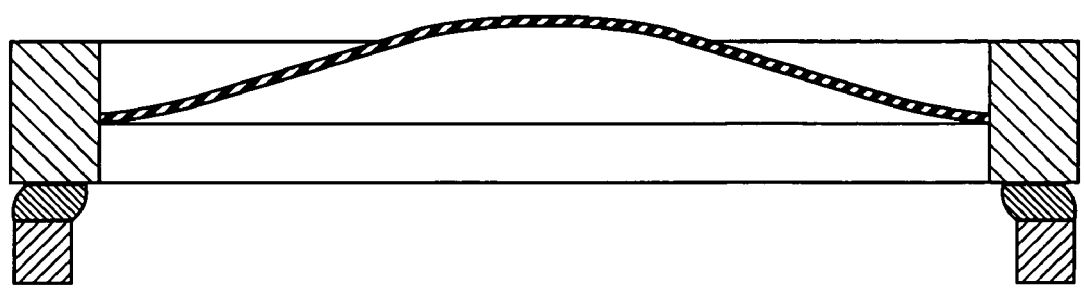
FIGS. 31A-31C are simplified drawings of another version of a flexible diaphragm transducer, having a domed diaphragm, and showing the diaphragm in three positions.
Figure 31B:
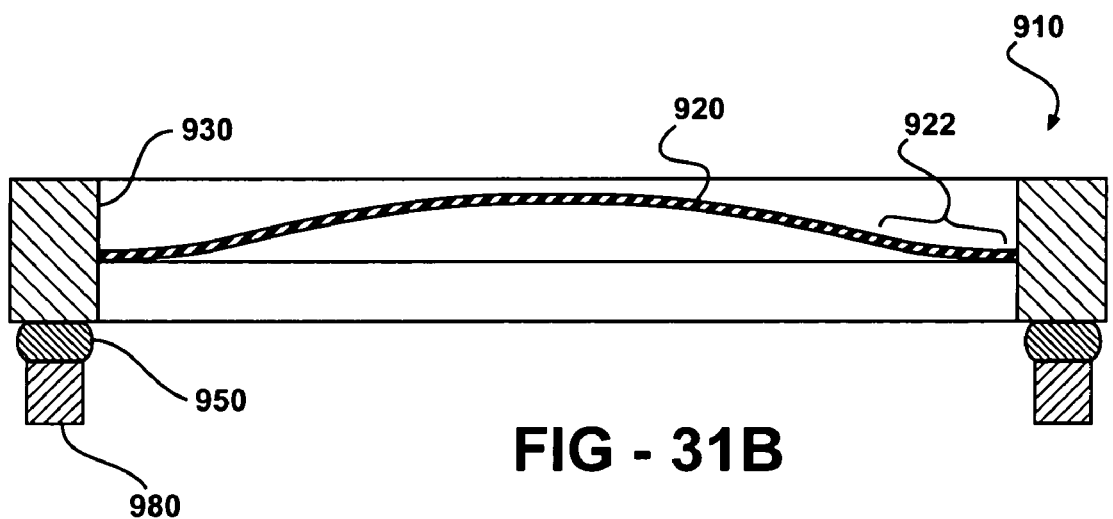
Figure 31C:
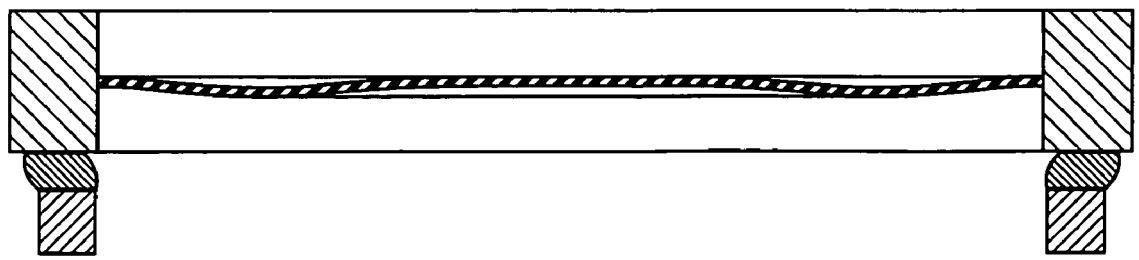

Another method of linearizing the response of a flexible diaphragm transducer is shown in the simplified embodiment of FIGS. 31A-31C. FIG. 31B shows this transducer 910 in its equilibrium configuration. Instead of the flat diaphragms of the previous embodiments, the diaphragm 920 is generally dome shaped at equilibrium, in the absence of sound. Put another way, the diaphragm 920 has a convex face and opposed concave face, with these faces also defining the faces of the transducer. Surrounding diaphragm 920 is a piezoelectric ring 930. It may consist of a simple single ring of piezoelectric material, such as a piezoelectric ceramic, or the piezoelectric ring 930 may be taken to represent a plurality of supports and piezoelectric elements, as in previously described embodiments. The transducer 910 may be supported axially in any number of ways, including the other approaches described herein. In the illustrated embodiment, a compliant support 950, which may be an elastomeric material, is illustrated between the piezoelectric ring 930 and a fixed structure 980. The compliant support 950 is relatively stiff to axial motion, but allows for a slight radial motion of the piezoelectric ring 930. The radial motion of the piezoelectric ring, shown in FIGS. 31A and 31C, has been exaggerated for clarity. The domed diaphragm may be used in place of the flat diaphragm in any of the prior flexible diaphragm transducer embodiments, and may have slots, struts and/or supports as discussed previously.

The three frames of FIG. 31 show the operation of the domed diaphragm transducer over three phases of an acoustic cycle. The cycle may be visualized by the sequence of frames b-a-b-c-b, and so on. Frame a, shown in FIG. 31A, shows the phase when the diaphragm is deflected upward. If the transducer is operated as an alternator, converting acoustical power into electrical power, the membrane stress in the diaphragm in frame a becomes more tensile. The diaphragm pulls inward on the piezoelectric ring, causing the stress in the piezoelectric ring to become more compressive, and the piezoelectric ring generates a voltage with a particular sign. As the oscillation proceeds through frame b, shown in FIG. 31B, to frame c, shown in FIG. 31C, the stresses reverse. The membrane stress in the diaphragm becomes more compressive, the diaphragm pushes outward on the piezoelectric ring, the stress in the piezoelectric ring becomes more tensile, and the piezoelectric ring generates a voltage with the opposite sign. Thus the transducer has a linear response component. Acoustic oscillations at frequency f generate a voltage that is also at frequency f. At high acoustic drive levels, the response may switch over to a nonlinear quadratic response, generating a voltage response component at frequency 2f, which may be advantageous in power generation applications. For operation of the transducer as a projector of sound, converting electrical power into acoustical power, the relative phase of the stresses with respect to the diaphragm displacement are reversed.

Any generally dome shaped profile for the diaphragm, such as parabolic, spherical or elliptical for example, will provide a linear response component to the transducer. But, the profile in FIG. 31B illustrates a diaphragm profile that may be designed to provide another curvature control technique at the rim or perimeter of the diaphragm. For purposes of description, the equilibrium position of the diaphragm in frame b of FIG. 31B is shown displaced generally upward from the plane defined by the rim of the diaphragm. In other words, the central portion of the diaphragm is displaced above a plane defined by the perimeter, which may also be the transducer plane. Operation of the transducer as an alternator, to convert acoustic power into electrical power, will be described. When, during the oscillation, the acoustic pressure causes the diaphragm to be displaced further upward as in frame a, the bending stresses near the rim are compressive on the top of the diaphragm and tensile on the bottom. These bending stresses are made more severe by the desirable membrane tensile stresses that are generated by the diaphragm deformation to pull inward on the piezoelectric ring 930. These bending stresses can be mitigated by the concave upward region 922. Tension causes concave region 922 to straighten out in frame a, creating compensating bending stresses that are tensile on the top of the diaphragm and compressive on the bottom. This allows the alternator to be used to higher amplitude, even into the nonlinear, quadratic regime, for the generation of higher electrical power. On the other half of the cycle, illustrated in frame c, the acoustic pressure causes the diaphragm to be displaced downward, the desirable membrane stresses in the diaphragm become more compressive, and the compressive stress pushes out on the piezoelectric ring 930. During this phase of the cycle, the concave upward region 922 "unfolds," becoming more straight, which decreases the tendency of the diaphragm to buckle under the compressive loading, which is also desirable.

Figure 32:
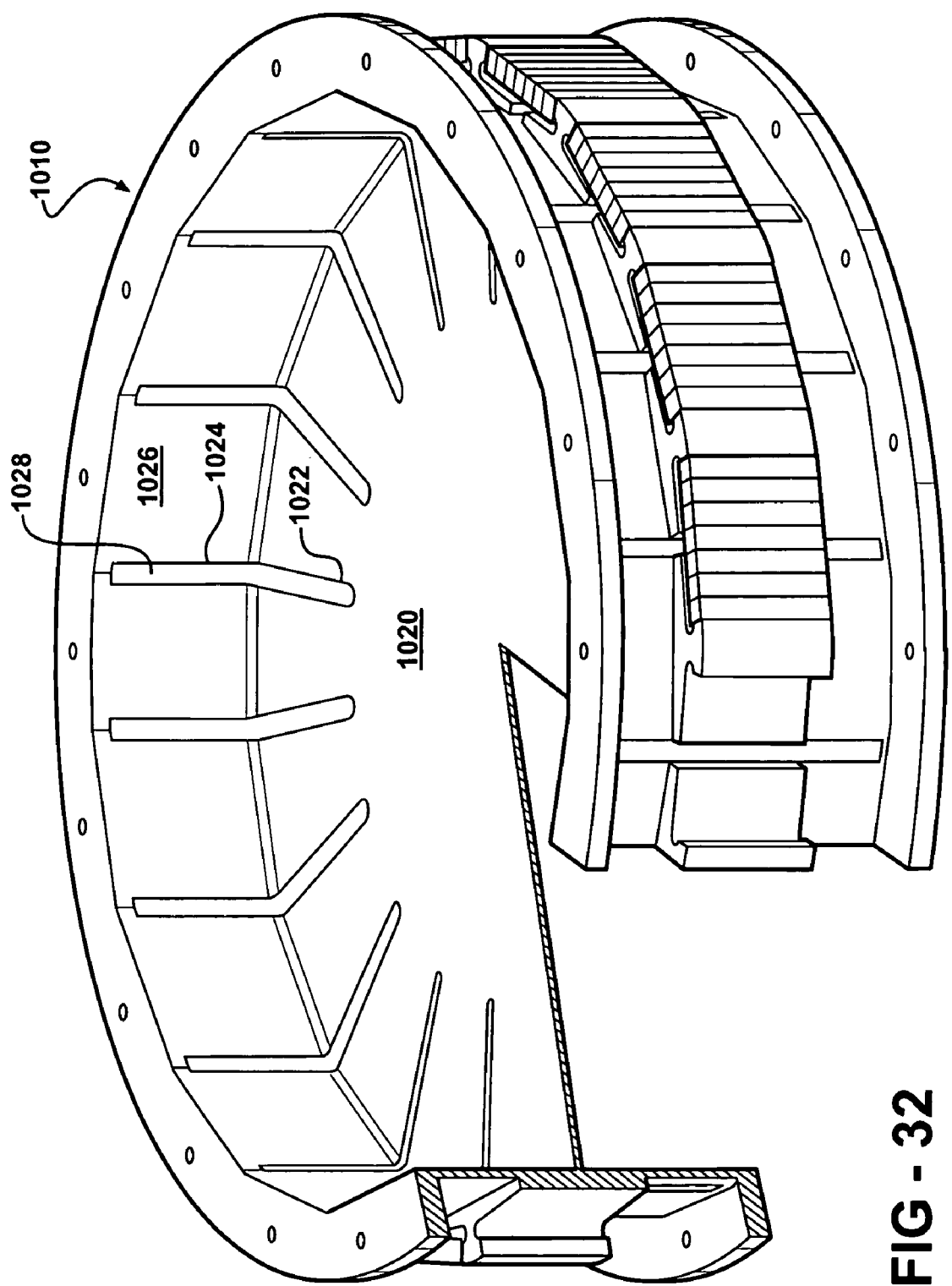
FIG. 32 is a partially cutaway perspective view of an alternative version of a flexible diaphragm transducer.

Referring now to FIG. 32, another version of a flexible diaphragm transducer is shown at 1010. This design is similar to earlier embodiments, but includes radial slots 1022 in the diaphragm 1020 and axial slots 1024 in the struts 1026, with the slots all being sealed by arches 1028. The version illustrated in FIG. 32 may be machined out of a single or multiple pieces of material, with the arches integrally formed, or the arches may be separately formed and then attached such as by brazing. In any of the embodiments, the hoop stress relieving radial slots may be eliminated, depending on the application and design.

FIGS. 33A-33C provide detailed views of how an arch may be formed to seal the radial and/or axial slots in a transducer according to the present invention, such as the transducers of FIG. 26 or 32. For the transducer of FIG. 26, the arch would replace the filler material. FIGS. 33A and 33B provide prospective views of a radial arch where it joins an axial arch. As shown, the arch has a concave and a convex side. FIG. 33C illustrates the transition area between the two arches.

The various embodiments of transducers discussed herein may be used in thermoacoustic devices, such as those shown in FIGS. 1 and 23, and may also be used in other applications requiring a transducer to convert between acoustical power and electrical power. The flexible diaphragm transducers may provide a moving mass that serves as a substantial portion of the resonating mass in a thermoacoustic device, as was discussed with earlier transducer embodiments.

The various embodiments of transducers discussed herein have been described as utilizing piezoelectric materials or elements. Examples of suitable piezoelectric materials are piezoelectric ceramics, such as members of the lead zirconate titanate (PZT) family, including PLZT ((Pb, La)(Zr,Ti)O$_3$), single crystal materials such as PMN-PT (Pb(Mg$_{1/3}$Nb$_{2/3}$)$_{x-1}$ TiO$_3$), piezoelectric polymers such as PVDF (polyvinylidene fluoride) and piezoelectric copolymers. As will be clear to those of skill in the art, these piezoelectric materials may be replaced with other transduction materials, members of the general class of "electroactive" materials (which include piezoelectric materials), for example electrostrictive materials, such as PMN-PT ceramic, or magnetostrictive materials, such as Terfenol-D or Galfenol. Electrostrictive and magnetostrictive materials may be used to advantage with optional bias electric or magnetic fields, respectively. The remainder of the transducer may be constructed of various materials, as will be clear to those of skill in the art. The diaphragm, struts, arches, and supports, may, for example, be formed of materials that exhibit a sufficiently high fatigue endurance limit, such as steel, particularly carbon steel or stainless steel, titanium and its alloys, nickel and its alloys, beryllium copper, phosphor bronze, brass, polymers, or composite materials such as carbon fiber composites or fiber reinforced rubber. Important exemplary dimensions for the diaphragm, struts, arches, and supports of a 4 kW transducer for thermoacoustic application, similar to that shown in FIGS. 24 and 25, and made from PH 15-7 Mo precipitation hardening stainless steel (supports made from 13-8 Mo stainless steel), are diaphragm radius of 7.1", diaphragm thickness of 0.040", strut thickness of 0.025", strut height of 1", arch thickness of 0.002", arch width of 0.20", and support height of 1". The metal parts of this exemplary transducer are joined together with vacuum nickel braze. The eighteen piezoelectric stacks of this exemplary transducer are each made from 54 Navy Type III PZT ceramic elements, 1" high, 0.30" wide, and 0.039" thick, poled across the thickness. As will be clear to those of skill in the art, the electroactive materials used in some embodiments of the present invention will be subjected to high temperatures. As such, electroactive materials and assembly methods suited for high temperature applications are preferred for these embodiments.

Applications of Thermoacoustic-Piezoelectric Generators

As will be appreciated by those of skill in the art, the generators illustrated herein may be used in a wide variety of applications. The following list provides some exemplary applications.

Modular, distributed thermoacoustic piezoelectric power plants, some with integral chillers, for powering ships or aircraft.

A chiller for a chemical protection suit that also generates electricity and is therefore able to reduce the overall weight carried by the user by reducing the number of batteries to be carried in other electronic systems.

A thermoacoustic piezoelectric generator/chiller can potentially be made substantially lighter than an equivalent internal combustion engine, conventional generator, and vapor compression refrigerator combination. Air-lifted thermoacoustic auxiliary power units for heating, cooling and electricity generation may therefore be attractive because of weight savings.

Because a thermoacoustic piezoelectric generator does not need air (as required by gas turbine, diesel, or gasoline engines), thermoacoustic generators may be considered for space applications.

A thermoacoustic piezoelectric generator and chiller/heat pump unit can be used to generate electricity, winter heating and summer cooling for use in the cab of a truck for the comfort of the driver during mandatory rest stops, and for preheating of the main diesel engine and fuel system for easier start up. The unit may be powered by combusting diesel fuel. This allows the main diesel engine of the truck to be turned off rather than left at idle as is commonly practiced at rest stops. This would have beneficial impacts on fuel usage, wear on the main engine, exhaust emissions and noise pollution.

Waste heat from the exhaust of trucks or cars may be used to thermoacoustically generate air conditioning and electricity that may be used to provide for additional motive power in a hybrid vehicle.

A thermoacoustic piezoelectric generator may be used to generate additional electricity as a bottoming cycle from the waste heat of fuel cells, particularly solid oxide fuel cells which run with a high (850° C.) exhaust temperature.

A thermoacoustic piezoelectric generator/chiller may be used to refrigerate the cargo of a truck while generating the electricity needed to run fans to circulate air in the refrigerated compartment. The unit may be powered by combusting diesel fuel.

The projected compactness of a thermoacoustic piezoelectric generator suggests that it may be useful as an automobile power plant, saving weight over a conventional gasoline engine.

Thermoacoustic piezoelectric power generation may be used as an environmentally benign source of hydrogen. Solar power can be used to power a thermoacoustic piezoelectric generator, perform hydrolysis on water, and produce hydrogen gas. The generator may also contain a thermoacoustic cryogenic liquefier for the hydrogen gas. It is therefore possible to create liquid hydrogen out of nothing more than sunlight and water.

While the invention has been particularly shown and described with reference to preferred embodiments thereof, it will be understood by those skilled in the art that various alterations in form and detail may be made therein without departing from the spirit and scope of the invention. In particular, the specific design of the power generator including heat and coolant sources, shape and design of the resonators, nacelles, heat exchangers, and regenerators can vary widely within the guidelines disclosed herein. This also applies to the piezoelectric alternator design, which can vary so long as it is capable of translating pressure oscillations into piezoelectric stress to generate power. Other variations will be clear to those of skill in the art. It is the following claims, including all equivalents which define the scope of the present invention.

We claim:

1. An electroactive transducer for converting between acoustical power, consisting of pressure and velocity, and electrical power, consisting of potential and current, the transducer comprising:

a diaphragm having a perimeter and a central portion, the diaphragm having a neutral position and at least one flexed position wherein the central portion is displaced axially relative to the neutral position, the perimeter and central portion disposed generally in a common diaphragm plane when the diaphragm is in the neutral position, the diaphragm having a first face defining at least a portion of the first face of the transducer and an opposed second face defining at least a portion of the second face of the transducer, the first and second face of the diaphragm each being flat when the diaphragm is in the neutral position; and a perimeter member including a plurality of electroactive elements disposed generally in a ring, the perimeter member generally defining a transducer plane and surrounding a central area, the perimeter member being mechanically coupled to the perimeter of the diaphragm such that displacement of the central portion from the neutral position to the flexed position stresses the electroactive element, the perimeter member further comprising a plurality of supports, each support having a portion disposed between two adjacent electroactive elements and another portion interconnected with the perimeter of the diaphragm.

2. The electroactive transducer according to claim 1, wherein:

the diaphragm plane is generally coextensive with the transducer plane and the diaphragm is disposed in the central area defined by the perimeter member such that the perimeter member generally surrounds the diaphragm.

3. The electroactive transducer according to claim 1, wherein:

the plurality of electroactive elements is disposed such that a portion of each element is above the diaphragm plane and another portion of each element is below the diaphragm plane.

4. The electroactive transducer according to claim 1, wherein:

the diaphragm has a plurality of radial slots defined from the perimeter and extending partially into the central portion.

5. The electroactive transducer according to claim 1, further comprising:

a mounting structure for mounting the transducer, the mounting structure including a plurality of struts each having a first end interconnected with the diaphragm.

6. The electroactive transducer according to claim 1, wherein:

the at least one electroactive element comprises a first plurality of electroactive elements disposed generally in a first ring and a second plurality of electroactive elements disposed generally in a second ring, the first ring being disposed above the diaphragm plane and the second ring being disposed below the diaphragm plane.

7. An electroactive transducer for converting between acoustical power, consisting of pressure and velocity, and electrical power, consisting of potential and current, the transducer having a first face and an opposed second face, the transducer comprising:

a diaphragm having a convex first face defining at least a portion of the first face of the transducer and an opposed concave second face defining at least a portion of the second face of the transducer, the diaphragm having a perimeter and a central portion, the diaphragm having a neutral position and at least one flexed position wherein the central portion is displaced axially relative to the neutral position; and a perimeter member including a plurality of electroactive elements disposed generally in a ring, the perimeter member generally defining a transducer plane and surrounding a central area, the perimeter of the diaphragm being disposed in the transducer plane and the diaphragm being disposed in the central area defined by the perimeter member such that the perimeter member generally surrounds the diaphragm, the perimeter member being mechanically coupled to the perimeter of the diaphragm such that displacement of the central portion from the neutral position to the flexed position stresses the electroactive element, the perimeter member further comprising a plurality of supports, each support having a portion disposed between two adjacent electroactive elements and another portion interconnected with the perimeter of the diaphragm.

8. The electroactive transducer according to claim 7, wherein:

the diaphragm has a plurality of radial slots defined from the perimeter and extending partially into the central portion, each support being interconnected with the perimeter of the diaphragm between the slots.

9. The electroactive transducer according to claim 7, wherein:

the plurality of electroactive elements is disposed such that a portion of each element is above the transducer plane and another portion of each element is below the transducer plane.

10. The electroactive transducer according to claim 1, wherein:

the electroactive elements are piezoelectric elements.

11. The electroactive transducer according to claim 1, wherein:
the diaphragm has a plurality of radial slots defined from the perimeter and extending partially into the central portion, each support being interconnected with the perimeter of the diaphragm between the slots.

12. The electroactive transducer according to claim 5, wherein:
the mounting structure further includes a mounting flange, the struts having a second end interconnected with the mounting flange.

13. The electroactive transducer according to claim 1, wherein:
the diaphragm comprises a generally continuous plate of material having a stiffness, the diaphragm formed of a material selected from the group consisting of steel, stainless steel, titanium, titanium alloy, nickel, nickel alloy, beryllium copper, phosphor bronze, brass, polymer material, and composite material.

14. The electroactive transducer according to claim 7, wherein:
the electroactive elements are piezoelectric elements.

15. The electroactive transducer according to claim 7, wherein:
the diaphragm has a plurality of radial slots defined from the perimeter and extending partially into the central portion.

16. The electroactive transducer according to claim 7, further comprising:
a mounting structure for mounting the transducer, the mounting structure including a plurality of struts each having a first end interconnected with the diaphragm.

17. The electroactive transducer according to claim 16, wherein:
the mounting structure further includes a mounting flange, the struts having a second end interconnected with the mounting flange.

18. The electroactive transducer according to claim 7, wherein:
the diaphragm comprises a generally continuous plate of material having a stiffness, the diaphragm formed of a material selected from the group consisting of steel, stainless steel, titanium, titanium alloy, nickel, nickel alloy, beryllium copper, phosphor bronze, brass, polymer material, and composite material.

19. The electroactive transducer according to claim 5, wherein:
the struts are disposed generally in a ring near the perimeter of the diaphragm, the struts being spaced apart so as to define a plurality of axial slot between the struts, each slot being scaled with a flexible seal so as to prevent the passage of fluid thru the slots.

20. The electroactive transducer according to claim 16, wherein:
the struts are disposed generally in a ring near the perimeter of the diaphragm, the struts being spaced apart so as to define a plurality of axial slot between the struts, each slot being sealed with a flexible seal so as to prevent the passage of fluid thru the slots.

21. The electroactive transducer of claim 1, wherein the diaphragm has a thickness adjacent the perimeter that is greater than a thickness of the diaphragm in the central portion.

22. The electroactive transducer of claim 1, further comprising a first support element disposed above the perimeter of the diaphragm and a second support element disposed below the perimeter of the diaphragm, each support element having a curved surface directed toward the diaphragm for supporting the diaphragm adjacent the perimeter when the diaphragm is in the flexed position.

23. The electroactive transducer of claim 1, further comprising a first spring disposed above the diaphragm and a second spring disposed below the diaphragm, the springs each being in contact with the diaphragm.

24. An electroactive transducer for converting between acoustical power, consisting of pressure and velocity, and electrical power, consisting of potential and current, the transducer having a first face and an opposed second face, the transducer comprising:
a diaphragm having a first face defining at least a portion of the first face of the transducer and an opposed second face defining at least a portion of the second face of the transducer, the diaphragm having a perimeter and a central portion, the diaphragm having a neutral position and at least one flexed position wherein the central portion is displaced axially relative to the neutral position, the diaphragm having a plurality of radial slots defined from the perimeter and extending partially into the central portion; and
a perimeter member including at least one electroactive element, the perimeter member generally defining a transducer plane and surrounding a central area, the perimeter member being mechanically coupled to the perimeter of the diaphragm such that displacement of the central portion from the neutral position to the flexed position stresses the electroactive element.

25. The electroactive transducer according to claim 24, further comprising:
a mounting structure for mounting the transducer, the mounting structure including a plurality of struts each having a first end interconnected with the diaphragm.

26. The electroactive transducer of claim 24, wherein the first face of the diaphragm is a convex face and the second face of the diaphragm is a concave face.

27. The electroactive transducer according to claim 24, wherein:
the slots are each sealed with a flexible seal so as to prevent the passage of fluid thru the slots.

28. The electroactive transducer according to claim 24, wherein:
an arch member is disposed in each of the slots as to prevent the passage of fluid thru the slots.

29. An electroactive transducer for converting between acoustical power, consisting of pressure and velocity, and electrical power, consisting of potential and current, the transducer having a first face and an opposed second face, the transducer comprising:
a diaphragm having a first face defining at least a portion of the first face of the transducer and an opposed second face defining at least a portion of the second face of the transducer, the diaphragm having a perimeter and a central portion, the diaphragm having a neutral position and at least one flexed position wherein the central portion is displaced axially relative to the neutral position, the diaphragm having a thickness adjacent the perimeter that is greater than a thickness of the diaphragm in the central portion; and
a perimeter member including at least one electroactive element, the perimeter member generally defining a transducer plane and surrounding a central area, the perimeter member being mechanically coupled to the perimeter of the diaphragm such that displacement of the central portion from the neutral position to the flexed position stresses the electroactive element.

30. The electroactive transducer of claim 29, wherein the first face of the diaphragm is a convex face and the second face of the diaphragm is a concave face.

31. An electroactive transducer for converting between acoustical power, consisting of pressure and velocity, and electrical power, consisting of potential and current, the transducer having a first face and an opposed second face, the transducer comprising:
- a diaphragm having a first face defining at least a portion of the first face of the transducer and an opposed second face defining at least a portion of the second face of the transducer, the diaphragm having a perimeter and a central portion, the diaphragm having a neutral position and at least one flexed position wherein the central portion is displaced axially relative to the neutral position;
- a perimeter member including at least one electroactive element, the perimeter member generally defining a transducer plane and surrounding a central area, the perimeter member being mechanically coupled to the perimeter of the diaphragm such that displacement of the central portion from the neutral position to the flexed position stresses the electroactive element; and
- a first support element disposed above the perimeter of the diaphragm and a second support element disposed below the perimeter of the diaphragm, each support element having a curved surface directed toward the diaphragm for supporting the diaphragm adjacent the perimeter when the diaphragm is in the flexed position.

32. The electroactive transducer of claim 31, wherein the first face of the diaphragm is a convex face and the second face of the diaphragm is a concave face.

33. An electroactive transducer for converting between acoustical power, consisting of pressure and velocity, and electrical power, consisting of potential and current, the transducer having a first face and an opposed second face, the transducer comprising:
- a diaphragm having a first face defining at least a portion of the first face of the transducer and an opposed second face defining at least a portion of the second face of the transducer, the diaphragm having a perimeter and a central portion, the diaphragm having a neutral position and at least one flexed position wherein the central portion is displaced axially relative to the neutral position;
- a perimeter member including at least one electroactive element, the perimeter member generally defining a transducer plane and surrounding a central area, the perimeter member being mechanically coupled to the perimeter of the diaphragm such that displacement of the central portion from the neutral position to the flexed position stresses the electroactive element; and
- a first spring disposed above the diaphragm and a second spring disposed below the diaphragm, the springs each being in contact with the diaphragm.

34. The electroactive transducer of claim 33, wherein the first face of the diaphragm is a convex face and the second face of the diaphragm is a concave face.

35. The electroactive transducer of claim 33, wherein the first face and the second face of the diaphragm are flat when the diaphragm is in the neutral position.

36. The electroactive transducer of claim 33, wherein the springs are elastomeric material.

37. An electroactive transducer for converting between acoustical power, consisting of pressure and velocity, and electrical power, consisting of potential and current, the transducer having a first face and an opposed second face, the transducer comprising:
- a diaphragm having a first face defining at least a portion of the first face of the transducer and an opposed second face defining as least a portion of the second face of the transducer, the diaphragm having a perimeter and a central portion, the diaphragm having a neutral position and at least one flexed position wherein the central portion is displaced axially relative to the neutral position, the perimeter having a neutral position and at least one flexed position wherein the perimeter is displaced radially relative to the neutral position, the perimeter being in the neutral position when the central position is in the neutral position and the perimeter being in the flexed position when the central portion is displaced to the flexed position, the first face and the second face of the diaphragm being flat when the diaphragm is in the neutral position; and
- a continuous perimeter member including one or more electroactive elements disposed in the ring shaped member, the perimeter member generally defining a transducer plane and surrounding a central area, the perimeter member being mechanically coupled to the perimeter of the diaphragm such that radial displacement of the perimeter from the neutral position to the flexed position stresses the electroactive elements, the stress on the electroactive elements being a non-bending, compressive or tensile hoop stress in the electroactive elements in the ring.

38. An electroactive transducer for converting between acoustical power, consisting of pressure and velocity, and electrical power, consisting of potential and current, the transducer having a first face and an opposed second face, the transducer comprising:
- a diaphragm having a convex first face defining at least a portion of the first face of the transducer and an opposed concave second face defining as least a portion of the second face of the transducer, the diaphragm having a perimeter and a central portion, the diaphragm having a neutral position and at least one flexed position wherein the central portion is displaced axially relative to the neutral position, the perimeter having a neutral position and at least one flexed position wherein the perimeter is displaced radially relative to the neutral position, the perimeter being in the neutral position when the central position is in the neutral position and the perimeter being in the flexed position when the central portion is displaced to the flexed position; and
- a continuous perimeter member including one or more electroactive elements disposed in the ring shaped member, the perimeter member generally defining a transducer plane and surrounding a central area, the perimeter member being mechanically coupled to the perimeter of the diaphragm such that radial displacement of the perimeter from the neutral position to the flexed position stresses the electroactive elements, the stress on the electroactive elements being a non-bending, compressive or tensile hoop stress in the electroactive elements in the ring.

* * * * *

UNITED STATES PATENT AND TRADEMARK OFFICE
CERTIFICATE OF CORRECTION

PATENT NO. : 7,772,746 B2  Page 1 of 1
APPLICATION NO. : 11/492311
DATED : August 10, 2010
INVENTOR(S) : Keolian et al.

It is certified that error appears in the above-identified patent and that said Letters Patent is hereby corrected as shown below:

Front page: replace title "Thermacoustic Piezoelectric Generator" with --Thermoacoustic Piezoelectric Generator--;
Front page: replace "Kevin J. Bastyr,Someville, MA" with --Kevin J. Bastyr, Somerville, MA--;
Col. 1, line 15: replace "N00014-95-1-0212" with --N00014-98-1-0212--;
Col. 8, line 30: replace "forth" with --fourth--;
Col. 13, line 38: replace "included" with --include--;
Col. 22, line 29: replace "$\Delta_{33}$" with --$\varepsilon_{33}$--;
Col. 26, line 5: replace "manor" with --manner--;
Col. 33, line 42: delete second occurrence of "is formed";
Col. 33, line 67: replace "show" with --shown--;
Col. 38, line 34: replace "In" with --in--.

Signed and Sealed this
Twenty-second Day of November, 2011

David J. Kappos
*Director of the United States Patent and Trademark Office*

UNITED STATES PATENT AND TRADEMARK OFFICE
CERTIFICATE OF CORRECTION

PATENT NO.        : 7,772,746 B2
APPLICATION NO.   : 11/492311
DATED             : August 10, 2010
INVENTOR(S)       : Keolian et al.

It is certified that error appears in the above-identified patent and that said Letters Patent is hereby corrected as shown below:

Title Page, Item (54) and at column 1, lines 1 and 2: replace title "Thermacoustic Piezoelectric Generator" with --Thermoacoustic Piezoelectric Generator--;
Front page: replace "Kevin J. Bastyr,Someville, MA" with --Kevin J. Bastyr, Somerville, MA--;
Col. 1, line 15: replace "N00014-95-1-0212" with --N00014-98-1-0212--;
Col. 8, line 30: replace "forth" with --fourth--;
Col. 13, line 38: replace "included" with --include--;
Col. 22, line 29: replace "$\Delta_{33}$" with --$\varepsilon_{33}$--;
Col. 26, line 5: replace "manor" with --manner--;
Col. 33, line 42: delete second occurrence of "is formed";
Col. 33, line 67: replace "show" with --shown--;
Col. 38, line 34: replace "In" with --in--.

This certificate supersedes the Certificate of Correction issued November 22, 2011.

Signed and Sealed this
Third Day of January, 2012

David J. Kappos
*Director of the United States Patent and Trademark Office*